(12) United States Patent
Takahashi et al.

(10) Patent No.: US 11,842,002 B2
(45) Date of Patent: Dec. 12, 2023

(54) DISPLAY DEVICE

(71) Applicant: SEMICONDUCTOR ENERGY LABORATORY CO., LTD., Atsugi (JP)

(72) Inventors: Kei Takahashi, Kanagawa (JP); Hidetomo Kobayashi, Kanagawa (JP); Hajime Kimura, Kanagawa (JP); Takeshi Osada, Kanagawa (JP); Hideaki Shishido, Kanagawa (JP); Kiyotaka Kimura, Kanagawa (JP); Shuichi Katsui, Kanagawa (JP); Takeya Hirose, Kanagawa (JP); Takayuki Ikeda, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/760,603

(22) PCT Filed: Sep. 22, 2020

(86) PCT No.: PCT/IB2020/058809
§ 371 (c)(1),
(2) Date: Mar. 15, 2022

(87) PCT Pub. No.: WO2021/064509
PCT Pub. Date: Apr. 8, 2021

(65) Prior Publication Data
US 2022/0350432 A1    Nov. 3, 2022

(30) Foreign Application Priority Data
Oct. 4, 2019    (JP) .................................. 2019-183927

(51) Int. Cl.
*G09G 3/3233*    (2016.01)
*G09G 3/3266*    (2016.01)
(Continued)

(52) U.S. Cl.
CPC .......... *G06F 3/0412* (2013.01); *G06F 3/0421* (2013.01); *G09G 3/3233* (2013.01);
(Continued)

(58) Field of Classification Search
CPC .. G06F 3/0412; G06F 3/0421; G06F 3/04164; G06F 3/044; G06F 2203/04102;
(Continued)

(56) References Cited

U.S. PATENT DOCUMENTS 7,399,991 B2    7/2008    Seo et al.
7,868,867 B2    1/2011    Lee et al.
(Continued)

FOREIGN PATENT DOCUMENTS

CN    101926164 A    12/2010
CN    110235436 A    9/2019
(Continued)

OTHER PUBLICATIONS

International Search Report (Application No. PCT/IB2020/058809) dated Dec. 15, 2020.
(Continued)

*Primary Examiner* — David Tung
(74) *Attorney, Agent, or Firm* — NIXON PEABODY LLP; Jeffrey L. Costellia

(57) ABSTRACT

To provide an inexpensive display device. The display device includes a pixel and an IC chip. The pixel includes a first pixel circuit including a display element and a second pixel circuit including a light-receiving device. The one IC chip includes a control circuit, a data driver circuit, and a read circuit. The first and second pixel circuits are electri-
(Continued)

cally connected to the read circuit. The control circuit has a function of controlling driving of the data driver circuit and the read circuit. The data driver circuit has a function of supplying image data to the first pixel circuit. The read circuit has a function of outputting a monitor signal corresponding to a monitor current when the monitor current flows through the first pixel circuit. The read circuit also has a function of outputting an imaging signal corresponding to imaging data acquired by the second pixel circuit.

12 Claims, 39 Drawing Sheets

(51) Int. Cl.
| | | |
|---|---|---|
| *G09G 3/3275* | (2016.01) | |
| *G06F 3/041* | (2006.01) | |
| *G06F 3/042* | (2006.01) | |
| *H01L 27/12* | (2006.01) | |
| *H10K 30/88* | (2023.01) | |
| *H10K 50/844* | (2023.01) | |
| *H10K 50/858* | (2023.01) | |
| *H04N 25/70* | (2023.01) | |
| *H10K 59/40* | (2023.01) | |
| *H10K 59/65* | (2023.01) | |
| *H10K 65/00* | (2023.01) | |

(52) U.S. Cl.
CPC ......... *G09G 3/3266* (2013.01); *G09G 3/3275* (2013.01); *H01L 27/1207* (2013.01); *H10K 30/88* (2023.02); *H10K 50/844* (2023.02); *H10K 50/858* (2023.02); *G09G 2300/0426* (2013.01); *G09G 2300/0842* (2013.01); *G09G 2310/08* (2013.01); *G09G 2320/0233* (2013.01); *G09G 2320/0295* (2013.01); *G09G 2354/00* (2013.01); *G09G 2360/14* (2013.01); *H04N 25/70* (2023.01); *H10K 59/40* (2023.02); *H10K 59/65* (2023.02); *H10K 65/00* (2023.02)

(58) Field of Classification Search
CPC ........ G06F 2203/04103; G09G 3/3233; G09G 3/3266; G09G 3/3275; G09G 2300/0426; G09G 2300/0842; G09G 2300/0417; G09G 2310/08; G09G 2320/0233; G09G 2320/0295; G09G 2330/12; G09G 2354/00; G09G 2360/14; G09G 2370/08; G09F 9/00; G09F 9/30; H04N 25/70; H04N 25/76; H04N 59/40; H04N 59/65; H04N 59/60; H01L 27/1207; H01L 27/146; H10K 30/99; H10K 50/844; H10K 50/858; H10K 59/40; H10K 59/65; H10K 59/1216; H10K 59/1213; H10K 65/00; H05B 33/14

See application file for complete search history.

(56) References Cited

U.S. PATENT DOCUMENTS

| | | | |
|---|---|---|---|
| 7,952,565 B2 | 5/2011 | Park et al. | |
| 8,243,027 B2 | 8/2012 | Hotelling et al. | |
| 8,654,083 B2 | 2/2014 | Hotelling et al. | |
| 8,736,162 B2 | 5/2014 | Jin et al. | |
| 8,836,650 B2 | 9/2014 | Wang et al. | |
| 8,859,304 B2 | 10/2014 | Momma et al. | |
| 9,236,408 B2 | 1/2016 | Yamazaki | |
| 9,244,561 B2 | 1/2016 | Hotelling et al. | |
| 9,356,049 B2 | 5/2016 | Ikeda et al. | |
| 9,425,226 B2 | 8/2016 | Yamazaki et al. | |
| 9,575,610 B2 | 2/2017 | Hotelling et al. | |
| 9,719,665 B2 | 8/2017 | Hirakata et al. | |
| 9,779,653 B2 | 10/2017 | Ikeda et al. | |
| 9,785,005 B2 | 10/2017 | Yeh et al. | |
| 9,805,659 B2 | 10/2017 | Ikeda et al. | |
| 9,927,930 B2 | 3/2018 | Lee et al. | |
| 9,971,440 B2 | 5/2018 | Kurokawa et al. | |
| 10,191,576 B2 | 1/2019 | Hotelling et al. | |
| 10,268,326 B2 | 4/2019 | Kobayashi | |
| 10,296,157 B2 | 5/2019 | Takahashi et al. | |
| 10,521,032 B2 | 12/2019 | Takahashi et al. | |
| 10,678,375 B2 | 6/2020 | Takahashi et al. | |
| 10,878,734 B1* | 12/2020 | Watsuda | G09G 3/3233 |
| 11,012,652 B2 | 5/2021 | Minagawa et al. | |
| 11,256,361 B2 | 2/2022 | Takahashi et al. | |
| 2005/0200291 A1* | 9/2005 | Naugler, Jr. | H10K 59/40 |
| | | | 315/149 |
| 2006/0001750 A1* | 1/2006 | Mizuguchi | H03M 1/0607 |
| | | | 348/241 |
| 2006/0109222 A1* | 5/2006 | Lee | G02F 1/13338 |
| | | | 345/88 |
| 2007/0285365 A1 | 12/2007 | Lee | |
| 2008/0211781 A1 | 9/2008 | Yamamoto | |
| 2009/0026350 A1 | 1/2009 | Leijssen et al. | |
| 2010/0156881 A1 | 6/2010 | Kohno et al. | |
| 2010/0309356 A1 | 12/2010 | Ihara et al. | |
| 2011/0216023 A1* | 9/2011 | Kurokawa | G06F 3/0412 |
| | | | 345/173 |
| 2012/0104233 A1 | 5/2012 | Mori et al. | |
| 2015/0279884 A1 | 10/2015 | Kusumoto | |
| 2015/0317028 A1 | 11/2015 | Takahashi et al. | |
| 2018/0076256 A1 | 3/2018 | Jiang et al. | |
| 2018/0113564 A1 | 4/2018 | Takahashi et al. | |
| 2018/0114815 A1* | 4/2018 | Lee | H10K 71/70 |
| 2018/0315373 A1 | 11/2018 | Wang et al. | |
| 2019/0146623 A1 | 5/2019 | Hotelling et al. | |
| 2019/0196634 A1 | 6/2019 | Hotelling et al. | |
| 2019/0373195 A1* | 12/2019 | Minagawa | H04N 25/76 |
| 2020/0125192 A1 | 4/2020 | Takahashi et al. | |
| 2021/0258523 A1 | 8/2021 | Minagawa et al. | |
| 2021/0360183 A1 | 11/2021 | Minagawa et al. | |
| 2022/0320064 A1 | 10/2022 | Takahashi et al. | |

FOREIGN PATENT DOCUMENTS

| | | |
|---|---|---|
| EP | 2259172 A | 12/2010 |
| EP | 2330491 A | 6/2011 |
| EP | 3264240 A | 1/2018 |
| EP | 3573334 A | 11/2019 |
| JP | 2002-324673 A | 11/2002 |
| JP | 2009-177749 A | 8/2009 |
| JP | 2016-109660 A | 6/2016 |
| JP | 2017-016098 A | 1/2017 |
| JP | 2018-072822 A | 5/2018 |
| JP | 2018-121111 A | 8/2018 |
| KR | 2019-0071772 A | 6/2019 |
| WO | WO-2007/146780 | 12/2007 |
| WO | WO-2009/096168 | 8/2009 |
| WO | WO-2012/176364 | 12/2012 |
| WO | WO-2015/166376 | 11/2015 |
| WO | WO-2018/073706 | 4/2018 |
| WO | WO-2018/135161 | 7/2018 |
| WO | WO-2018/234925 | 12/2018 |

OTHER PUBLICATIONS

Written Opinion (Application No. PCT/IB2020/058809) dated Dec. 15, 2020.

* cited by examiner

T14

T15

T23

T24

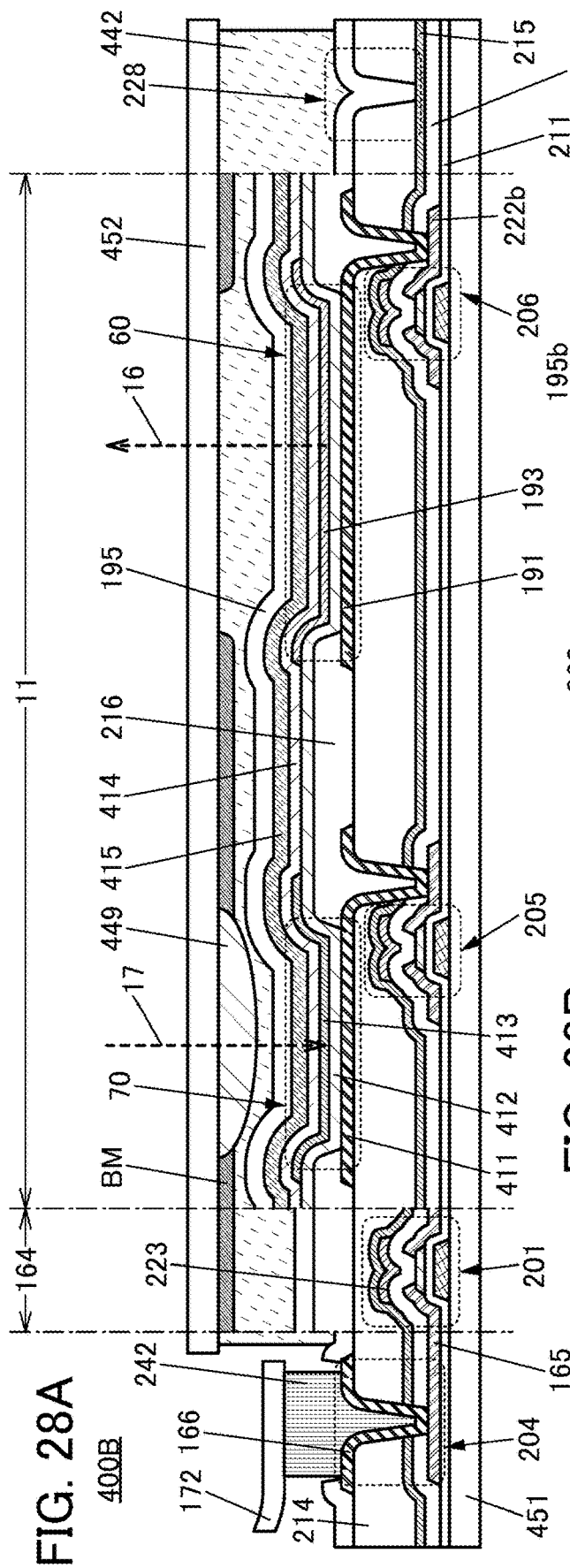

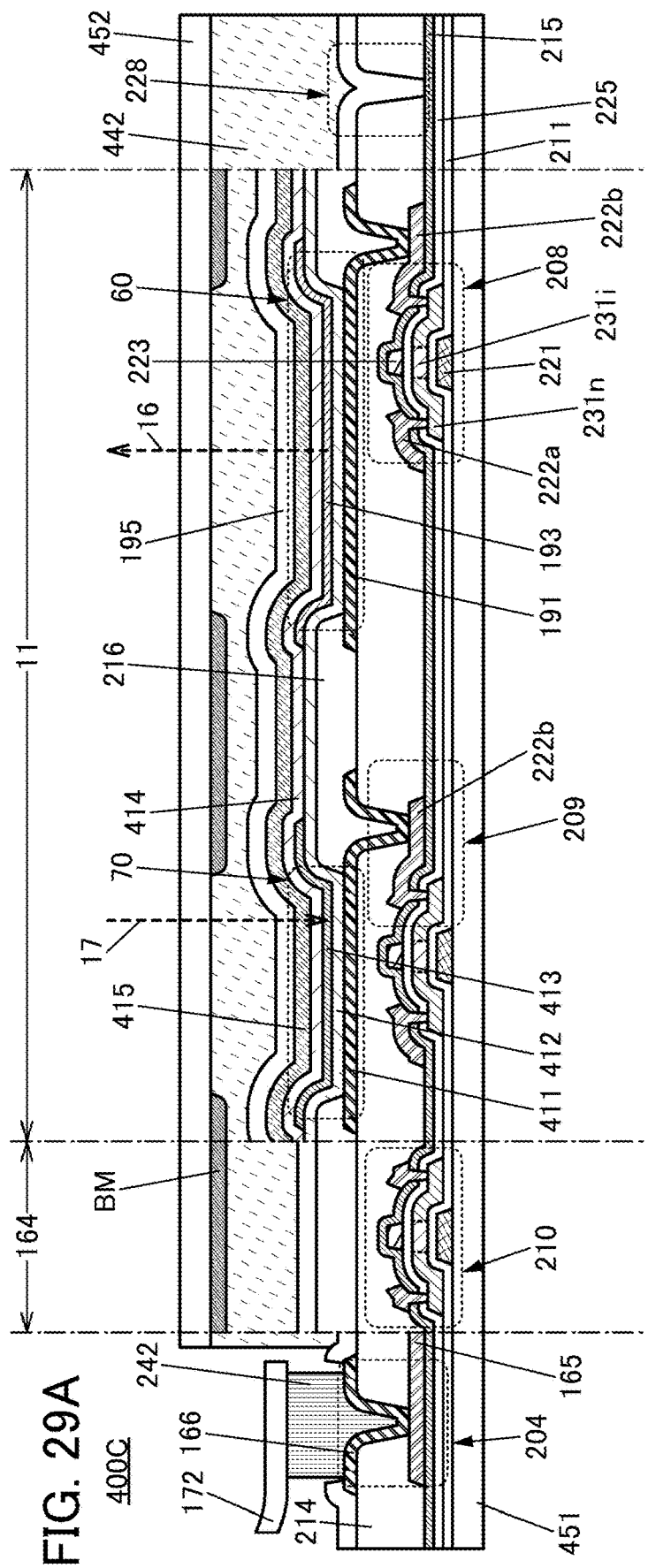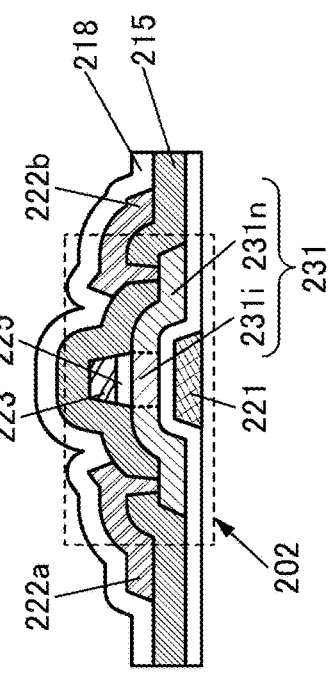

FIG. 36A
Intermediate state
New boundary region
| Amorphous | Crystalline | Crystal |
|---|---|---|
| ·completely amorphous | ·CAAC<br>·nc<br>·CAC<br><br>excluding single crystal and poly crystal | ·single crystal<br>·poly crystal |
FIG. 36B
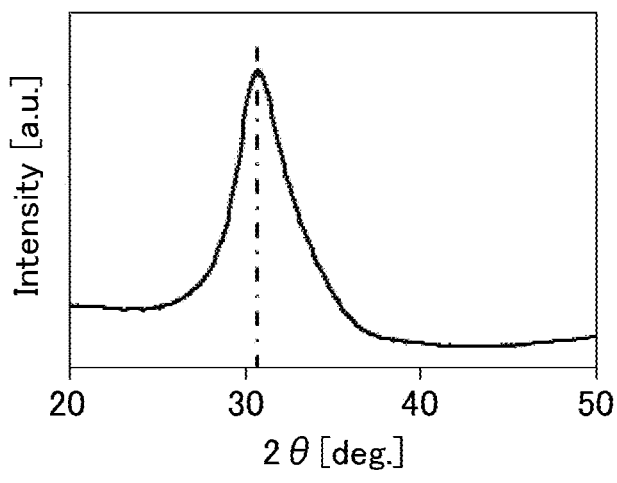
FIG. 36C
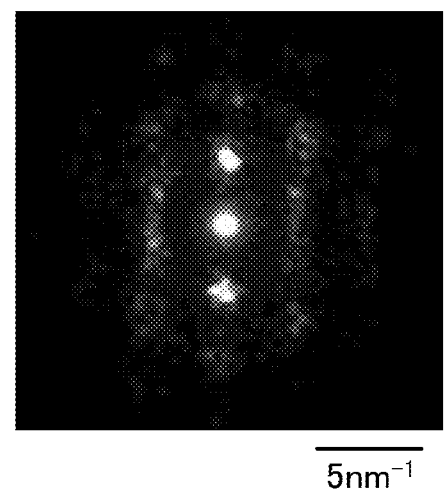

DISPLAY DEVICE

TECHNICAL FIELD

One embodiment of the present invention relates to a display device and a driving method therefor. Another embodiment of the present invention relates to a semiconductor device and a driving method therefor.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Therefore, specific examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof.

In this specification and the like, a semiconductor device refers to every device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting apparatus, an input device, an input/output device, an electro-optical device, a power generation device (including a thin film solar cell, an organic thin film solar cell, and the like), and an electronic device may each include a semiconductor device.

BACKGROUND ART

In recent years, portable information terminals such as smartphones and tablet terminals have been widespread. For most of the portable information terminals, display devices provided with active matrix display portions, touch sensors, and the like are used. Patent Document 1 discloses a technique where one IC serves as a driver circuit for a display portion and a driver circuit for a touch sensor.

Light-emitting devices utilizing electroluminescence (EL) have been attracting attention as display elements included in pixels provided in a matrix in a display portion of a display device. As such light-emitting devices, an organic EL device, an inorganic EL device, and the like are known. These light-emitting devices emit light by themselves; thus, the visibility of a display image is higher than that of a display image on a display device using a liquid crystal element. Furthermore, these light-emitting devices also have advantages such as high response speed and unnecessity of a backlight.

An organic EL device includes a layer containing a light-emitting organic compound (hereinafter referred to as an EL layer) between a pair of electrodes. On voltage application to the pair of electrodes, light is emitted from the EL layer. Patent Document 2 discloses an example of a display device using such an organic EL device.

REFERENCE

[Patent Document]
  [Patent Document 1] Japanese Published Patent Application No. 2017-16098
  [Patent Document 2] Japanese Published Patent Application No. 2002-324673

SUMMARY OF THE INVENTION

Problems to be Solved by the Invention

In the case where a light-emitting device such as an organic EL device is used as a display element, an image can be displayed on a display portion by controlling a current flowing through the light-emitting device. Here, in the case where the threshold voltage of a driving transistor that is electrically connected to a light-emitting device and has a function of controlling a current flowing through the light-emitting device in accordance with image data written to a pixel varies between pixels, display unevenness or the like might occur. Therefore, a display device including a light-emitting device preferably has a function of reading out the amount of current flowing between a drain and a source of a driving transistor as monitor current data. The threshold voltage or the like of the driving transistor is corrected on the basis of the current value represented by the monitor current data, whereby display unevenness or the like can be reduced.

As a method for providing a display device with a function of a touch sensor, for example, a method is given in which a light-receiving device is provided in a pixel where a display element is provided. Not only a display element but also a light-receiving device is provided in a pixel, whereby a finger or the like touching a display portion provided with the pixel can be sensed.

In the case where a display device including a light-emitting device has both a function of reading out monitor current data and a function of a touch sensor or the like, the display device can sense a finger or the like that touches a display portion while reducing display unevenness, for example. In that case, however, the display device needs to be provided with not only a data driver circuit having a function of supplying image data to pixels but also a circuit having a function of reading out monitor current data and a circuit having a function of reading out imaging data acquired using the light-receiving device. Here, in the case where, for example, a data driver circuit, a circuit having a function of reading out monitor current data, and a circuit having a function of reading out imaging data are provided in different ICs (semiconductor integrated circuits), the number of ICs provided in the display device increases. This increases the manufacturing cost of the display device.

An object of one embodiment of the present invention is to provide a display device having a function of a sensor. Another object is to provide an inexpensive display device. Another object is to provide a display device that can display a high-quality image. Another object is to provide a display device whose driving can be easily controlled. Another object is to provide a display device that can display a high-luminance image. Another object is to provide a display device with low power consumption. Another object is to provide a highly reliable display device. Another object is to provide a novel display device. Another object is to provide a novel semiconductor device.

Another object is to provide a driving method for a display device having a function of a sensor. Another object is to provide a driving method for an inexpensive display device. Another object is to provide a driving method for a display device that can display a high-quality image. Another object is to provide a driving method for a display device than can be easily controlled. Another object is to provide a driving method for a display device that can display a high-luminance image. Another object is to provide a driving method for a display device with low power consumption. Another object is to provide a driving method for a reliable display device. Another object is to provide a driving method for a novel display device. Another object is to provide a driving method for a novel semiconductor device.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a display device including a pixel and an IC chip, in which the pixel includes a first pixel circuit including a display element and a second pixel circuit including a light-receiving device; the one IC chip includes a control circuit, a data driver circuit, and a read circuit; the first pixel circuit and the read circuit are electrically connected to each other through a first wiring; the second pixel circuit and the read circuit are electrically connected to each other through a second wiring; the control circuit has a function of supplying a clock signal to the data driver circuit and the read circuit; the data driver circuit has a function of supplying image data to the first pixel circuit; the read circuit has a function of outputting a first signal corresponding to a potential of the first wiring; and the read circuit has a function of outputting a second signal corresponding to a potential of the second wiring.

In the above embodiment, the read circuit may include an A/D converter circuit; the A/D converter circuit may include a first transistor, a second transistor, and a comparator circuit; one of a source and a drain of the first transistor may be electrically connected to the first wiring; one of a source and a drain of the second transistor may be electrically connected to the second wiring; the other of the source and the drain of the first transistor and the other of the source and the drain of the second transistor may be electrically connected to a first input terminal of the comparator circuit; and the first and second signals may be digital signals output from the A/D converter circuit.

In the above embodiment, the read circuit may include a reference signal generation circuit; and the reference signal generation circuit may be electrically connected to a second input terminal of the comparator circuit.

In the above embodiment, the read circuit may include an A/D converter circuit; the A/D converter circuit may include a first transistor, a second transistor, a third transistor, a first capacitor, and a comparator circuit; one of a source and a drain of the first transistor may be electrically connected to the first wiring; one of a source and a drain of the second transistor may be electrically connected to the second wiring; the other of the source and the drain of the first transistor and the other of the source and the drain of the second transistor may be electrically connected to one of a source and a drain of the third transistor; the other of the source and the drain of the third transistor may be electrically connected to one electrode of the first capacitor; and the other electrode of the first capacitor may be electrically connected to a first input terminal of the comparator circuit.

In the above embodiment, the read circuit may include a reference signal generation circuit; the A/D converter circuit may include a fourth transistor and a second capacitor; the reference signal generation circuit may be electrically connected to one of a source and a drain of the fourth transistor; the other of the source and the drain of the fourth transistor may be electrically connected to one electrode of the second capacitor; and the other electrode of the second capacitor may be electrically connected to a second input terminal of the comparator circuit.

In the above embodiment, the A/D converter circuit may include a fifth transistor and a sixth transistor; one of a source and a drain of the fifth transistor may be electrically connected to one electrode of the first capacitor; one of a source and a drain of the sixth transistor may be electrically connected to one electrode of the second capacitor; and the other of the source and the drain of the fifth transistor and the other of the source and the drain of the sixth transistor may be electrically connected to a power supply line.

In the above embodiment, the second transistor may include a metal oxide in a channel formation region.

Another embodiment of the present invention is a display device including pixels arranged in a matrix, an IC chip, a gate driver circuit, and a row driver circuit, in which the pixels each include a first pixel circuit including a display element and a second pixel circuit including a light-receiving device; the one IC chip includes a control circuit, a data driver circuit, and a read circuit; the control circuit has a function of supplying a clock signal to the gate driver circuit, the row driver circuit, the data driver circuit and the read circuit; the gate driver circuit has a function of supplying a first scan signal to the first pixel circuit to select the first pixel circuit to which image data is to be supplied; the row driver circuit has a function of supplying a second scan signal to the second pixel circuit to select the second pixel circuit from which imaging data is to be read out; the data driver circuit has a function of supplying the image data to the first pixel circuit selected by the gate driver circuit; the read circuit has a function of reading out imaging data from the second pixel circuit selected by the row driver circuit; the gate driver circuit has a function of outputting the first scan signal in a period in which the row driver circuit does not output the second scan signal; and the row driver circuit has a function of outputting the second scan signal in a period in which the gate driver circuit does not output the first scan signal.

In the above embodiment, the first pixel circuit may include the display element and a driving transistor; the read circuit may include an A/D converter circuit; the A/D converter circuit may include a first transistor, a second transistor, and a comparator circuit; one electrode of the display element may be electrically connected to one of a source and a drain of the driving transistor; one of a source and a drain of the first transistor may be electrically connected to the first pixel circuit; one of a source and a drain of the second transistor may be electrically connected to the second pixel circuit; the other of the source and the drain of the first transistor and the other of the source and the drain of the second transistor may be electrically connected to a first input terminal of the comparator circuit; the A/D converter circuit may have a function of outputting a signal corresponding to a current flowing between the drain and the source of the driving transistor; and the A/D converter circuit may have a function of outputting an imaging signal corresponding to the imaging data.

In the above embodiment, the read circuit may include a reference signal generation circuit; and the reference signal generation circuit may be electrically connected to a second input terminal of the comparator circuit.

In the above embodiment, the first pixel circuit may include the display element and a driving transistor; the read circuit may include an A/D converter circuit; the A/D converter circuit may include a first transistor, a second transistor, a third transistor, a first capacitor, and a comparator circuit; one electrode of the display element may be electrically connected to one of a source and a drain of the driving transistor; one of a source and a drain of the first transistor may be electrically connected to the first pixel circuit; one of a source and a drain of the second transistor may be electrically connected to the second pixel circuit; the other of the source and the drain of the first transistor and the other of the source and the drain of the second transistor may be electrically connected to one of a source and a drain of the third transistor; the other of the source and the drain of the third transistor may be electrically connected to one electrode of the first capacitor; the other electrode of the first capacitor may be electrically connected to a first input terminal of the comparator circuit; the A/D converter circuit may have a function of outputting a signal corresponding to a current flowing between the drain and the source of the driving transistor; and the A/D converter circuit may have a function of outputting an imaging signal corresponding to the imaging data.

In the above embodiment, the read circuit may include a reference signal generation circuit; the A/D converter circuit may include a fourth transistor and a second capacitor; the reference signal generation circuit may be electrically connected to one of a source and a drain of the fourth transistor; the other of the source and the drain of the fourth transistor may be electrically connected to one electrode of the second capacitor; and the other electrode of the second capacitor may be electrically connected to a second input terminal of the comparator circuit.

In the above embodiment, the A/D converter circuit may include a fifth transistor and a sixth transistor; one of a source and a drain of the fifth transistor may be electrically connected to one electrode of the first capacitor; one of a source and a drain of the sixth transistor may be electrically connected to one electrode of the second capacitor; and the other of the source and the drain of the fifth transistor and the other of the source and the drain of the sixth transistor may be electrically connected to a power supply line.

In the above embodiment, the second transistor may include a metal oxide in a channel formation region.

Effect of the Invention

According to one embodiment of the present invention, a display device having a function of a sensor can be provided. An inexpensive display device can be provided. A display device that can display a high-quality image can be provided. A display device whose driving can be easily controlled can be provided. A display device that can display a high-luminance image can be provided. A display device with low power consumption can be provided. A highly reliable display device can be provided. A novel display device can be provided. A novel semiconductor device can be provided.

A driving method for a display device having a function of a sensor can be provided. A driving method for an inexpensive display device can be provided. A driving method for a display device that can display a high-quality image can be provided. A driving method for a display device than can be easily controlled can be provided. A driving method for a display device that can display a high-luminance image can be provided. A driving method for a display device with low power consumption can be provided. A driving method for a reliable display device can be provided. A driving method for a novel display device can be provided. A driving method for a novel semiconductor device can be provided.

Note that the description of these effects does not preclude the existence of other effects. One embodiment of the present invention does not have to have all of these effects. Other effects will be apparent from and can be derived from the description of the specification, the drawings, the claims, and the like.

BRIEF DESCRIPTION OF THE DRAWINGS

FIG. 28A and FIG. 28B are cross-sectional views illustrating structure examples of display devices.

FIG. 29A and FIG. 29B are cross-sectional views illustrating structure examples of display devices.

FIG. 36A is a table showing classifications of crystal structures of IGZO. FIG. 36B is a graph showing an XRD spectrum of a CAAC-IGZO film. FIG. 36C is an image showing a nanobeam electron diffraction pattern of a CAAC-IGZO film.

MODE FOR CARRYING OUT THE INVENTION

Figure 1A:
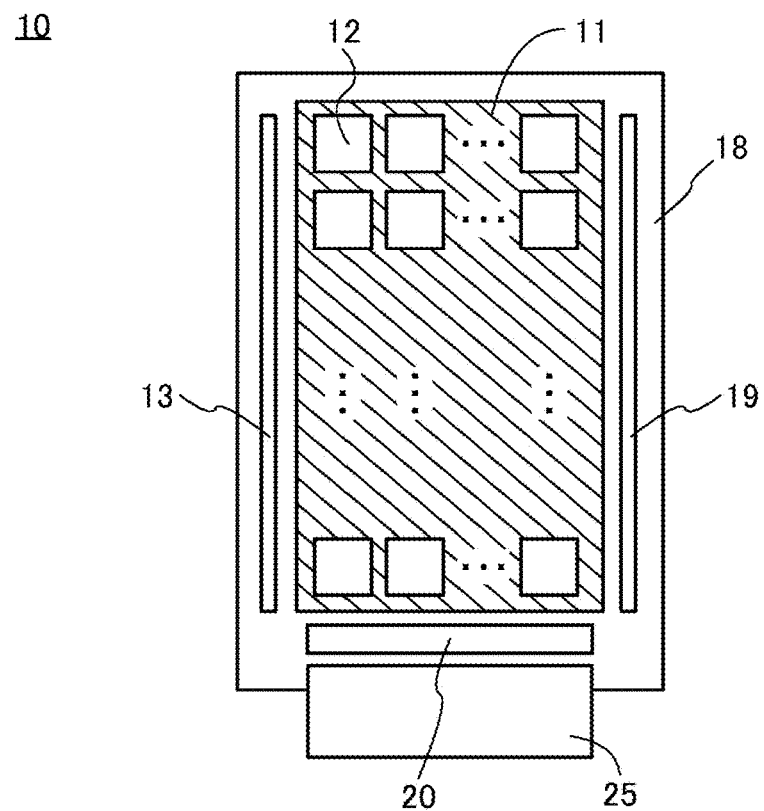
FIG. 1A and FIG. 1B are schematic diagrams illustrating structure examples of display devices.

Embodiments are described in detail below with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the description in the following embodiments. Note that in the structures of the invention described below, the same portions or portions having similar functions are denoted with the same reference numerals in different drawings, and description of such portions is not repeated.

In this specification, the embodiments described below can be combined as appropriate. In the case where a plurality of structure examples are described in one embodiment, the structure examples can be combined as appropriate.

In drawings, the size, the layer thickness, or the region is exaggerated for clarity in some cases. Therefore, they are not necessarily limited to the illustrated scale. The drawings schematically show ideal examples, and shapes, values, or the like are not limited to those shown in the drawings In addition, in this specification and the like, the terms "electrode" and "wiring" do not functionally limit these components. For example, an "electrode" is used as part of a "wiring" in some cases, and vice versa. Furthermore, the terms "electrode" and "wiring" can also include the case where a plurality of "electrodes" and "wirings" are formed in an integrated manner.

A voltage refers to a voltage difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor can be regarded as being electrically short-circuited. Furthermore, an "off state" of the transistor refers to a state in which the source and the drain of the transistor can be regarded as being electrically disconnected. For example, the transistor in an on state can operate in a linear region.

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

Embodiment 1

In this embodiment, display devices of embodiments of the present invention will be described.

One embodiment of the present invention relates to a display device in which pixels each including a light-emitting device and a light-receiving device are provided in a matrix. Providing a light-receiving device as well as a light-emitting device in each pixel allows a display device to not only display an image but also have a function of a touch sensor or the like. In the case where a light-emitting device and a light-receiving device are provided in each pixel, however, not only a data driver circuit having a function of supplying image data representing an image to be displayed using the light-emitting device but also a circuit (read circuit) having a function of reading out imaging data acquired using the light-receiving device needs to be provided in the display device. In one embodiment of the present invention, the data driver circuit and the read circuit are provided in the same IC chip. Thus, the display device can be reduced in cost compared with the case where a data driver circuit and a read circuit are provided in different IC chips.

In the case where a light-emitting device is used as a display element used in displaying an image, a current flowing through the light-emitting device is controlled to control emission luminance, whereby an image can be displayed on a display portion. Here, in the case where the threshold voltage of a driving transistor that is electrically connected to a light-emitting device and has a function of controlling a current flowing through the light-emitting device in accordance with image data written to a pixel varies between pixels, display unevenness or the like might occur. Therefore, a display device including a light-emitting device preferably has a function of reading out the amount of current flowing between a drain and a source of a driving transistor as monitor current data. The threshold voltage or the like of the driving transistor is corrected on the basis of the current value represented by the monitor current data, whereby display unevenness or the like can be reduced. In one embodiment of the present invention, monitor current data is read out by the circuit having a function of reading out imaging data. In other words, imaging data and monitor current data are read out using the same read circuit. Thus, supplying image data to pixels, reading out imaging data, and reading out monitor current data can be performed using the same IC chip. Accordingly, the display device can be reduced in cost compared with the case where supplying image data to pixels, reading out imaging data, and reading out monitor current data are performed using different IC chips.

Configuration Example of Display Device

FIG. 1A is a schematic diagram illustrating a configuration example of a display device 10 that is the display device of one embodiment of the present invention. The display device 10 includes a display portion 11, a gate driver circuit 13, a row driver circuit 19, an IC 20, and FPC (Flexible Printed Circuits) 25 over a substrate 18. The row driver circuit may be referred to as a gate driver circuit. For example, in this specification and the like, the gate driver circuit 13 is referred to as a first gate driver circuit and the row driver circuit 19 is referred to as a second gate driver circuit, in some cases.

In the pixel portion 11, pixels 12 are arranged in a matrix. The IC 20 can be mounted on the substrate 18, as an IC chip. The IC 20 is electrically connected to a circuit provided outside the substrate 18, through the FPC 25.

Figure 1B:
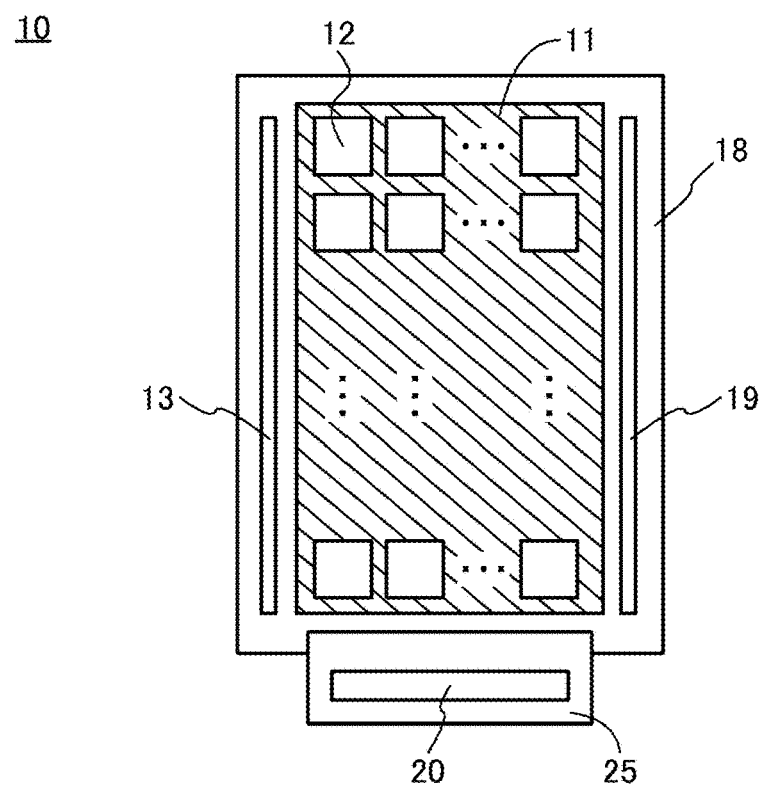

The IC 20 may be provided in the display device 10 by a packaging method such as a COF (Chip On Film) method or a TCP (Tape Carrier Package) method. FIG. 1B illustrates an example in which the IC 20 is placed over the FPC 25. Placing the IC 20 over the FPC 25 enables the area of the substrate 18 to be reduced, whereby the display device 10 can be downsized.

The gate driver circuit 13 or the row driver circuit 19 may be mounted as an IC. In that case, FPC electrically connected to the gate driver circuit 13 or FPC electrically connected to the row driver circuit 19 may be provided over the substrate 18. The gate driver circuit 13 or the row driver circuit 19 may be provided in the display device 10 by a COF method, a TCP method, or the like.

Figure 2A:
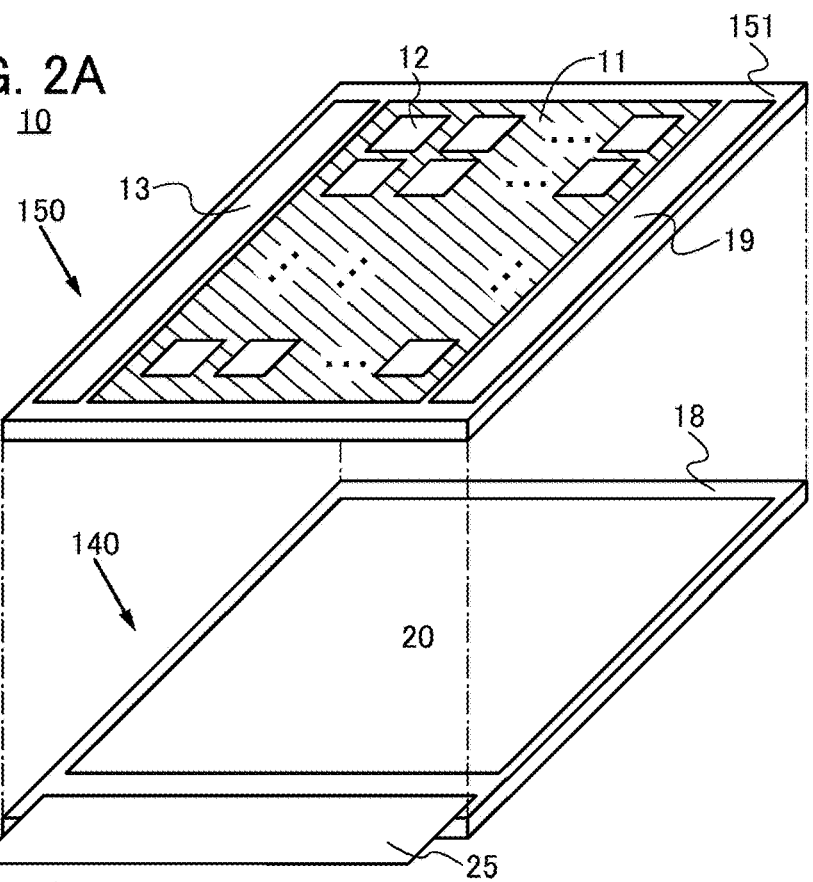
FIG. 2A and FIG. 2B are block diagrams illustrating structure examples of display devices.
Figure 2B:
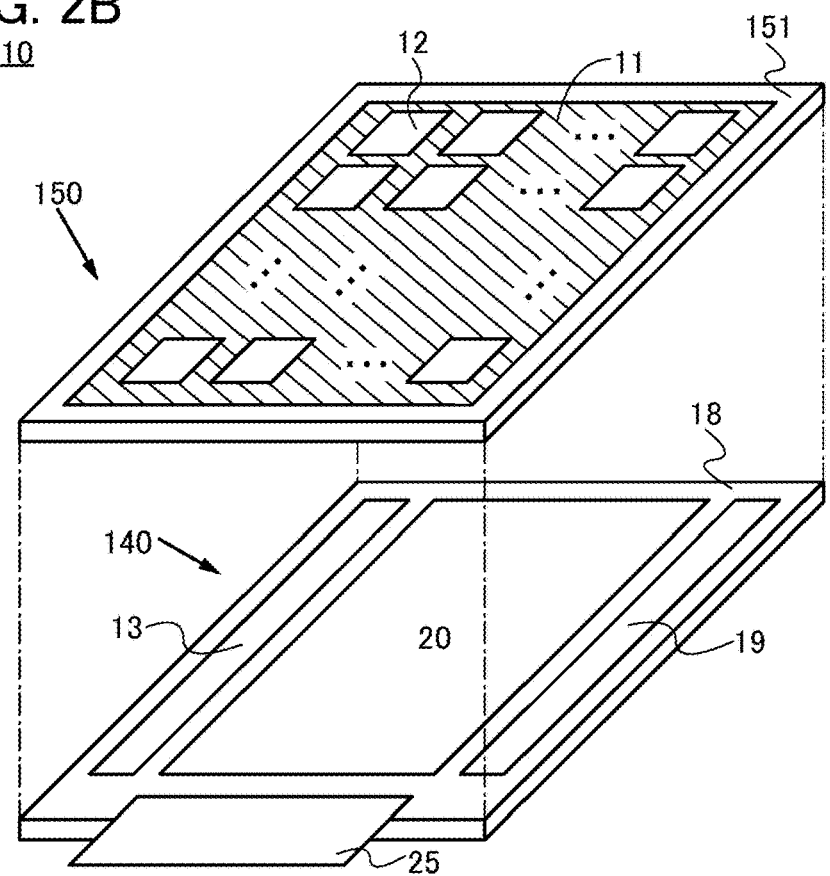

FIG. 2A and FIG. 2B are schematic diagrams each illustrating a configuration example of the display device 10 and are modification examples of the configuration illustrated in FIG. 1A. The display devices 10 having the configurations illustrated in FIG. 2A and FIG. 2B are different from the display device 10 having the configuration illustrated in FIG. 1A in having a stacked-layer structure of a layer 140 and a layer 150.

The substrate 18 is provided in the layer 140, and an insulating film 151 having a function of an interlayer insulating film is provided in the layer 150. In the display device 10 having the configuration illustrated in FIG. 2A, the IC 20 and the FPC 25 are provided over the substrate 18, and the display portion 11, the gate driver circuit 13, and the row driver circuit 19 are provided over the insulating film 151. In the display device 10 having the configuration illustrated in FIG. 2B, the gate driver circuit 13, the row driver circuit 19, the IC 20 and the FPC 25 are provided over the substrate 18, and the display portion 11 is provided over the insulating film 151.

When the display device 10 has the configuration illustrated in FIG. 2A or FIG. 2B, the display portion 11 can be provided so as to include a region overlapping with the IC 20. Accordingly, the area of the display portion 11 can be increased; thus, the display device 10 can have a large screen. In addition, the display device 10 can have a narrow bezel.

When the display device 10 has the configuration illustrated in FIG. 2A or FIG. 2B, the area occupied by the IC 20 can be increased. This can increase the number of transistors and the like which can be provided in the IC 20. As will be described in detail later, the IC 20 has a function of controlling driving of the pixels 12 provided in the display portion 11, for example. When the number of pixels 12 whose driving is controlled by the IC 20 is large, the configuration of a circuit provided in the IC 20 is complicated, resulting in an increase in the number of transistors and the like provided in the IC 20. Thus, when the display device 10 has the configuration illustrated in FIG. 2A or FIG. 2B, the number of pixels 12 whose driving can be controlled by the IC 20 can be increased. Therefore, the number of pixels 12 provided in the display portion 11 can be increased. Accordingly, the pixel density of the display device 10 can be increased. In addition, the display device 10 can have a large screen.

Figure 3A:
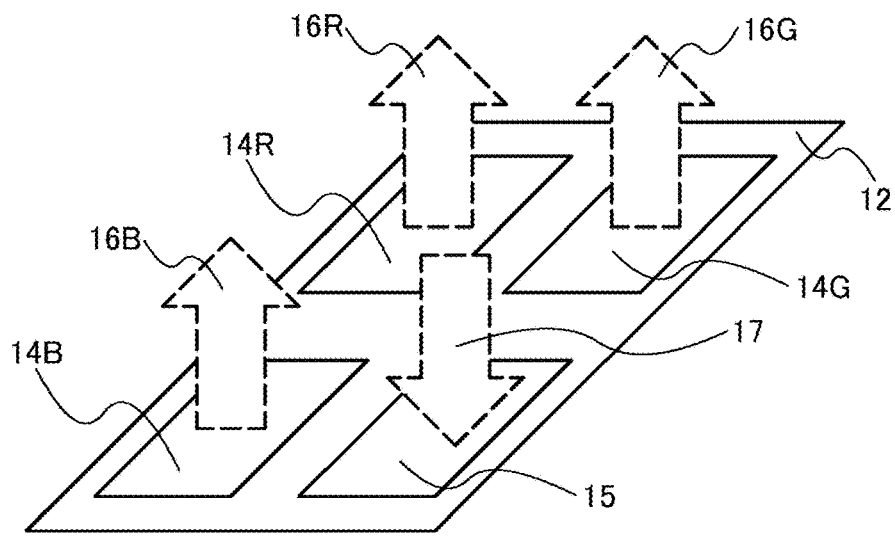
FIG. 3A and FIG. 3D to FIG. 3F are schematic diagrams illustrating pixel configuration examples.

FIG. 3A is a schematic diagram illustrating a configuration example of the pixel 12. The pixel 12 having a configuration illustrated in FIG. 3A includes a pixel circuit 14R having a function of emitting red light 16R, a pixel circuit 14G having a function of emitting green light 16G, a pixel circuit 14B having a function of emitting blue light 16B, and a pixel circuit 15 having a function of sensing light 17. Each of the pixel circuit 14R, the pixel circuit 14G, and the pixel circuit 14B includes a light-emitting device, so that an image can be displayed on the display portion 11 with the use of pixel circuits 14. The pixel circuit 15 includes a light-receiving device.

In this specification and the like, the pixel circuit 14R, the pixel circuit 14G, and the pixel circuit 14B are collectively referred to as the pixel circuits 14, for example. The light 16R, the light 16G, and the light 16B are collectively referred to as light 16, for example.

Figure 3B:
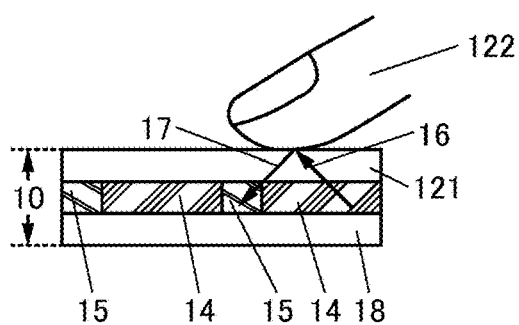
FIG. 3B and FIG. 3C are cross-sectional views illustrating a structure example of a display device.
Figure 3C:
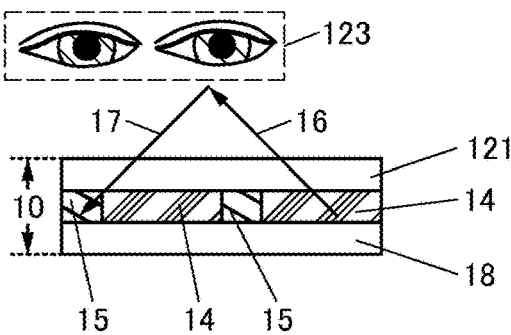

FIG. 3B and FIG. 3C are schematic diagrams illustrating a cross-sectional structure example of the display device 10. As illustrated in FIG. 3B and FIG. 3C, the pixel circuits 14 and the pixel circuits 15 are provided between the substrate 18 and a substrate 121.

When the display device 10 includes not only the pixel circuits 14 provided with light-emitting devices but also the pixel circuits 15 provided with light-receiving devices, the display device 10 can have a function of an image sensor or a touch sensor. The display device 10 can acquire imaging data by sensing light emitted to the light-receiving device, for example. An object such as a finger touching the display device 10 can be sensed as illustrated in FIG. 3B, for example. For example, the light 16 emitted from the light-emitting device included in the pixel circuit 14 is reflected by a finger 122 touching the display device 10, so that the reflected light is sensed as the light 17 by the light-receiving device provided in the pixel circuit 15. Thus, the touch of the finger 122 on the display device 10 can be sensed.

The display device 10 may have a function of sensing an object that is near but not in contact with the display device 10. In that case, the display device 10 can have a function of a near touch sensor. In addition, as illustrated in FIG. 3C, eyes 123 of the user of the display device 10 can be sensed. By sensing the eyes 123, the display device 10 can sense the facial expression, the motion of the eyes, the pupil diameters, or the like of the user of the display device 10.

The display device 10 can acquire data on fingerprint, palm print, iris, or the like. Thus, the display device 10 can have a function of biometric authentication. In that case, it can be said that the light-receiving device provided in the pixel circuit 15 has a function of a sensor for biometric authentication and the display device 10 incorporates a sensor for biometric authentication. When the display device 10 incorporates a sensor for biometric authentication, the number of components of an electronic device in which the display device 10 is provided can be reduced compared with the case where a sensor for biometric authentication is provided separately from the display device 10. Accordingly, the electronic device can be reduced in size and weight.

As described above, the display device 10 can acquire data on the facial expression, the motion of the eyes, a change in the pupil diameters, or the like of the user of the display device 10 with the use of the light-emitting devices and the light-receiving devices. By analysis of the data, information on the physical and mental state of the user of the display device 10 can be obtained. Changing the output contents of one or both of display and sound on the basis of the information allows a user to safely use a device for VR (Virtual Reality), a device for AR (Augmented Reality), or a device for MR (Mixed Reality), for example.

As described above, in the display device 10, when the light 16 emitted from the light-emitting device is reflected by an object, the light-receiving device can sense the reflected light as the light 17. Thus, image capturing or the like can be performed even in a dark place.

Figure 3D:
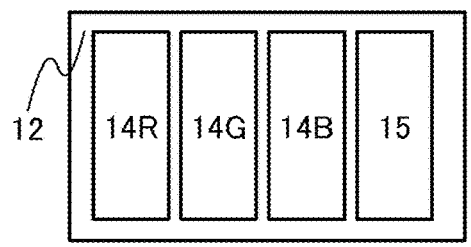

FIG. 3A illustrates a configuration example of the pixel 12 in which the pixel circuit 14R, the pixel circuit 14G, the pixel circuit 14B, and the pixel circuit 15 are arranged in a matrix of 2×2; however, one embodiment of the present invention is not limited thereto. As illustrated in FIG. 3D, the pixel circuit 14R, the pixel circuit 14G, the pixel circuit 14B, and the pixel circuit 15 may be arranged side by side.

Figure 3E:
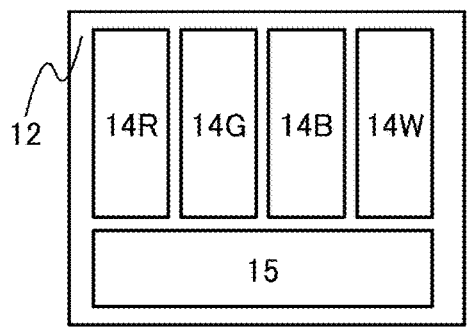

As illustrated in FIG. 3E, the pixel 12 may include a pixel circuit 14W having a function of emitting white light as well as the pixel circuit 14R, the pixel circuit 14G, the pixel circuit 14B, and the pixel circuit 15. In the case where the pixel 12 has the configuration illustrated in FIG. 3E, the pixel circuit 14R, the pixel circuit 14G, the pixel circuit 14B, and the pixel circuit 14W can be collectively referred to as the pixel circuits 14.

Figure 3F:
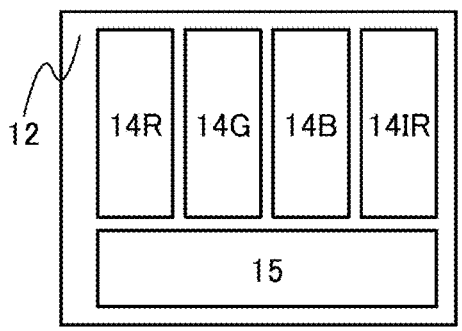

As illustrated in FIG. 3F, the pixel 12 may include a pixel circuit 1418 having a function of emitting infrared light as well as the pixel circuit 14R, the pixel circuit 14G, the pixel circuit 14B, and the pixel circuit 15. In that case, the pixel circuit 15 preferably has a function of sensing infrared light. The pixel circuit 15 may have a function of sensing both visible light and infrared light. When the pixel circuit 1418 having a function of emitting infrared light is provided in the pixel 12 and the pixel circuit 15 has a function of sensing infrared light, the display device 10 can sense an object such as the finger 122 or the eyes 123 with high accuracy. Both the pixel circuit 14W and the pixel circuit 141R may be provided in the pixel 12.

The pixel circuit 14R, the pixel circuit 14G, and the pixel circuit 14B illustrated in FIG. 3A and FIG. 3D to FIG. 3F, the pixel circuit 14W illustrated in FIG. 3E, and the pixel circuit 141R illustrated in FIG. 3F can be all referred to as the pixel circuits 14.

Figure 4:
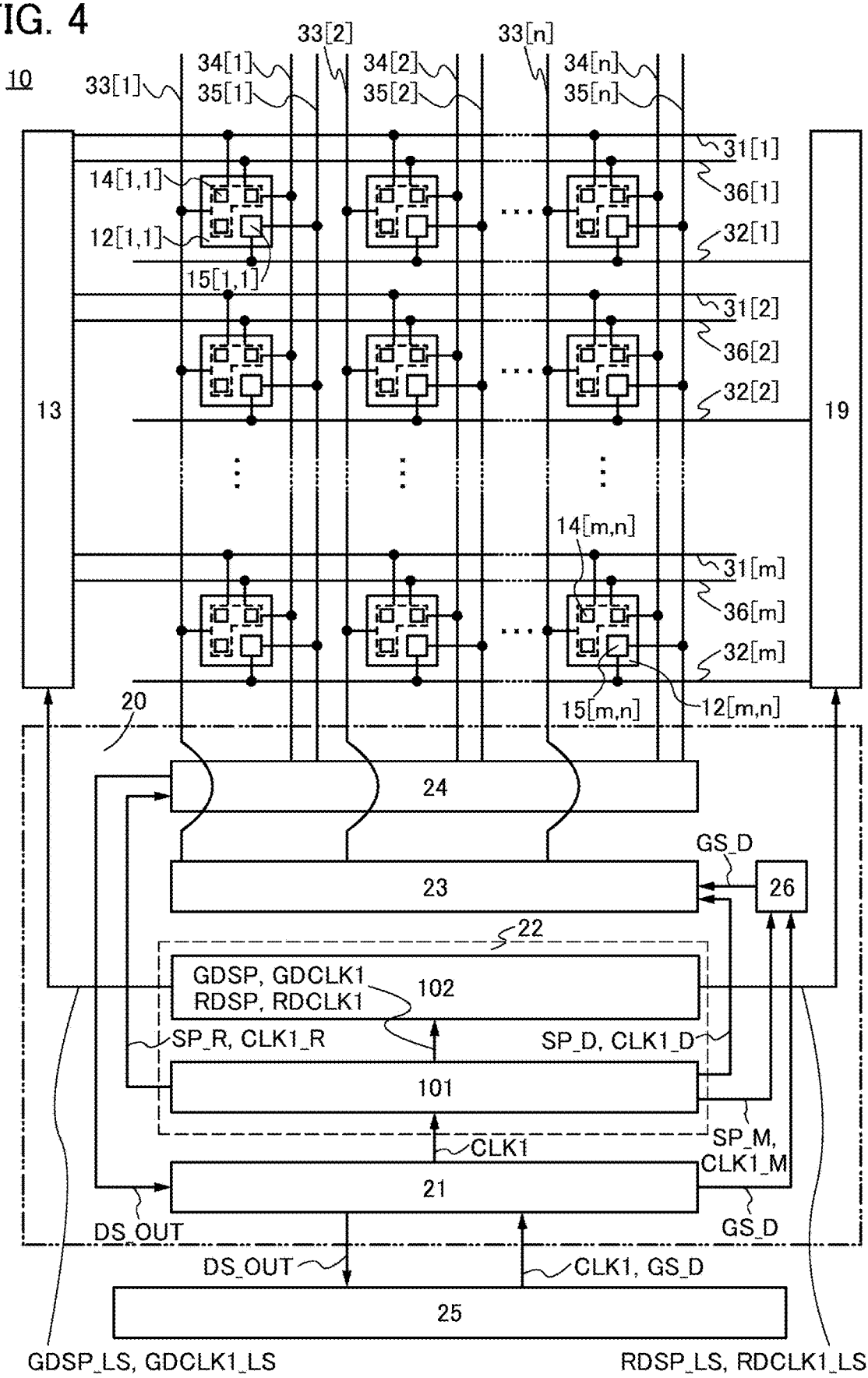
FIG. 4 is a block diagram illustrating a configuration example of a display device.

FIG. 4 is a block diagram illustrating a configuration example of the display device 10. As illustrated in FIG. 4, the IC 20 includes an interface circuit 21, a control circuit 22, a memory circuit 26, a data driver circuit 23, and a read circuit 24. The control circuit 22 includes a timing signal generation circuit 101 and a level shifter circuit 102.

In FIG. 4, three pixel circuits 14 are provided per pixel 12. For example, in the case where the pixel 12 has the configuration illustrated in FIG. 3A or FIG. 3D, the three pixel circuits 14 can be the pixel circuit 14R, the pixel circuit 14G, and the pixel circuit 14B. In the case where the pixel 12 has the configuration illustrated in FIG. 3E or FIG. 3F, for example, it can be said that four pixel circuits 14 are provided per pixel 12.

In this specification and the like, when a plurality of components are denoted with the same reference numerals, and in particular, need to be distinguished from each other, an identification sign such as "[1]", "[m]", "[1,1]", or "[m,n]" is sometimes added to the reference numerals. For example, the pixel 12 in the first row and the first column is denoted as a pixel 12[1,1], and the pixel 12 in the m-th row and the n-th column is denoted as a pixel 12[$m,n$]. The pixel circuit 14 and the pixel circuit 15 included in the pixel 12[1,1] are denoted as a pixel circuit 14[1,1] and a pixel circuit 15[1,1], respectively, and the pixel circuit 14 and the pixel circuit 15 included in the pixel 12[$m,n$] are denoted as a pixel circuit 14[$m,n$] and a pixel circuit 15[$m,n$], respectively.

The gate driver circuit 13 is electrically connected to the pixel circuits 14 through wirings 31. The gate driver circuit 13 is electrically connected to the pixel circuits 14 through wirings 36. The row driver circuit 19 is electrically connected to the pixel circuits 15 through wirings 32. The data driver circuit 23 is electrically connected to the pixel circuits 14 through wirings 33. The read circuit 24 is electrically connected to the pixel circuits 14 through wirings 34 and electrically connected to the pixel circuits 15 through wirings 35.

FIG. 4 illustrates the configuration in which the pixels 12 in the same row are electrically connected to the same wiring 31, the same wiring 36, and the same wiring 32, and the pixels 12 in the same column are electrically connected to the same wiring 33, the same wiring 34, and the same wiring 35. In this specification and the like, for example, the wiring 31, the wiring 36, and the wiring 32 electrically connected to the pixels 12 in the first row are denoted as a wiring 31[1], a wiring 36[1], and a wiring 32[1], respectively, and the wiring 31, the wiring 36, and the wiring 32 electrically connected to the pixels 12 in the m-th row are denoted as a wiring 31 [m], a wiring 36[$m$], and a wiring 32[$m$], respectively. For example, the wiring 33, the wiring 34, and the wiring 35 electrically connected to the pixels 12 in the first column are denoted as a wiring 33[1], a wiring 34[1], and a wiring 35[1], respectively, and the wiring 33, the wiring 34, and the wiring 35 electrically connected to the pixels 12 in the n-th column are denoted as a wiring 33 [n], a wiring 34[$n$], and a wiring 35[$n$], respectively.

The gate driver circuit 13 has a function of selecting the pixels 12 to which image data is written. Specifically, a signal is output to the wirings 31, whereby the pixels 12 to which image data is written can be selected. Here, the gate driver circuit 13 outputs the signal sequentially to the wiring 31[1] to the wiring 31[$m$], whereby image data can be written sequentially to the pixels 12 in the first row to the pixels 12 in the m-th row. Thus, a signal supplied to the pixels 12 through the wirings 31 can be regarded as a scan signal, and the wirings 31 can be regarded as scan lines.

One of a source and a drain of a driving transistor is electrically connected to one electrode of the light-emitting device included in the pixel circuit 14. The driving transistor has a function of controlling a current flowing through the light-emitting device according to image data written to the pixel 12. Controlling a current flowing through the light-emitting device can control the emission luminance of the light-emitting device. In the case where the threshold voltage of the driving transistor varies between the pixel circuits 14, display unevenness or the like might occur. The display device 10 has a function of reading out, as monitor current data, the amount of current flowing between the drain and the source of the driving transistor provided in the pixel circuit 14. The threshold voltage or the like of the driving transistor is corrected on the basis of the current value represented by monitor current data, whereby display unevenness or the like can be reduced. Thus, high-quality images can be displayed on the display portion 11.

The gate driver circuit 13 has a function of selecting pixels from which the monitor current data is read out. Specifically, a signal is output to the wirings 36, whereby the pixels 12 from which the monitor current data is read out can be selected.

The row driver circuit 19 has a function of selecting the pixels 12 from which imaging data acquired by the pixel circuits 15 including the light-receiving devices is read out. Specifically, a signal is output to the wirings 32, whereby the pixels 12 from which imaging data is read out can be selected. Here, the row driver circuit 19 outputs the signal sequentially to the wiring 32[1] to the wiring 32[*m*], whereby imaging data can be read out sequentially from the pixels 12 in the first row to the pixels 12 in the m-th row. Thus, the signal supplied from the row driver circuit 19 to the pixels 12 through the wirings 32 can be regarded as a scan signal, and the wirings 32 can be regarded as scan lines.

As described above, a signal supplied from the gate driver circuit 13 to the pixel circuits 14 through the wirings 31 and a signal supplied from the row driver circuit 19 to the pixel circuits 15 through the wirings 32 can each be regarded as a scan signal. Thus, in this specification and the like, for example, the signal supplied from the gate driver circuit 13 to the pixel circuits 14 through the wirings 31 is referred to as a first scan signal, and the signal supplied from the row driver circuit 19 to the pixel circuits 15 through the wirings 32 is referred to as a second scan signal, in some cases. The wirings 31 are referred to as first scan lines, and the wirings 32 are referred to as second scan lines, in some cases.

The interface circuit 21 has a function of receiving a clock signal CLK1 and a digital image signal GS_D that are input from a circuit (not illustrated) electrically connected to the FPC 25. Here, the digital image signal GS_D is a digital signal representing image data written to the pixels 12. The interface circuit 21 also has a function of supplying the received clock signal CLK1 to the timing signal generation circuit 101 included in the control circuit 22 and supplying the received digital image signal GS_D to the memory circuit 26. In the case where the interface circuit 21 receives a serial signal, the signal can be converted into a parallel signal and supplied to the control circuit 22, the memory circuit 26, or the like, for example.

The control circuit 22 has a function of generating a start pulse signal and a clock signal and supplying the signals to the gate driver circuit 13, the row driver circuit 19, the data driver circuit 23, the read circuit 24, and the memory circuit 26. Thus, the control circuit 22 can control the driving of the gate driver circuit 13, the row driver circuit 19, the data driver circuit 23, the read circuit 24, and the memory circuit 26. Here, the driving of the gate driver circuit 13, the row driver circuit 19, the data driver circuit 23, the read circuit 24, and the memory circuit 26 is preferably controlled by one control circuit 22 provided in the IC 20, in which case the driving of the above circuits can be correlated with each other by a simple control method.

The timing signal generation circuit 101 included in the control circuit 22 has a function of generating a start pulse signal SP_D and a clock signal CLK1_D and supplying the signals to the data driver circuit 23. The timing signal generation circuit 101 also has a function of generating a start pulse signal SP_R and a clock signal CLK1_R and supplying the signals to the read circuit 24. The timing signal generation circuit 101 also has a function of generating a start pulse signal SP_M and a clock signal CLK1_M and supplying the signals to the memory circuit 26. Furthermore, the timing signal generation circuit 101 has a function of generating a start pulse signal GDSP, a clock signal GDCLK1, a start pulse signal RDSP, and a clock signal RDCLK1 and supplying the signals to the level shifter circuit 102. The clock signal CLK1_D, the clock signal CLK1_R, the clock signal CLK1_M, the clock signal GDCLK1, and the clock signal RDCLK1 can be generated by dividing the frequency of the clock signal CLK1, for example. Here, to divide the frequency of the clock signal CLK1 means to change the frequency of the clock signal CLK1 by a factor of 1/N (N is an integer of 1 or more).

The level shifter circuit 102 included in the control circuit 22 has a function of changing the potential level of the start pulse signal GDSP to generate a start pulse signal GDSP_LS and supplying the start pulse signal GDSP_LS to the gate driver circuit 13. The level shifter circuit 102 also has a function of changing the potential level of the clock signal GDCLK1 to generate a clock signal GDCLK1_LS and supplying the clock signal GDCLK1_LS to the gate driver circuit 13. The level shifter circuit 102 also has a function of changing the potential level of the start pulse signal RDSP to generate a start pulse signal RDSP_LS and supplying the start pulse signal RDSP_LS to the row driver circuit 19. Furthermore, the level shifter circuit 102 has a function of changing the potential level of the clock signal RDCLK1 to generate a clock signal RDCLK1_LS and supplying the clock signal RDCLK1_LS to the row driver circuit 19.

The driving of the gate driver circuit 13 can be controlled by the start pulse signal GDSP_LS and the clock signal GDCLK1_LS. For example, when the start pulse signal GDSP_LS is input to the gate driver circuit 13, the first scan signal is output sequentially to the wiring 31[1] to the wiring 31[*m*] in response to the rise or fall of the clock signal GDCLK1_LS. The driving of the row driver circuit 19 can be controlled by the start pulse signal RDSP_LS and the clock signal RDCLK1_LS. For example, when the start pulse signal RDSP_LS is input to the row driver circuit 19, the second scan signal is output sequentially to the wiring 32[1] to the wiring 32[*m*] in response to the rise or fall of the clock signal RDCLK1_LS.

The memory circuit 26 has a function of temporarily storing the digital image signal GS_D and supplying the digital image signal GS_D to the data driver circuit 23 at a predetermined timing. The timing at which the digital image signal GS_D stored in the memory circuit 26 is supplied to the data driver circuit 23 can be controlled by the start pulse signal SP_M and the clock signal CLK1_M. It can be said that the memory circuit 26 has a function of a frame memory. For example, the memory circuit 26 can be formed using a memory element such as a DRAM (Dynamic Random Access Memory) or an SRAM (Static Random Access Memory).

The data driver circuit 23 has a function of supplying image data represented by the digital image signal GS_D to the pixels 12 through the wirings 33. Specifically, the data driver circuit 23 has a function of supplying image data represented by the digital image signal GS_D to the pixels 12 selected when the gate driver circuit 13 outputs the first scan signal to the wirings 31. Image data represented by the digital image signal GS_D is supplied to the pixels 12 through the wirings 33; thus, the wirings 33 can be regarded as data lines.

The driving of the data driver circuit 23 can be controlled by the start pulse signal SP_D and the clock signal CLK1_D. For example, when the start pulse signal SP_D is input to the data driver circuit 23, the digital image signal GS_D is output sequentially to the wiring 33[1] to the wiring 33[n] in response to the rise or fall of the clock signal CLK1_D.

The read circuit 24 has a function of reading out monitor current data. Specifically, the read circuit 24 has a function of reading out the monitor current data in the pixel circuits 14 selected when the gate driver circuit 13 outputs a signal to the wirings 36. The read circuit 24 also has a function of reading out imaging data. Specifically, the read circuit 24 has a function of reading out the imaging data written to the pixels 12 selected when the row driver circuit 19 outputs the second scan signal to the wirings 32. Here, the read circuit 24 has a function of outputting the read data as a data signal DS_OUT and supplying the data signal DS_OUT to the interface circuit 21. Thus, the data signal DS_OUT can be regarded as a signal representing monitor current data or a signal representing imaging data.

The driving of the read circuit 24 can be controlled by the start pulse signal SP_R and the clock signal CLK1_R. For example, when the start pulse signal SP_R is input to the read circuit 24, the monitor current data input to the read circuit 24 through the wiring 34[1] to the wiring 34[n] is sequentially output as the data signal DS_OUT in response to the rise or fall of the clock signal CLK1_R. Alternatively, when the start pulse signal SP_R is input to the read circuit 24, the imaging data input to the read circuit 24 through the wiring 35[1] to the wiring 35[n] is sequentially output as the data signal DS_OUT in response to the rise or fall of the clock signal CLK1_R.

Since a monitor current flows to the wirings 34, the wirings 34 can be regarded as monitor lines. Since the imaging data written to the pixel circuits 15 are output to the wirings 35, the wirings 35 can be regarded as data lines.

In this specification and the like, the data signal DS_OUT corresponding to monitor current data is referred to as a monitor signal or a first data signal and the data signal DS_OUT corresponding to imaging data is referred to as an imaging signal or a second data signal, in some cases.

As illustrated in FIG. 4, in one embodiment of the present invention, the data driver circuit 23 and the read circuit 24 are provided together in the IC 20. That is, the data driver circuit 23 and the read circuit 24 are provided in the same IC chip. In one embodiment of the present invention, imaging data and monitor current data are read out using the read circuit 24. Thus, supplying image data to the pixels 12, reading out imaging data, and reading out monitor current data can be performed using the same IC chip. Accordingly, the display device 10 can be reduced in cost compared with the case where supplying image data to the pixels 12, reading out imaging data, and reading out monitor current data are performed using different IC chips.

Example of Driving Method for Gate Driver Circuit and Row Driver Circuit

Figure 5:
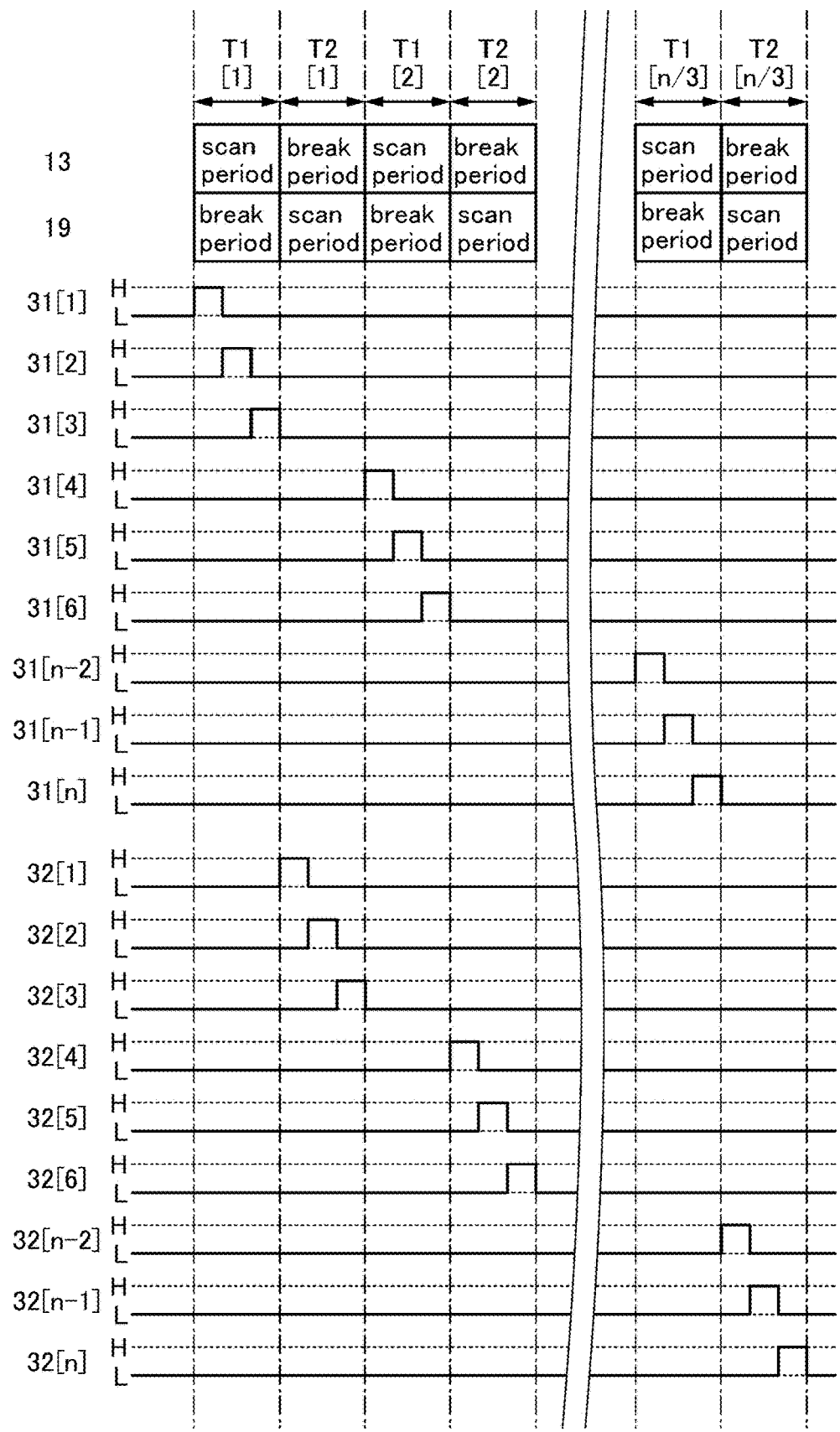
FIG. 5 is a timing chart showing an example of a driving method for a display device.

FIG. 5 is a timing chart showing an example of a driving method for the gate driver circuit 13 and the row driver circuit 19. Specifically, FIG. 5 is a timing chart showing changes over time in the potentials of the wirings 31 electrically connected to the gate driver circuit 13 and the potentials of the wirings 32 electrically connected to the row driver circuit 19. In the timing chart shown in FIG. 5, a high potential is denoted as "H" and a low potential is denoted as "L". The same applies to the other timing charts. For simplification of description, the influence of various kinds of resistance such as wiring resistance, the parasitic capacitance of a transistor, a wiring, or the like, the threshold voltage of a transistor, and the like is not taken into account. The same applies to the other timing charts.

Here, the potential of the wiring 31 to which the first scan signal is output becomes a high potential. The potential of the wiring 32 to which the second scan signal is output becomes a high potential. The potentials of other wirings to which signals are output become high potentials in some cases.

In a period T1[1], the gate driver circuit 13 outputs the first scan signal sequentially to the wiring 31[1] to the wiring 31[3], for example. The row driver circuit 19 does not output the second scan signal to the wiring 32.

In a period T2[1], the row driver circuit 19 outputs the second scan signal sequentially to the wiring 32[1] to the wiring 32[3], for example. The gate driver circuit 13 does not output the first scan signal to the wiring 31.

In a period T1[2], the gate driver circuit 13 outputs the first scan signal sequentially to the wiring 31[4] to the wiring 31[6], for example. The row driver circuit 19 does not output the second scan signal to the wiring 32.

In a period T2[2], the row driver circuit 19 outputs the second scan signal sequentially to the wiring 32[4] to the wiring 32[6], for example. The gate driver circuit 13 does not output the first scan signal to the wiring 31.

In the above manner, the output of the first scan signal to the wiring 31 by the gate driver circuit 13 and the output of the second scan signal to the wiring 32 by the row driver circuit 19 are alternately performed.

In a period T1[n/3], the gate driver circuit 13 outputs the first scan signal sequentially to the wiring 31[n−2] to the wiring 31[n], for example. The row driver circuit 19 does not output the second scan signal to the wiring 32.

In a period T2[n/3], the row driver circuit 19 outputs the second scan signal sequentially to the wiring 32[n−2] to the wiring 32[n], for example. The gate driver circuit 13 does not output the first scan signal to the wiring 31.

As described above, in the period T1, the gate driver circuit 13 generates the first scan signal and outputs the first scan signal to the wiring 31, whereas the row driver circuit 19 does not generate the second scan signal. Thus, it can be said that the period T1 is a scan period for the gate driver circuit 13 and is a break period for the row driver circuit 19. In the period T2, the row driver circuit 19 generates the second scan signal and outputs the second scan signal to the wiring 32, whereas the gate driver circuit 13 does not generate the first scan signal. Thus, it can be said that the period T2 is a break period for the gate driver circuit 13 and is a scan period for the row driver circuit 19.

In the above manner, in one embodiment of the present invention, when one of the gate driver circuit 13 and the row driver circuit 19 is in a scan period, the other is in a break period. This can inhibit interference between the driving of the pixel circuits 14 to which the gate driver circuit 13 supplies the first scan signal and the driving of the pixel circuits 15 to which the row driver circuit 19 supplies the second scan signal. Thus, noise included in data output from the pixel circuits 14 and data output from the pixel circuits 15 can be reduced. In particular, noise included in imaging data output from the pixel circuits 15 can be reduced; therefore, the display device 10 can sense an object such as a finger with high accuracy.

In the driving method shown in FIG. 5, the period T1 and the period T2 are repeated more than once in one frame period. That is, for example, the following is not employed: after the first scan signal is output sequentially to all of the wiring 31[1] to the wiring 31[$m$] in the period T1[1], the second scan signal is output sequentially to all of the wiring 32[1] to the wiring 32[$m$] in the period T2[1]. The period T1 and the period T2 are repeated more than once in the above manner, whereby occurrence of flicker in images displayed on the display portion 11 using the pixel circuits 14 can be inhibited. Thus, high-quality images can be displayed on the display portion 11. In one frame period, one period T1 and one period T2 may be provided. In other words, for example, the first scan signal may be output sequentially to all of the wiring 31[1] to the wiring 31[$m$] in the period T1[1] and then the second scan signal may be output sequentially to all of the wiring 32[1] to the wiring 32[$m$] in the period T2[1].

Here, in the driving method shown in FIG. 5, a period serving as a scan period for the gate driver circuit 13 is a break period for the row driver circuit 19, and a period serving as a break period for the gate driver circuit 13 is a scan period for the row driver circuit 19. Thus, the driving of the gate driver circuit 13 and the driving of the row driver circuit 19 are not independent of each other and correlate with each other. Therefore, the driving of the gate driver circuit 13 and the driving of the row driver circuit 19 are preferably controlled by the same circuit, in which case the control is facilitated. FIG. 4 illustrates the configuration in which the driving of the gate driver circuit 13 and the driving of the row driver circuit 19 are controlled by the control circuit 22.

Although FIG. 5 shows the case where after the gate driver circuit 13 outputs the first scan signal to three wirings 31 in the period T1, the row driver circuit 19 outputs the second scan signal to three wirings 32 in the period T2; however, one embodiment of the present invention is not limited thereto. The gate driver circuit 13 may output the first scan signal to one or two wirings 31 in the period T1 and then the row driver circuit 19 may output the second scan signal to one or two wirings 32 in the period T2. Alternatively, the gate driver circuit 13 may output the first scan signal to four or more wirings 31 in the period T1 and then the row driver circuit 19 may output the second scan signal to four or more wirings 32 in the period T2.

Configuration Example of Data Driver Circuit

Figure 6:
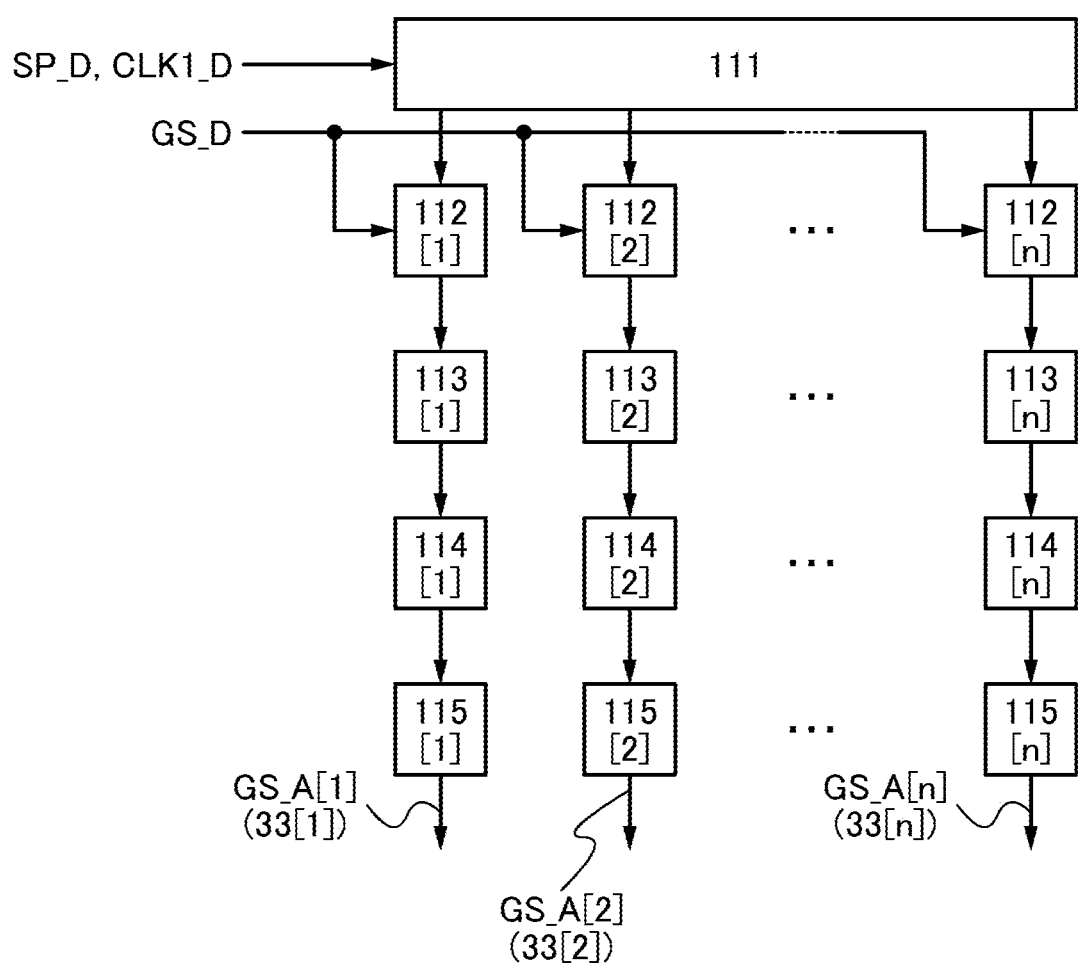
FIG. 6 is a block diagram illustrating a configuration example of a display device.

FIG. 6 is a block diagram illustrating a configuration example of the data driver circuit 23. The data driver circuit 23 includes a shift register circuit 111, latch circuits 112, level shifter circuits 113, D/A (Digital to Analog) converter circuits 114, and amplifier circuits 115. Here, the latch circuits 112, the level shifter circuits 113, the D/A converter circuits 114, and the amplifier circuits 115 can be provided such that the number thereof corresponds to the number of columns of the pixels 12 provided in the display portion 11, for example. For example, a configuration can be employed in which n latch circuits 112, n level shifter circuits 113, n D/A converter circuits 114, and n amplifier circuits 115 are provided.

The start pulse signal SP_D and the clock signal CLK1_D can be supplied to the shift register circuit 111. The digital image signal GS_D can be supplied to the latch circuits 112.

The shift register circuit 111 has a function of generating a signal for controlling the driving of the latch circuits 112. The latch circuit 112 has a function of retaining or outputting the digital image signal GS_D. For example, when the start pulse signal SP_D is input to the shift register circuit 111, the retained digital image signals GS_D can be output sequentially from the latch circuit 112[1] to the latch circuit 112[$n$] in response to the rise or fall of the clock signal CLK1_D.

The level shifter circuit 113 has a function of changing the potential level of the digital image signal GS_D output from the latch circuit 112. The D/A converter circuit 114 has a function of converting the digital image signal output from the level shifter circuit 113 into an analog image signal. The amplifier circuit has a function of amplifying the analog image signal output from the D/A converter circuit 114 and outputting the amplified analog image signal as an analog image signal GS_A to the wiring 33. Providing the amplifier circuit 115 allows stable supply of image data represented by the analog image signal GS_A to the pixel 12. As the amplifier circuit 115, a voltage follower circuit including an operational amplifier and the like can be used, for example. In the case where a circuit including a differential input circuit is used as the amplifier circuit, the offset potential of the differential input circuit is preferably set as close to 0 V as possible.

Configuration Example of Read Circuit

Figure 7:
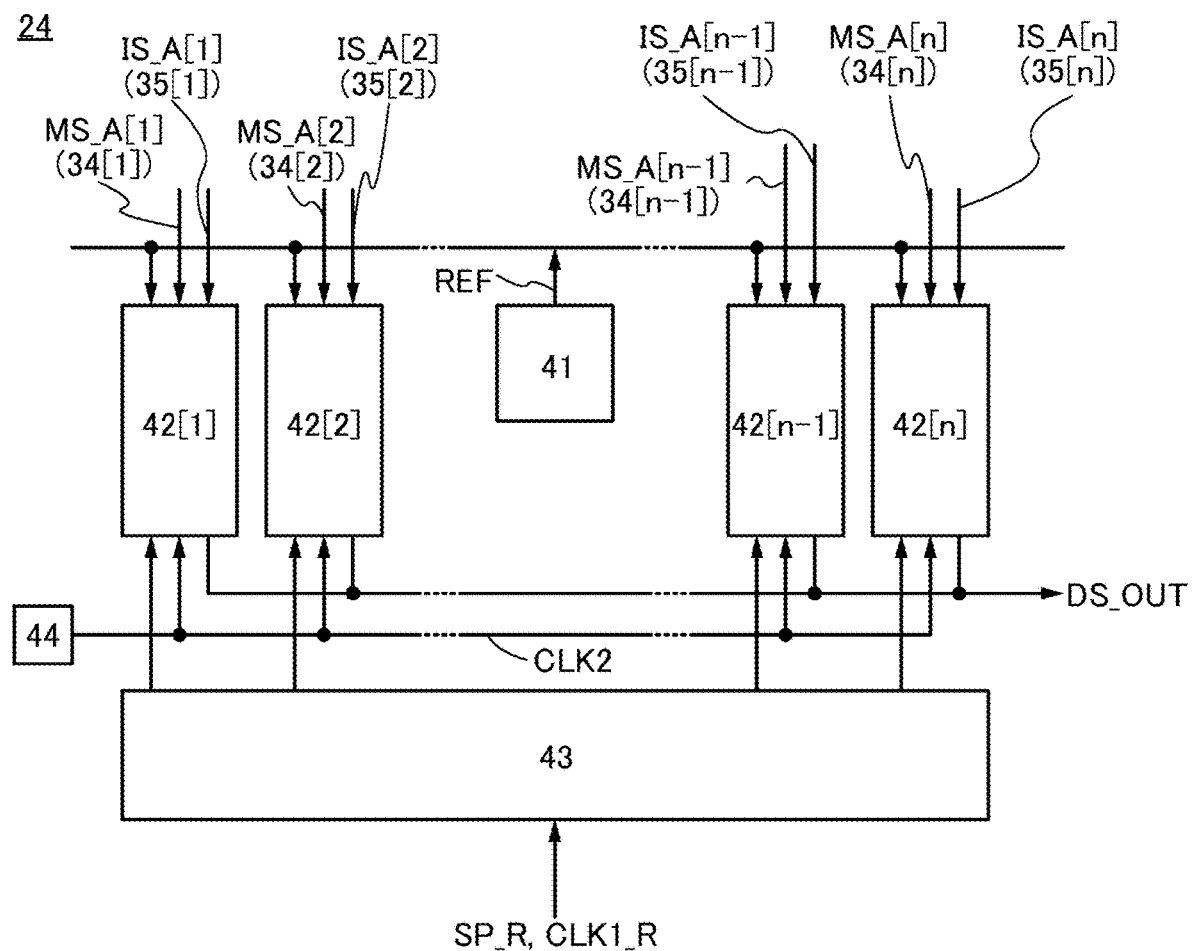
FIG. 7 is a block diagram illustrating a configuration example of a display device.

FIG. 7 is a block diagram illustrating a configuration example of the read circuit 24. The read circuit 24 includes a reference signal generation circuit 41, A/D (Analog to Digital) converter circuits 42, a shift register circuit 43, and a clock signal generation circuit 44. The A/D converter circuits 42 can be provided such that the number thereof corresponds to the number of columns of the pixels 12 provided in the display portion 11, for example. That is, in the read circuit 24, an A/D converter circuit 42[1] to an A/D converter circuit 42[$n$] can be provided, for example.

The reference signal generation circuit 41 has a function of generating a reference signal REF and supplying the reference signal REF to the A/D converter circuits 42. Here, the reference signal REF can be a ramp signal, which is a signal whose potential continuously changes, for example. The A/D converter circuit 42 has a function of converting an analog monitor signal MS_A representing monitor current data acquired by the pixel circuit 14 or an analog imaging signal IS_A representing imaging data acquired by the pixel circuit 15 into a digital signal and outputting the digital signal as the data signal DS_OUT.

The shift register circuit 43 has a function of generating a signal for controlling the driving of the A/D converter circuits 42. For example, when the start pulse signal SP_R is input to the shift register circuit 43, the data signal DS_OUT can be output sequentially from the A/D converter circuit 42[1] to the A/D converter circuit 42[$n$] in response to the rise or fall of the clock signal CLK1_R.

The clock signal generation circuit 44 has a function of generating a clock signal CLK2 and supplying the clock signal CLK2 to the A/D converter circuits 42. The A/D converter circuit 42 can convert the analog monitor signal MS_A or the analog imaging signal IS_A into a digital signal in accordance with the reference signal REF and the clock signal CLK2 and output the digital signal as the data signal DS_OUT.

Pixel Configuration Example

Figure 8:
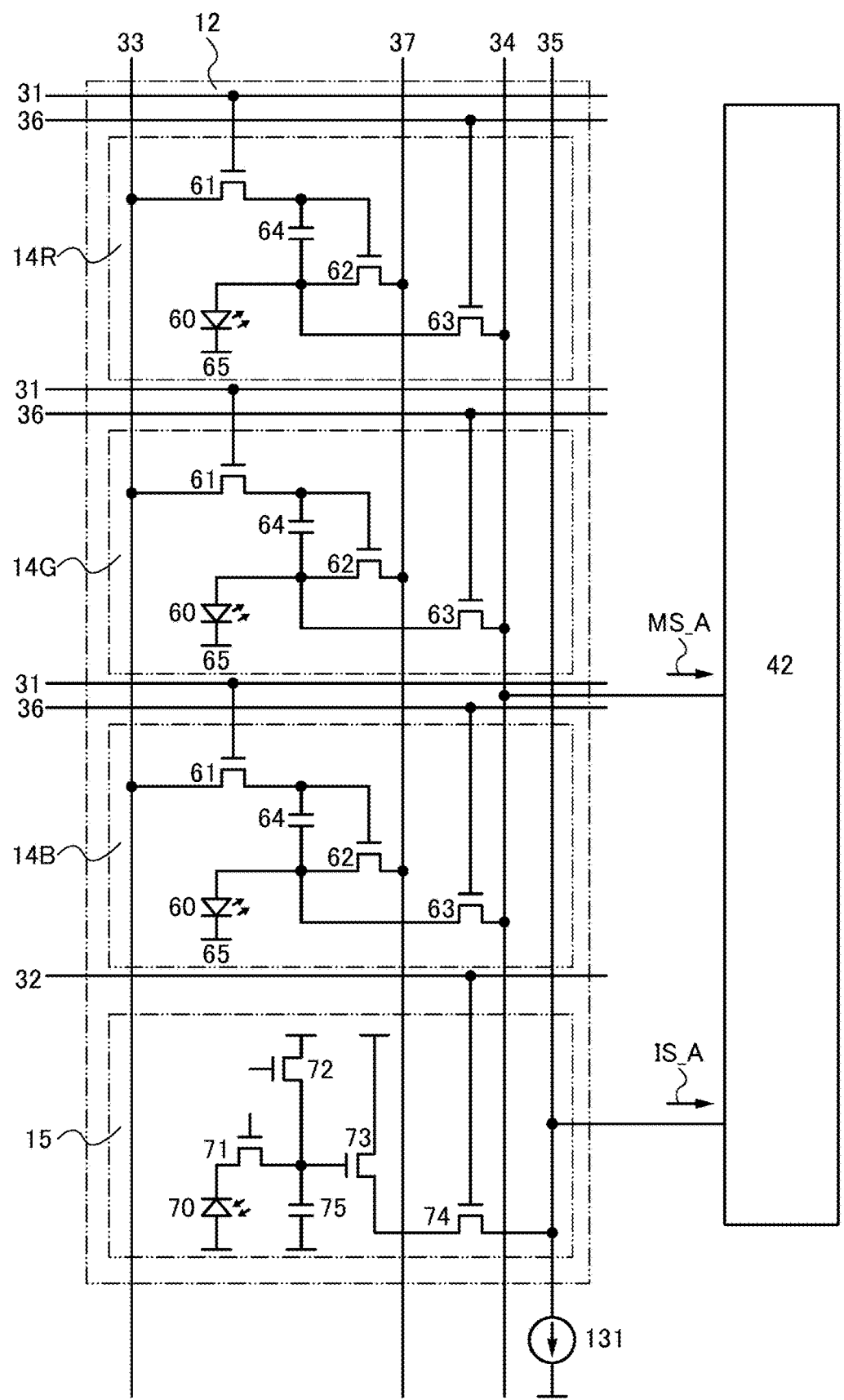
FIG. 8 is a circuit diagram illustrating a pixel configuration example.

FIG. 8 is a circuit diagram illustrating a configuration example of the pixel 12. FIG. 8 also illustrates the electrical connection relation between the pixel 12 and the A/D converter circuit 42, and the like. In the configuration example illustrated in FIG. 8, the pixel 12 includes the pixel circuit 14R, the pixel circuit 14G, the pixel circuit 14B, and the pixel circuit 15.

In FIG. 8, all transistors are n-channel transistors; however, when the magnitude relation of the potentials is reversed as appropriate, for example, some or all transistors may be p-channel transistors. The same applies to circuit diagrams other than FIG. 8.

The pixel circuits 14 (the pixel circuit 14R, the pixel circuit 14G, and the pixel circuit 14B in FIG. 8) each include a light-emitting device 60, a transistor 61, a transistor 62, a transistor 63, and a capacitor 64.

As the light-emitting device 60, an EL device such as an OLED (Organic Light Emitting Diode) or a QLED (Quantum-dot Light Emitting Diode) is preferably used. As a light-emitting substance contained in the EL device, a substance that emits fluorescent light (a fluorescent material), a substance that emits phosphorescent light (a phosphorescent material), an inorganic compound (such as a quantum-dot material), a substance that exhibits thermally activated delayed fluorescence (a Thermally Activated Delayed Fluorescence (TADF) material), or the like can be given. An LED such as a micro-LED (Light Emitting Diode) can be used as the light-emitting device.

In the case where a color filter method is employed for the display device 10, the light-emitting device 60 included in the pixel circuit 14R, the light-emitting device 60 included in the pixel circuit 14G, and the light-emitting device 60 included in the pixel circuit 14B can be all light-emitting devices that emit white light. In the case where a side-by-side patterning method is employed for the display device 10, the light-emitting device 60 included in the pixel circuit 14R can be a light-emitting device that emits red light, the light-emitting device 60 included in the pixel circuit 14G can be a light-emitting device that emits green light, and the light-emitting device 60 included in the pixel circuit 14B can be a light-emitting device that emits blue light.

One electrode of the light-emitting device 60 is electrically connected to one of a source and a drain of the transistor 62. The one of the source and the drain of the transistor 62 is electrically connected to one of a source and a drain of the transistor 63. The one of the source and the drain of the transistor 63 is electrically connected to one electrode of the capacitor 64. One of a source and a drain of the transistor 61 is electrically connected to a gate of the transistor 62. The gate of the transistor 62 is electrically connected to the other electrode of the capacitor 64.

The other electrode of the light-emitting device 60 is electrically connected to a wiring 65. A gate of the transistor 61 is electrically connected to the wiring 31. The other of the source and the drain of the transistor 61 is electrically connected to the wiring 33. The other of the source and the drain of the transistor 62 is electrically connected to a wiring 37. A gate of the transistor 63 is electrically connected to the wiring 36. The other of the source and the drain of the transistor 63 is electrically connected to the wiring 34. The wiring 34 is electrically connected to the A/D converter circuit 42.

As described above, the wiring 31 has a function of a scan line, the wiring 33 has a function of a data line, and the wiring 34 has a function of a monitor line. The wiring 37 and the wiring 65 have a function of a power supply line. For example, in the case where the one of the source and the drain of the transistor 62 is electrically connected to an anode of the light-emitting device 60, the wiring 37 can be set at a high potential and the wiring 65 can be set at a low potential.

When the gate driver circuit 13 outputs the first scan signal to the wiring 31, the potential of the wiring 31 to which the first scan signal is output becomes a high potential. Thus, the transistor 61 electrically connected to the wiring 31 to which the first scan signal is output is turned on, so that the image data output to the wiring 33 from the data driver circuit 23 is written to the pixel circuit 14. Specifically, the potential of the gate of the transistor 62 becomes a potential corresponding to the image data. Accordingly, a current whose amount corresponds to the potential of the gate of the transistor 62 flows between the drain and the source of the transistor 62 and through the light-emitting device 60. Thus, the light-emitting device 60 emits light with luminance corresponding to the potential of the gate of the transistor 62, which enables an image to be displayed on the display portion 11.

As described above, it can be said that the transistor 62 has a function of controlling a current flowing through the light-emitting device 60 in accordance with the image data written to the pixel circuit 14. Therefore, it can be said that the transistor 62 has a function of controlling the driving of the light-emitting device 60. Thus, the transistor 62 can be regarded as a driving transistor.

In the case where the threshold voltage of the transistor 62 varies between the pixel circuits 14, display unevenness or the like might occur. Thus, the threshold voltage or the like of the transistor 62 is corrected, whereby display unevenness can be reduced. The threshold voltage of the transistor 62 can be calculated by measuring a current flowing between the drain and the source of the transistor 62. In the pixel circuit 14 having the configuration illustrated in FIG. 8, the transistor 63 is turned on, so that the analog monitor signal MS_A representing a current flowing between the drain and the source of the transistor 62 is output to the A/D converter circuit 42 through the wiring 34.

The pixel circuit 15 includes a light-receiving device 70, a transistor 71, a transistor 72, a transistor 73, a transistor 74, and a capacitor 75. The capacitor 75 does not need to be provided in the case where the gate capacitance or the like of the transistor 73 is sufficiently large.

As the light-receiving device, a pn photodiode or a pin photodiode can be used, for example. The light-receiving device has a function of a photoelectric conversion device that senses light incident on the light-receiving device and generates electric charge. The amount of electric charge generated from the light-receiving device depends on the amount of light incident on the light-receiving device.

It is particularly preferable to use an organic photodiode including a layer containing an organic compound as the light-receiving device. An organic photodiode, which is easily made thin, lightweight, and large in area and has a high degree of freedom for shape and design, can be used in a variety of display devices.

In one embodiment of the present invention, organic EL devices can be used as the light-emitting devices, and organic photodiodes can be used as the light-receiving devices, for example. A large number of layers of the organic photodiode can be shared with the organic EL device. Accordingly, the light-receiving devices can be incorporated into the display device 10 without a significant increase in the number of manufacturing steps. For example, an active layer of the light-receiving device and a light-emitting layer of the light-emitting device are separately formed, and the other layers can be shared by the light-emitting device and the light-receiving device.

One electrode of the light-receiving device 70 is electrically connected to one of a source and a drain of the transistor 71. The other of the source and the drain of the transistor 71 is electrically connected to one of a source and a drain of the transistor 72. The one of the source and the drain of the transistor 72 is electrically connected to a gate of the transistor 73. The gate of the transistor 73 is electrically connected to one electrode of the capacitor 75. One of a source and a drain of the transistor 73 is electrically connected to one of a source and a drain of the transistor 74. The other of the source and the drain of the transistor 74 is electrically connected to the wiring 35. A gate of the transistor 74 is electrically connected to the wiring 32.

The wiring 35 is electrically connected to the A/D converter circuit 42 and a current source 131. The current source 131 can be a transistor driven in a saturation region, for example. In the case where a transistor is used as the current source 131, the transistor can be regarded as a bias transistor, and the potential of a gate of the transistor can be regarded as a bias potential.

When the transistor 71 is turned on, the potential of the gate of the transistor 73 becomes a potential corresponding to the illuminance of light emitted to the light-receiving device 70. Thus, the pixel circuit 15 can acquire imaging data. After that, when the row driver circuit 19 outputs the second scan signal to the wiring 32, the potential of the wiring 32 to which the second scan signal is output becomes a high potential. Thus, the transistor 74 electrically connected to the wiring 32 to which the second scan signal is output is turned on, so that the potential of the wiring 35 becomes a potential corresponding to the potential of the gate of the transistor 73. As a result, the imaging data acquired by the pixel circuit 15 is supplied as the analog imaging signal IS_A to the A/D converter circuit 42 through the wiring 35.

Figure 9:
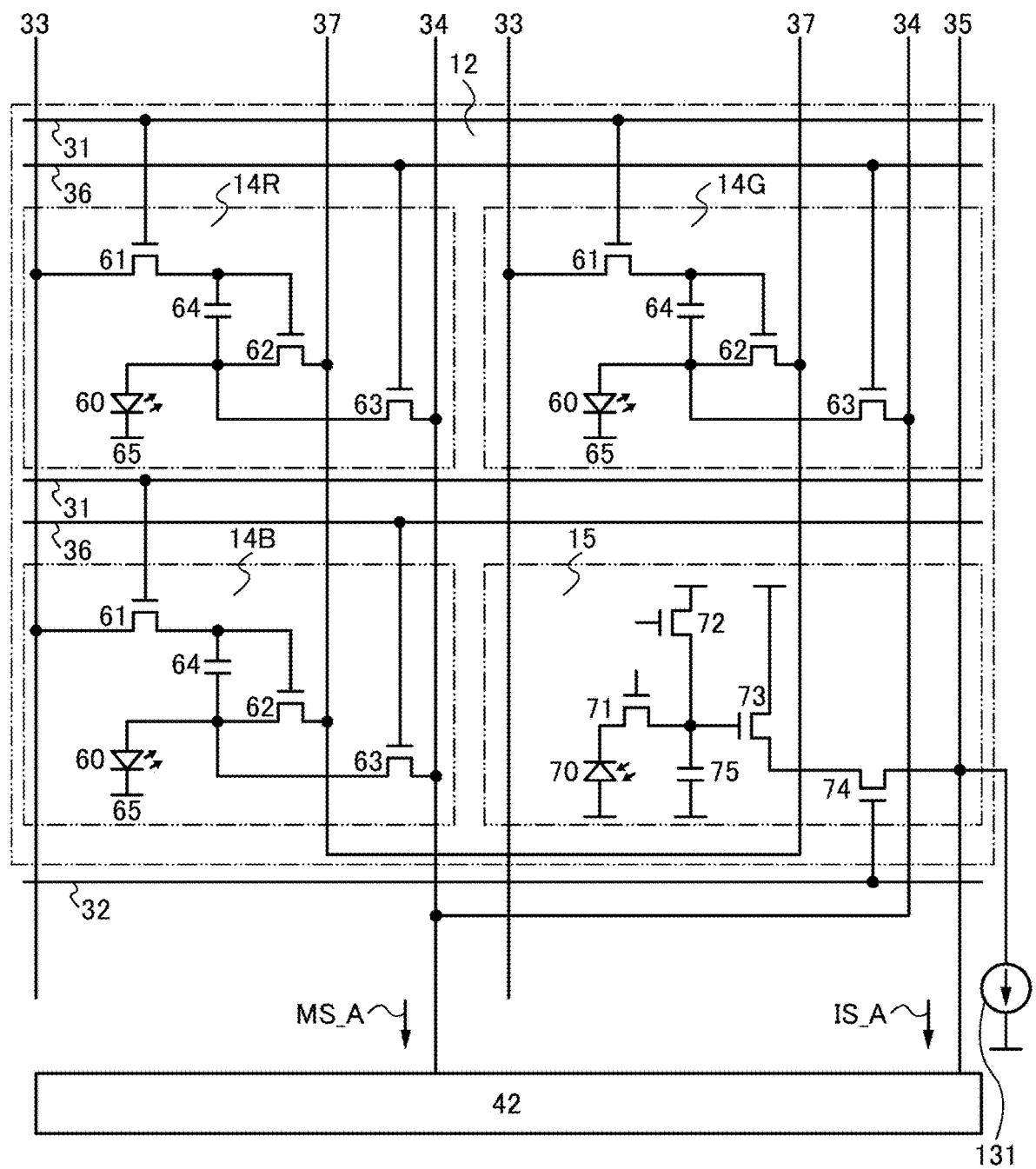
FIG. 9 is a circuit diagram illustrating a pixel configuration example.

In the pixel 12 having the configuration illustrated in FIG. 8, the pixel circuit 14R, the pixel circuit 14G, the pixel circuit 14B, and the pixel circuit 15 are provided in one column; however, one embodiment of the present invention is not limited thereto. For example, the pixel circuit 14R, the pixel circuit 14G, the pixel circuit 14B, and the pixel circuit 15 may be provided in two rows and two columns. FIG. 9 illustrates a configuration example of the pixel 12 where the pixel circuit 14R is positioned in the first row and the first column, the pixel circuit 14G is positioned in the first row and the second column, the pixel circuit 14B is positioned in the second row and the first column, and the pixel circuit 15 is positioned in the second row and the second column.

Figure 10:
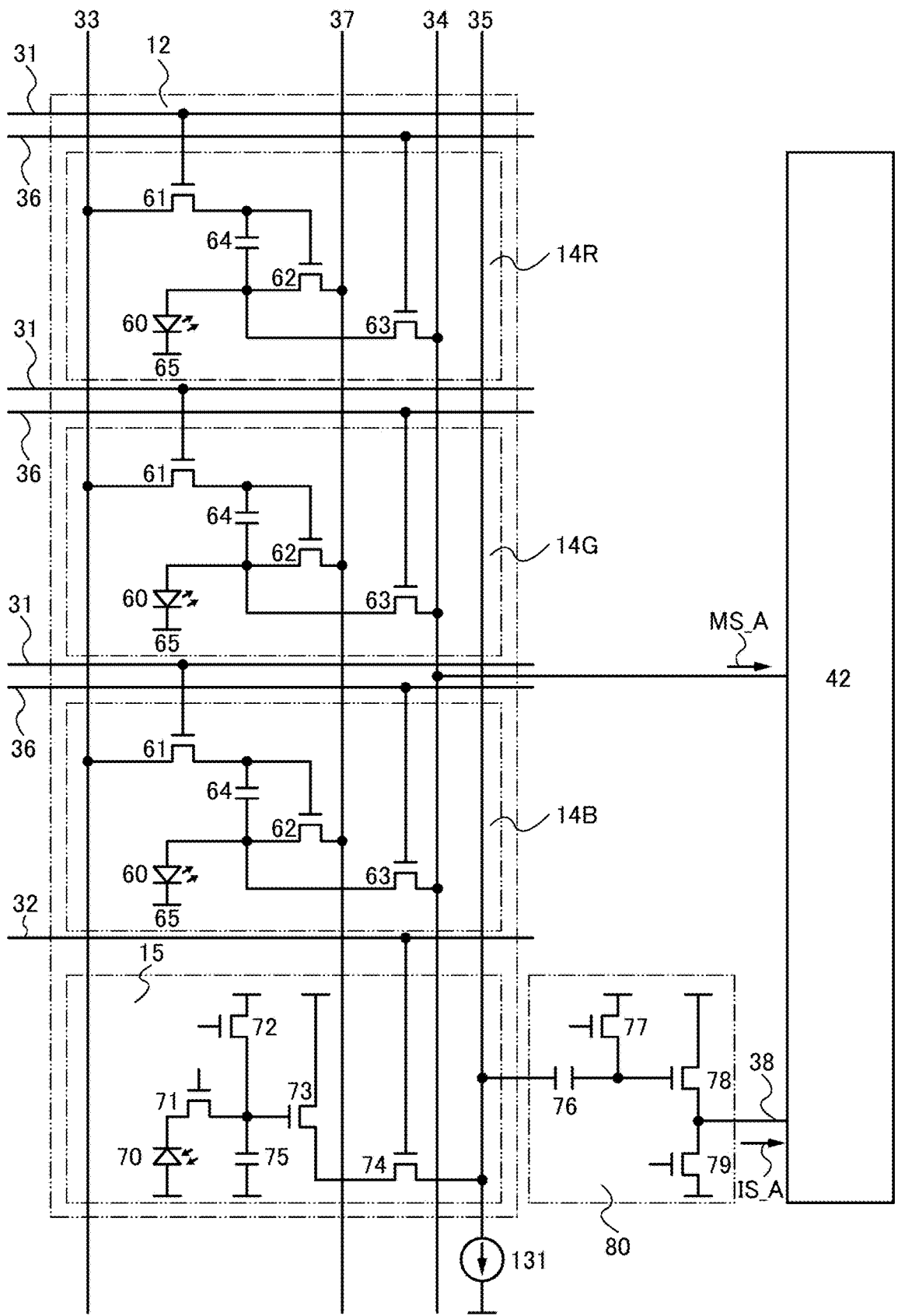
FIG. 10 is a circuit diagram illustrating a pixel configuration example.

FIG. 10 is a modification example of the configuration illustrated in FIG. 8 and is different from the configuration illustrated in FIG. 8 in that a CDS circuit 80 is provided. The CDS circuit 80 includes a capacitor 76, a transistor 77, a transistor 78, and a transistor 79.

One electrode of the capacitor 76 is electrically connected to the wiring 35. The other electrode of the capacitor 76 is electrically connected to one of a source and a drain of the transistor 77. The one of the source and the drain of the transistor 77 is electrically connected to a gate of the transistor 78. One of a source and a drain of the transistor 78 is electrically connected to one of a source and a drain of the transistor 79. The one of the source and the drain of the transistor 79 is electrically connected to a wiring 38. The wiring 38 is electrically connected to the A/D converter circuit 42.

Providing the CDS circuit 80 between the pixel circuit 15 and the A/D converter circuit 42 enables correlated double sampling (CDS) on the imaging data acquired by the pixel circuit 15. Here, correlated double sampling on the imaging data acquired by the pixel circuit 15 refers to extraction of a difference between the potential of the wiring 35 when the imaging data written to the pixel circuit 15 is read out and the potential of the wiring 35 when the imaging data written to the pixel circuit 15 is reset. Through correlated double sampling, noise of the analog imaging signal IS_A supplied to the A/D converter circuit 42 can be reduced.

Figure 11A:
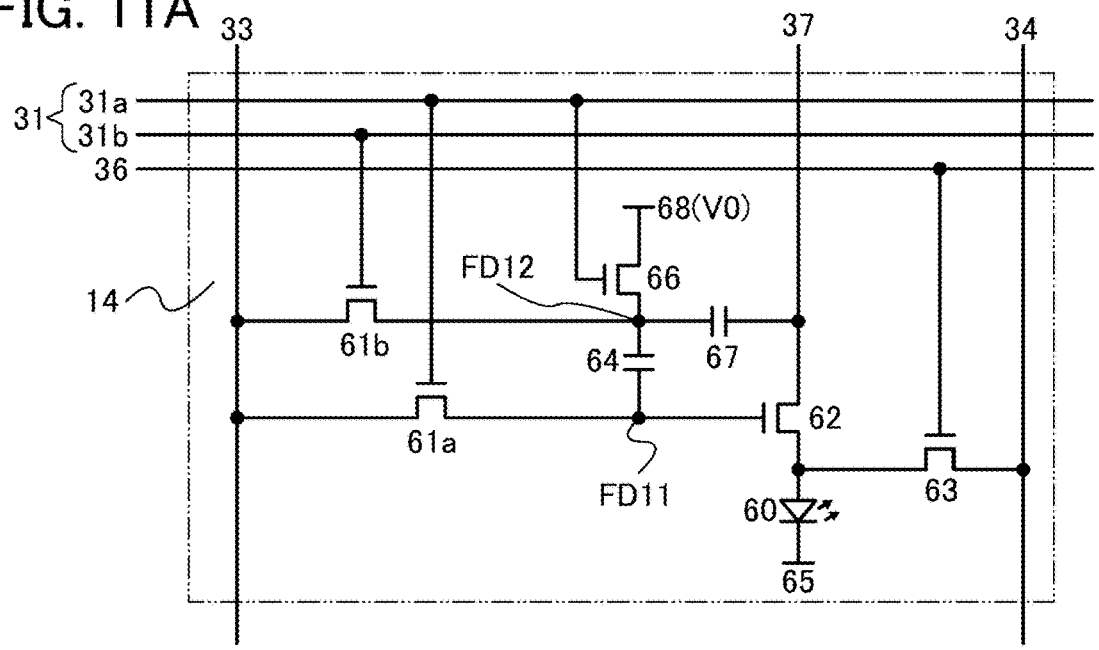
FIG. 11A is a circuit diagram illustrating a pixel configuration example.

FIG. 11A is a configuration example of the pixel circuit 14 and is a modification example of the configurations of the pixel circuits 14 illustrated in FIG. 8 to FIG. 10. The pixel circuit 14 having the configuration illustrated in FIG. 11A includes the light-emitting device 60, a transistor 61a, a transistor 61b, the transistor 62, the transistor 63, a transistor 66, the capacitor 64, and a capacitor 67. The pixel circuit 14 having the configuration illustrated in FIG. 11A is electrically connected to a wiring 31a and a wiring 31b as the wiring 31.

The one electrode of the light-emitting device 60 is electrically connected to the one of the source and the drain of the transistor 62. The one of the source and the drain of the transistor 62 is electrically connected to the one of the source and the drain of the transistor 63. The gate of the transistor 62 is electrically connected to one of a source and a drain of the transistor 61a. The one of the source and the drain of the transistor 61a is electrically connected to the one electrode of the capacitor 64. The other electrode of the capacitor 64 is electrically connected to one of a source and a drain of the transistor 61b. The one of the source and the drain of the transistor 61b is electrically connected to one of a source and a drain of the transistor 66. The one of the source and the drain of the transistor 66 is electrically connected to one electrode of the capacitor 67.

The other electrode of the light-emitting device 60 is electrically connected to the wiring 65. A gate of the transistor 61a and a gate of the transistor 66 are electrically connected to the wiring 31a. A gate of the transistor 61b is electrically connected to the wiring 31b. The other of the source and the drain of the transistor 61a and the other of the source and the drain of the transistor 61b are electrically connected to the wiring 33. The other of the source and the drain of the transistor 62 and the other electrode of the capacitor 67 are electrically connected to the wiring 37. The gate of the transistor 63 is electrically connected to the wiring 36. The other of the source and the drain of the transistor 63 is electrically connected to the wiring 34. The other of the source and the drain of the transistor 66 is electrically connected to a wiring 68.

Here, a node where the one of the source and the drain of the transistor 61a, the gate of the transistor 62, and the one electrode of the capacitor 64 are electrically connected is referred to as a node FD11. A node where the one of the source and the drain of the transistor 61b, the other electrode of the capacitor 64, the one of the source and the drain of the transistor 66, and one electrode of the capacitor 67 are electrically connected is referred to as a node FD12.

The wiring 68 has a function of a power supply line. The potential of the wiring 68 is set to a potential V0.

In the pixel circuit 14 having the configuration illustrated in FIG. 11A, by turning off the transistor 61a, the potential of the node FD11 can be held. By turning off the transistor 61b and the transistor 66, the potential of the node FD12 can be held. When the potential of the node FD12 is changed by turning off the transistor 61a, capacitive coupling through the capacitor 64 can change the potential of the node FD11.

Here, a transistor with a low off-state current is preferably used as the transistor 61a, in which case the potential of the node FD11 can be held for a long time. Transistors with a low off-state current are preferably used as the transistor 61b and the transistor 66, in which case the potential of the node FD12 can be held for a long time. Examples of a transistor with a low off-state current include a transistor using a metal oxide in a channel formation region (hereinafter referred to as an OS transistor).

The channel formation region of an OS transistor preferably includes a metal oxide. The metal oxide used for the OS transistor is preferably an oxide that contains at least one of indium (In) and zinc (Zn).

Examples of such oxides include an In-M-Zn oxide, an In-M oxide, a Zn-M oxide, and an In—Zn oxide (the element M is one or more selected from aluminum (Al), gallium (Ga), yttrium (Y), tin (Sn), boron (B), silicon (Si), titanium (Ti), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), and tungsten (W), for example). Typical examples of an In-M-Zn oxide include an In—Ga—Zn oxide, an In—Sn—Zn oxide, and an In—Ga—Sn—Zn oxide.

The off-state current per channel width of 1 μm of an OS transistor can be as low as approximately 1 yA/μm (y: yocto, $10^{-24}$) to 1 zA/μm (z: zepto, $10^{-21}$).

A CAC (Cloud-Aligned Composite)-OS is preferably used for the OS transistor. The details of a CAC-OS will be described in a subsequent embodiment.

OS transistors may be used as the transistor 62 and the transistor 63 as well as the transistor 61a, the transistor 61b, and the transistor 66. That is, OS transistors may be used as all the transistors included in the pixel circuit 14. In that case, all the transistors included in the pixel circuit 14 can be formed in the same process. Furthermore, OS transistors may be used as the transistor 71 to the transistor 74 included in the pixel circuit 15 as well as the transistor 61a, the transistor 61b, the transistor 62, the transistor 63, and the transistor 66. That is, OS transistors may be used as not only the transistors included in the pixel circuit 14 but also the transistors included in the pixel circuit 15.

Transistors in which silicon is used in a channel formation region (hereinafter referred to as Si transistors), or the like may be used as the transistor 61a, the transistor 61b, and the transistor 66. In addition, a Si transistor may be used as the transistor 62 or the transistor 63. Furthermore, Si transistors may be used as the transistor 71 to the transistor 74 included in the pixel circuit 15. Examples of silicon include amorphous silicon and crystalline silicon (e.g., low-temperature polysilicon and single crystal silicon).

When all the transistors included in the pixel 12 are transistors of the same kind, the transistors included in the pixel 12 can be formed in the same process. This can reduce the number of manufacturing steps for the display device 10, making the display device 10 inexpensive.

Transistors with a low off-state current other than an OS transistor may be used as the transistor 61a, the transistor 61b, and the transistor 66. For example, a transistor using a wide-bandgap semiconductor may be used. In some cases, a wide-bandgap semiconductor refers to a semiconductor with a bandgap of 2.2 eV or more. Examples include silicon carbide, gallium nitride, and diamond.

Figure 11B:
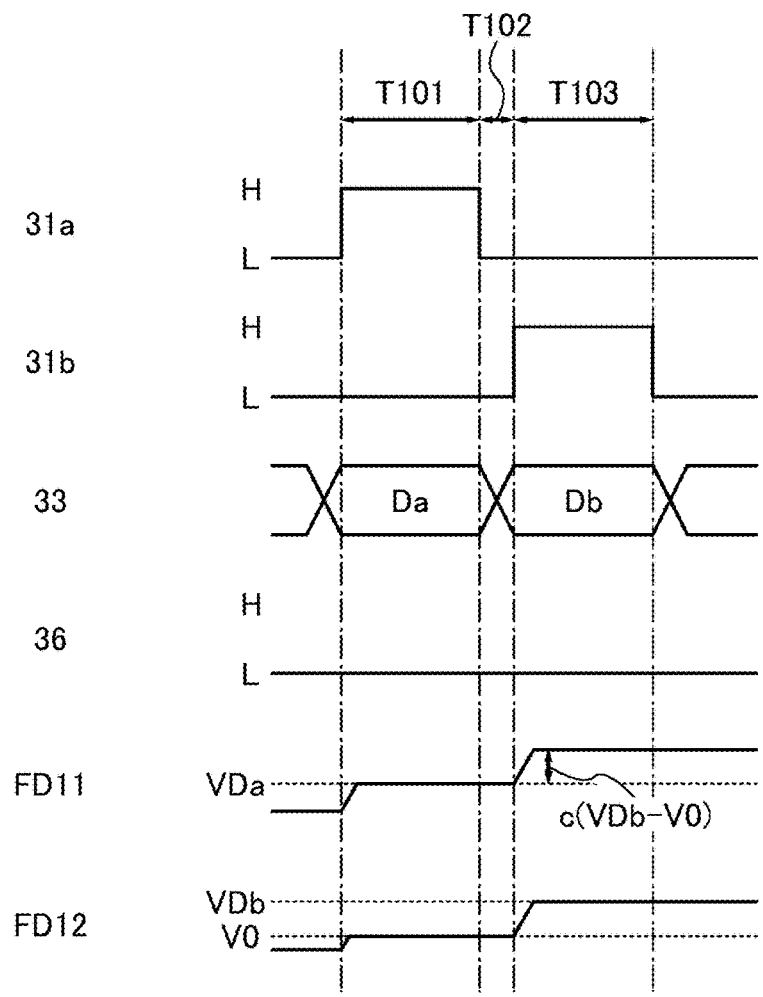
FIG. 11B is a timing chart showing an example of a driving method for a pixel.

FIG. 11B is a timing chart showing an example of a driving method for the pixel circuit 14 having the configuration illustrated in FIG. 11A. In the driving method shown in FIG. 11B, one frame period is divided into a period T101, a period T102, and a period T103. The period T101 is a period in which a potential VDa corresponding to data Da is supplied to the node FD11, and the period T103 is a period in which a potential VDb corresponding to data db is supplied to the node FD12. In the period T101 to the period T103, the potential of the wiring 36 is set to a low potential so that the transistor 63 is turned off. Thus, the entry of a current flowing between the drain and the source of the transistor 62, which is a driving transistor, into the wiring 34 through the transistor 63 can be inhibited, so that a current flowing between the drain and the source of the transistor 62 can efficiently flow to the light-emitting device 60.

In the period T101, the potential of the wiring 31a is set to a high potential, so that the transistor 61a and the transistor 66 are turned on. In addition, the data Da is supplied to the pixel circuit 14 through the wiring 33. When the transistor 66 is turned on, the potential of the node FD12 becomes the potential V0. Accordingly, the potential of the node FD12 can be reset. In addition, the transistor 61a is turned on to supply the data Da to the pixel circuit 14, so that the potential of the node FD11 becomes the potential VDa. Thus, the data Da is written to the pixel circuit 14.

In the period T102, the potential of the wiring 31a is set to a low potential, so that the transistor 61a and the transistor 66 are turned off. Accordingly, the supply of the potential VDa to the node FD11 and the supply of the potential V0 to the node FD12 are terminated.

In the period T103, the potential of the wiring 31b is set to a high potential, so that the transistor 61b is turned on. The data db is supplied to the pixel circuit 14 through the wiring 33. Thus, the potential of the node FD12 becomes the potential VDb. Accordingly, the potential of the node FD12 is changed by a potential "VDb−V0". Thus, the data db is written to the pixel circuit 14.

Capacitive coupling by the capacitor 64 changes the potential of the node FD11 in accordance with a change in the potential of the node FD12. Specifically, given that the capacitive coupling coefficient of the node FD11 is c (c is a real number of 0 or more and 1 or less), the potential of the node FD11 is changed by a potential "c(VDb−V0)". Here, the potential of the node FD11 in the period T102 is the potential VDa. Thus, in the period T103, the potential of the node FD11 becomes a potential "VDa+c(VDb−V0)". Although the potential VDb is shown to be higher than the potential V0 in FIG. 11B, the potential VDb may be lower than the potential V0.

The capacitive coupling coefficient c is determined substantially by the capacitance value of the capacitor 64 and the capacitance value of the parasitic capacitance of the node FD11 such as the gate capacitance of the transistor 62. When the capacitance value of the capacitor 64 is larger than the parasitic capacitance of the node FD11, the value of c increases to be closer to 1 and thus the potential of the node FD11 in the period T103 becomes closer to a potential "VDa+VDb−V0".

Thus, the pixel circuit 14 having the configuration illustrated FIG. 11A can combine two kinds of data. Accordingly, an image displayed on the display portion 11 with the use of the pixel circuit 14 can be corrected inside the pixel circuit 14. For example, one of the data Da and the data db can be image data, and the other can be correction data. For example, the data Da can be correction data, and the data db can be image data. In the case where the data Da is correction data, the data db is image data, and a transistor with a low off-state current such as an OS transistor is used as the transistor 61*a*, the pixel circuit 14 can retain the correction data for a long time. Therefore, correction data does not need to be written to the pixel circuit 14 in each frame, resulting in a reduction in the frequency of writing correction data to the pixel circuit 14. Accordingly, the power consumption of the display device 10 can be reduced.

Both the data Da and the data db may be image data. In that case, an image in which two images are superimposed on each other can be displayed on the display portion 11. The level of the potential VDa corresponding to the data Da and the level of the potential VDb corresponding to the data db are limited by the withstand voltage of the data driver circuit 23, for example. Thus, the data Da and the data db are superimposed on each other, whereby the potential of the node FD11 can be made higher than the maximum potential that can be output from the data driver circuit 23. For example, when the capacitive coupling coefficient c of the node FD11 is 1, the maximum value of the potential of the node FD11 can be twice the maximum potential that can be output from the data driver circuit 23. Thus, a potential higher than the maximum potential that can be output from the data driver circuit 23 can be applied to the gate of the transistor 62, which is a driving transistor, resulting in an increase in the amount of current supplied to the light-emitting device 60. Therefore, the emission luminance of the light-emitting device 60 can be increased, so that a high-luminance image can be displayed on the display portion 11. Furthermore, a dynamic range, which is a difference between the maximum value and the minimum value of the emission luminance of the light-emitting device 60, when an image is displayed on the display portion 11 can be widened. An image corresponding to the data Da and an image corresponding to the data db may be the same or different from each other. As described above, in the case where a transistor with a low off-state current such as an OS transistor is used as the transistor 61*a*, the data Da does not need to be written to the pixel circuit 14 in each frame, so that the frequency of writing the data Da to the pixel circuit 14 can be made lower than the frequency of writing the data db to the pixel circuit 14.

Increasing the emission luminance of the light-emitting device 60 can increase the luminance of the light 16 illustrated in FIG. 3A to FIG. 3C. Accordingly, the luminance of the light 17, which is light reflected by an object such as the finger 122 or the eyes 123 and emitted to the pixel circuit 15, can be increased. Thus, the sensitivity of sensing an object by the pixel circuit 15 can be increased.

Configuration Example 1 of A/D Converter Circuit

Figure 12A:
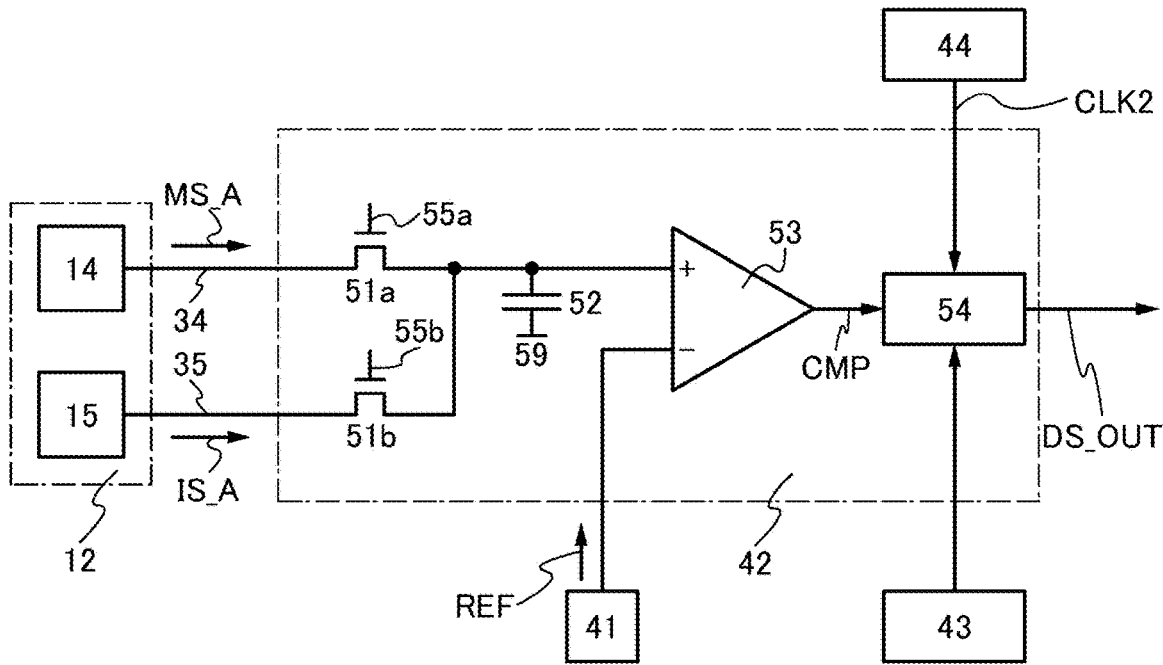
FIG. 12A and FIG. 12B are circuit diagrams illustrating configuration examples of display devices.

FIG. 12A is a circuit diagram illustrating a configuration example of the A/D converter circuit 42. In FIG. 12A, the electrical connection relation between the A/D converter circuit 42 and each of the pixel circuit 14 and the pixel circuit 15, and the like are also illustrated.

The A/D converter circuit 42 includes a transistor 51*a*, a transistor 51*b*, a capacitor 52, a comparator circuit 53, and a counter circuit 54. Note that the capacitor 52 does not need to be provided.

One of a source and a drain of the transistor 51*a* is electrically connected to the pixel circuit 14 through the wiring 34. A gate of the transistor 51*a* is electrically connected to a wiring 55*a*. One of a source and a drain of the transistor 51*b* is electrically connected to pixel circuit 15 through the wiring 35. A gate of the transistor 51*b* is electrically connected to a wiring 55*b*. In the case where the CDS circuit 80 is provided as illustrated in FIG. 10, one of a source and a drain of the transistor 51*b* is electrically connected to the CDS circuit 80 through the wiring 38.

The other of the source and the drain of the transistor 51*a* is electrically connected to the other of the source and the drain of the transistor 51*b*. The other of the source and the drain of the transistor 51*b* is electrically connected to one electrode of the capacitor 52. The other electrode of the capacitor 52 is electrically connected to a wiring 59. The one electrode of the capacitor 52 is electrically connected to a first input terminal of the comparator circuit 53. A second input terminal of the comparator circuit 53 is electrically connected to the reference signal generation circuit 41. An output terminal of the comparator circuit 53 is electrically connected to the counter circuit 54.

In this specification and the like, the first input terminal of the comparator circuit refers to one of a non-inverting input terminal and an inverting input terminal of the comparator circuit, and the second input terminal of the comparator circuit refers to the other of the non-inverting input terminal and the inverting input terminal of the comparator circuit. Although the following description will be given assuming that the first input terminal of the comparator circuit 53 is a non-inverting input terminal and the second input terminal of the comparator circuit 53 is an inverting input terminal, the magnitude relation of the potentials may be appropriately reversed as follows, for example: the first input terminal may be an inverting input terminal, and the second input terminal may be a non-inverting input terminal.

The wiring 59 has a function of a power supply line. For example, the potential of the wiring 59 can be a low potential.

The transistor 51*a* and the transistor 51*b* have a function of a switch for selecting a signal for A/D conversion. For example, when the potential of the wiring 55*a* is set to a high potential and the potential of the wiring 55*b* is set to a low potential, the transistor 51*a* is turned on and the transistor 51*b* is turned off. In that case, the A/D converter circuit 42 can perform A/D conversion on the analog monitor signal MS_A output to the wiring 34 from the pixel circuit 14 and can output the analog monitor signal MS_A on which A/D conversion has been performed, as the data signal DS_OUT, which is a digital signal. When the potential of the wiring 55*a* is set to a low potential and the potential of the wiring 55*b* is set to a high potential, the transistor 51*a* is turned off and the transistor 51*b* is turned on. In that case, the A/D converter circuit 42 can perform A/D conversion on the analog imaging signal IS_A output to the wiring 35 from the pixel circuit 15 and can output the analog imaging signal IS_A on which A/D conversion has been performed, as the data signal DS_OUT, which is a digital signal.

Since the transistor 51*a* and the transistor 51*b* are provided, the analog monitor signal MS_A output from the pixel circuit 14 and the analog imaging signal IS_A output from the pixel circuit 15 can be converted into digital signals with the use of the same A/D converter circuit.

The comparator circuit 53 has a function of comparing the potential of the non-inverting input terminal and the potential of the inverting input terminal and outputting a comparison signal CMP from the output terminal. Specifically, when the potential of the non-inverting input terminal is higher than the potential of the inverting input terminal, the potential of the comparison signal CMP is a high potential. In contrast, in the case where the potential of the non-inverting input terminal is lower than the potential of the inverting input terminal, the potential of the comparison signal CMP is a low potential.

The counter circuit 54 has a function of outputting the data signal DS_OUT, which is a digital signal, in response to the comparison signal CMP, a signal supplied from the shift register circuit 43, and the clock signal CLK2. For example, the counter circuit 54 has a function of counting the number of rises of the clock signal CLK2 when the comparison signal CMP has a low potential and suspending the counting when the comparison signal CMP has a high potential. The counter circuit 54 may have a function of counting the number of falls of the clock signal CLK2. The counter circuit 54 may have a function of counting the number of rises and the number of falls of the clock signal CLK2. The counter circuit 54 may have a function of counting the number of rises or the number of falls of the clock signal CLK2 when the comparison signal CMP has a high potential and suspending the counting when the comparison signal CMP has a low potential.

Figure 12B:
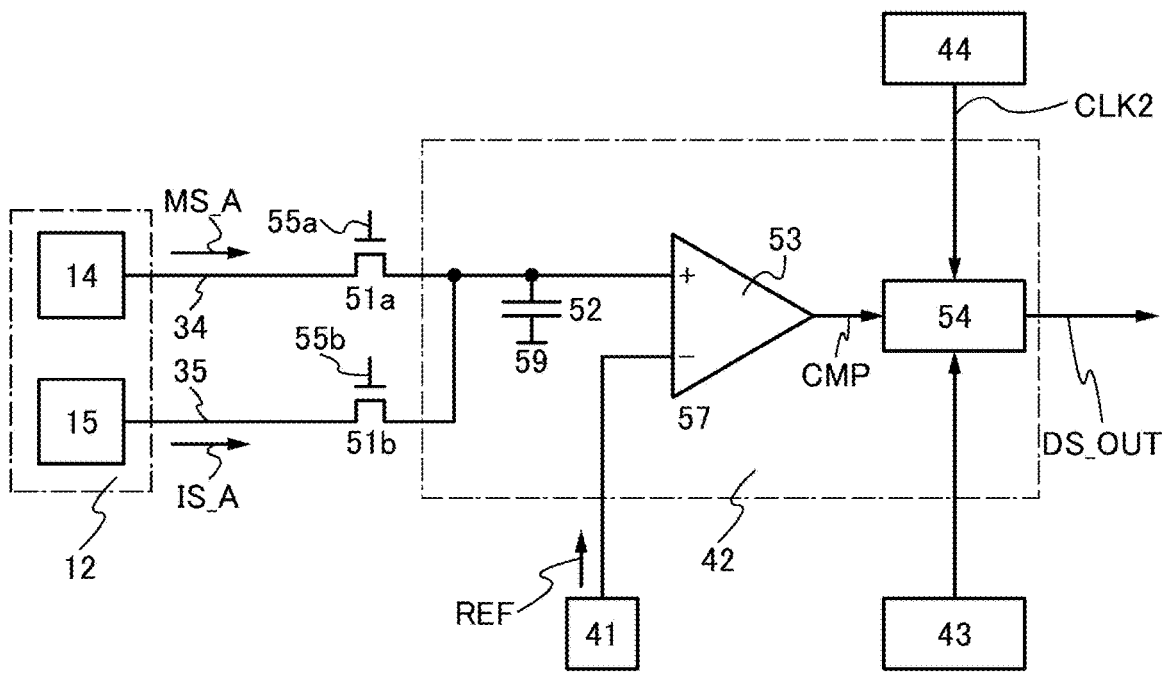

Although the transistor 51*a* and the transistor 51*b* are provided in the A/D converter circuit 42 in FIG. 12A, the transistor 51*a* and the transistor 51*b* may be provided outside the A/D converter circuit 42 as illustrated in FIG. 12B. For example, the transistor 51*a* and the transistor 51*b* may be provided outside the IC 20.

Example 1 of Driving Method for A/D Converter Circuit

Figure 13:
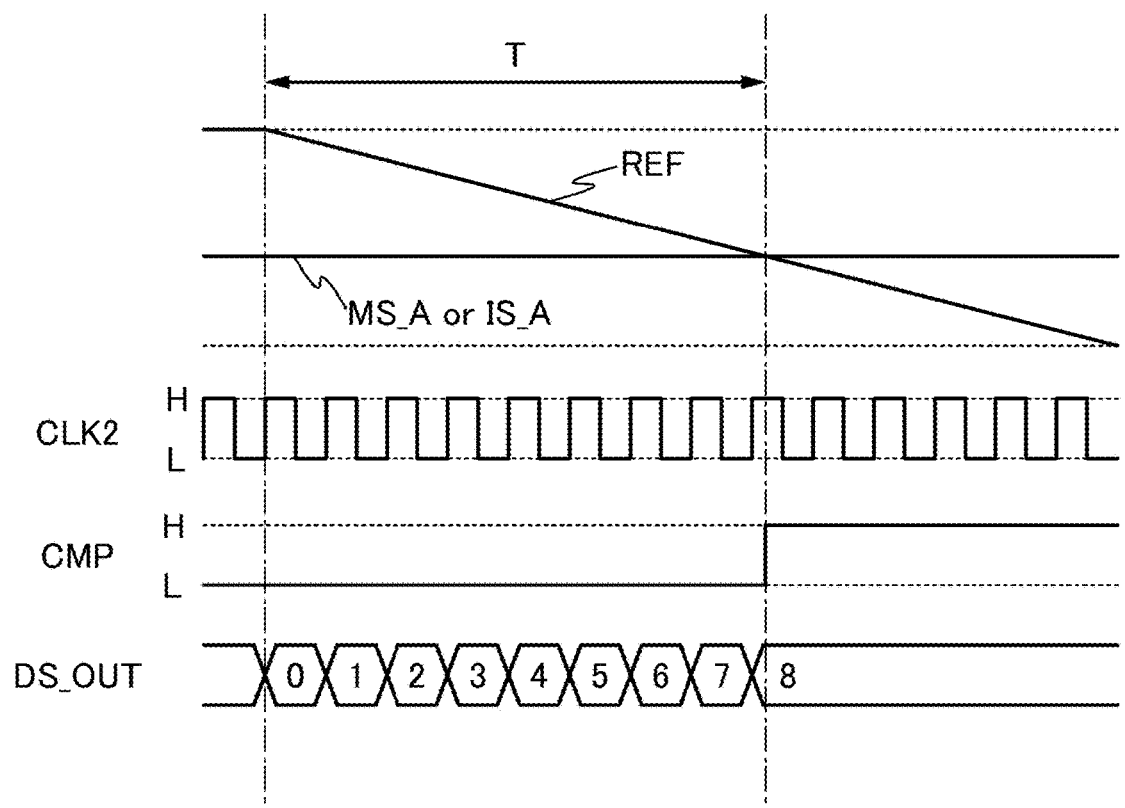
FIG. 13 is a timing chart showing an example of a driving method for a display device.

FIG. 13 is a timing chart showing an example of a driving method for the A/D converter circuit 42 having the configuration illustrated in FIG. 12A or FIG. 12B.

In a period T, the potential of the reference signal REF is higher than the potential of the analog monitor signal MS_A or the potential of the analog imaging signal IS_A. Thus, the potential of the comparison signal CMP is a low potential.

In the period T, the counter circuit 54 counts the number of rises of the clock signal CLK2. Specifically, the counter circuit 54 outputs the data signal DS_OUT having a digital value corresponding to the number of rises of the clock signal CLK2. FIG. 13 shows the number of rises of the clock signal CLK in the period T from which 1 is subtracted, as the data signal DS_OUT.

In addition, in the period T, the potential of the reference signal REF is continuously decreased. At the point when the potential of the reference signal REF becomes lower than or equal to the potential of the analog monitor signal MS_A or the potential of the analog imaging signal IS_A, the potential of the comparison signal CMP becomes a high potential. At the point when the potential of the comparison signal CMP becomes a high potential, the period T is terminated.

After the termination of the period T, the counter circuit 54 does not count the number of rises of the clock signal CLK2. Thus, after the termination of the period T, the counter circuit 54 keeps outputting the data signal DS_OUT having a digital value corresponding to the number of rises of the clock signal CLK2 from the start to the end of the period T.

In the above manner, the A/D converter circuit 42 can convert the analog monitor signal MS_A or the analog imaging signal IS_A into a digital signal. Specifically, the A/D converter circuit 42 can output the data signal DS_OUT having a digital value corresponding to the potential of the analog monitor signal MS_A or the potential of the analog imaging signal IS_A. When A/D conversion is performed on the analog monitor signal MS_A, the potential of the analog monitor signal MS_A represented by the data signal DS_OUT is converted into a current so that the value of monitor current can be calculated. The value of monitor current can be calculated by a circuit provided in the IC 20, for example. For example, the value of monitor current can be calculated by the interface circuit 21.

Configuration Example 2 of A/D Converter Circuit

Figure 14A:
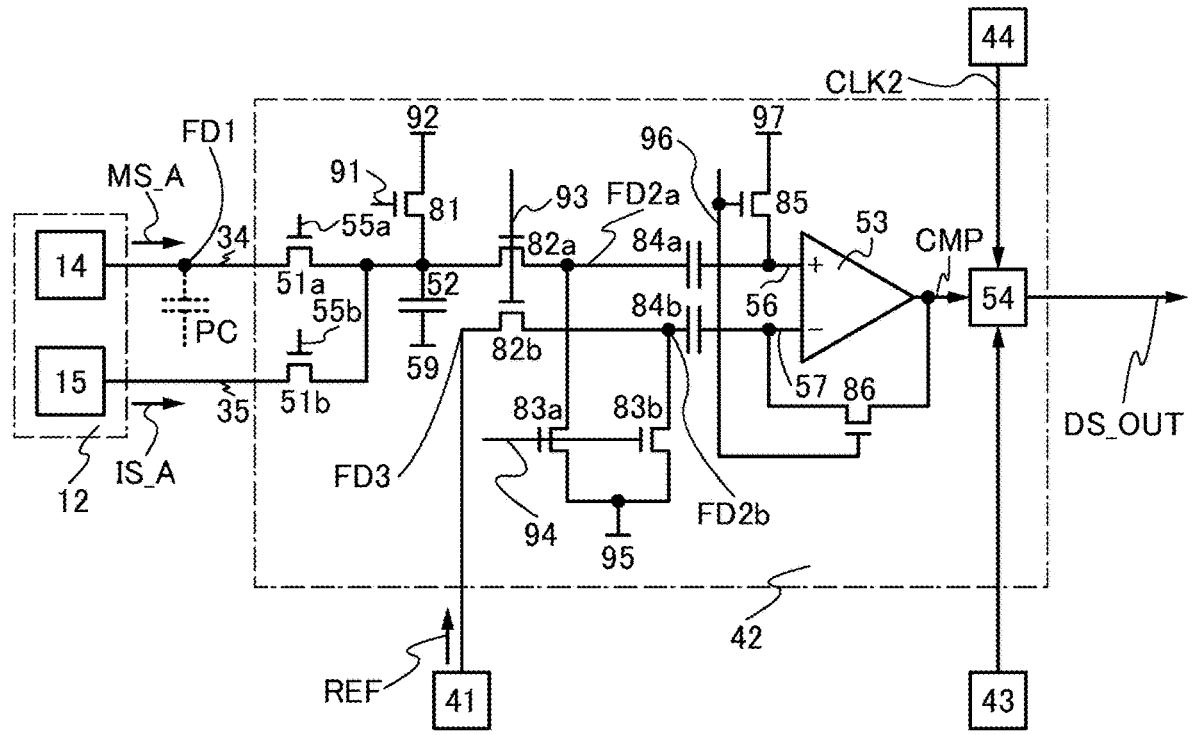
FIG. 14A and FIG. 14B are circuit diagrams illustrating configuration examples of display devices.

FIG. 14A is a circuit diagram illustrating a configuration example of the A/D converter circuit 42, which is a configuration different from that in FIG. 12A. The A/D converter circuit 42 having the configuration illustrated in FIG. 14A includes the transistor 51*a*, the transistor 51*b*, a transistor 81, a transistor 82*a*, a transistor 82*b*, a transistor 83*a*, a transistor 83*b*, a transistor 85, a transistor 86, the capacitor 52, a capacitor 84*a*, a capacitor 84*b*, the comparator circuit 53, and the counter circuit 54. The capacitor 52 does not need to be provided.

The one of the source and the drain of the transistor 51*a* is electrically connected to the pixel circuit 14 through the wiring 34. The one of the source and the drain of the transistor 51*b* is electrically connected to the pixel circuit 15 through the wiring 35. In the case where the CDS circuit 80 is provided as illustrated in FIG. 10, the one of the source and the drain of the transistor 51*b* is electrically connected to the CDS circuit 80 through the wiring 38.

The other of the source and the drain of the transistor 51*a* is electrically connected to the other of the source and the drain of the transistor 51*b*. The other of the source and the drain of the transistor 51*b* is electrically connected to the one electrode of the capacitor 52. The one electrode of the capacitor 52 is electrically connected to one of a source and a drain of the transistor 81. The one of the source and the drain of the transistor 81 is electrically connected to one of a source and a drain of the transistor 82*a*. The other of the source and the drain of the transistor 82*a* is electrically connected to one of a source and a drain of the transistor 83*a*. The one of the source and the drain of the transistor 83*a* is electrically connected to one electrode of the capacitor 84*a*. The other electrode of the capacitor 84*a*, one of a source and a drain of the transistor 85, and the first input terminal of the comparator circuit 53 are electrically connected to a wiring 56.

One of a source and a drain of the transistor 82*b* is electrically connected to the reference signal generation circuit 41. The other of the source and the drain of the transistor 82*b* is electrically connected to one of a source and a drain of the transistor 83*b*. The one of the source and the drain of the transistor 83*b* is electrically connected to one electrode of the capacitor 84*b*. The other electrode of the capacitor 84*b*, the second input terminal of the comparator circuit 53, and one of a source and a drain of the transistor 86 are electrically connected to a wiring 57. The output terminal of the comparator circuit 53 is electrically connected to the counter circuit 54 and the other of the source and the drain of the transistor 86.

The gate of the transistor 51*a* is electrically connected to the wiring 55*a*. The gate of the transistor 51*b* is electrically connected to the wiring 55*b*. The other electrode of the capacitor 52 is electrically connected to the wiring 59. A gate of the transistor 81 is electrically connected to a wiring 91. The other of the source and the drain of the transistor 81 is electrically connected to a wiring 92. A gate of the transistor 82*a* and a gate of the transistor 82*b* are electrically connected to a wiring 93. A gate of the transistor 83*a* and a gate of the transistor 83*b* are electrically connected to a wiring 94. The other of the source and the drain of the transistor 83*a* and the other of the source and the drain of the transistor 83*b* are electrically connected to a wiring 95. A gate of the transistor 85 and a gate of the transistor 86 are electrically connected to a wiring 96. The other of the source and the drain of the transistor 85 is electrically connected to a wiring 97. The wiring 92, the wiring 95, and the wiring 97 as well as the wiring 59 have a function of a power supply line.

A node where the pixel circuit 14 and the one of the source and the drain of the transistor 51*a* are electrically connected is referred to as a node FD1. Here, the parasitic capacitance of the node FD1 is referred to as parasitic capacitance PC.

A node where the other of the source and the drain of the transistor 82*a*, the one of the source and the drain of the transistor 83*a*, and the one electrode of the capacitor 84*a* are electrically connected is referred to as a node FD2*a*. A node where the other of the source and the drain of the transistor 82*b*, the one of the source and the drain of the transistor 83*b*, and the one electrode of the capacitor 84*b* are electrically connected is referred to as a node FD2*b*. A node where the reference signal generation circuit 41 and the one of the source and the drain of the transistor 82*b* are electrically connected is referred to as a node FD3.

In the case where the A/D converter circuit 42 has the configuration illustrated in FIG. 14A, a monitor current I can be calculated by the following formula as will be described in detail later. Here, $C_{FD1}$ denotes the capacitance value of the node FD1 when the transistor 51*a* is in an on state, and $\Delta V_{FD1}/\Delta t$ denotes a change over time in the potential of the node FD1. In the configuration illustrated in FIG. 14A, the capacitance value $C_{FD1}$ can be the total of the capacitance value of the parasitic capacitance PC and the capacitance value of the capacitor 52. As described above, the value of the monitor current can be calculated by a circuit provided in the IC 20, for example. The value of the monitor current can be calculated by the interface circuit 21, for example.

[Formula 1]

$$I = C_{FD1} \frac{\Delta V_{FD1}}{\Delta t} \quad (1)$$

When the capacitance value of the parasitic capacitance PC is small, the capacitance value $C_{FD1}$ of the node FD1 is small and thus $\Delta V_{FD1}/\Delta t$ is large. That is, the potential of the node FD1 is significantly changed in a short time. This makes it impossible to calculate the monitor current I with high accuracy, in some cases. In that case, the capacitance value of the capacitor 52 is increased to increase the capacitance value $C_{FD1}$ of the node FD1 when the transistor 51*a* is in an on state, so that the monitor current I can be calculated with high accuracy.

In the case where the A/D converter circuit 42 has the configuration illustrated in FIG. 14A, the value of the monitor current can be calculated in consideration of the parasitic capacitance PC of the wiring 34, and the like. Thus, the value of the monitor current can be calculated with high accuracy, enabling high-accuracy correction of the threshold voltage of the transistor 62 serving as the driving transistor of the pixel circuit 14, for example. Consequently, for example, display unevenness or the like can be reduced, allowing display of a high-quality image on the display portion 11.

Figure 14B:
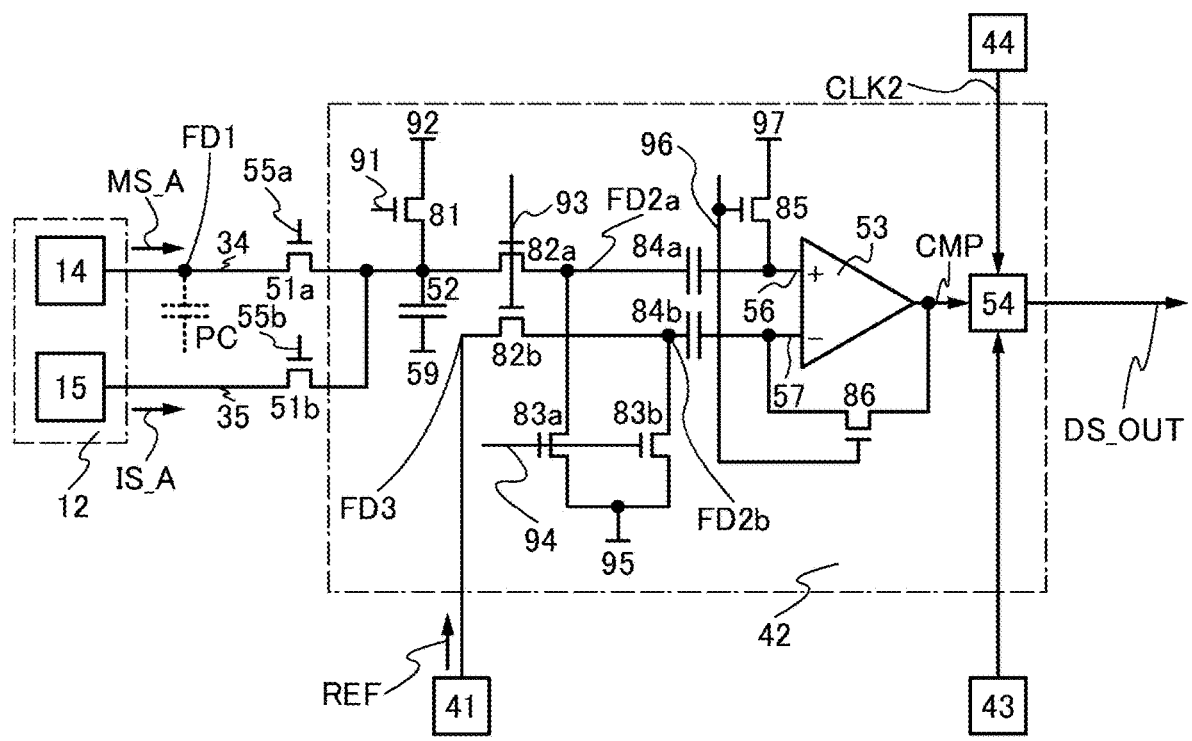

Although the transistor 51*a* and the transistor 51*b* are provided in the A/D converter circuit 42 in FIG. 14A, the transistor 51*a* and the transistor 51*b* may be provided outside the A/D converter circuit 42 as illustrated in FIG. 14B. For example, the transistor 51*a* and the transistor 51*b* may be provided outside the IC 20.

Example 2 of Driving Method for A/D Converter Circuit

An example of a driving method for the A/D converter circuit 42 will be described below.

Example of Calculation Method for Capacitance Value $C_{FD1}$

Figure 15:
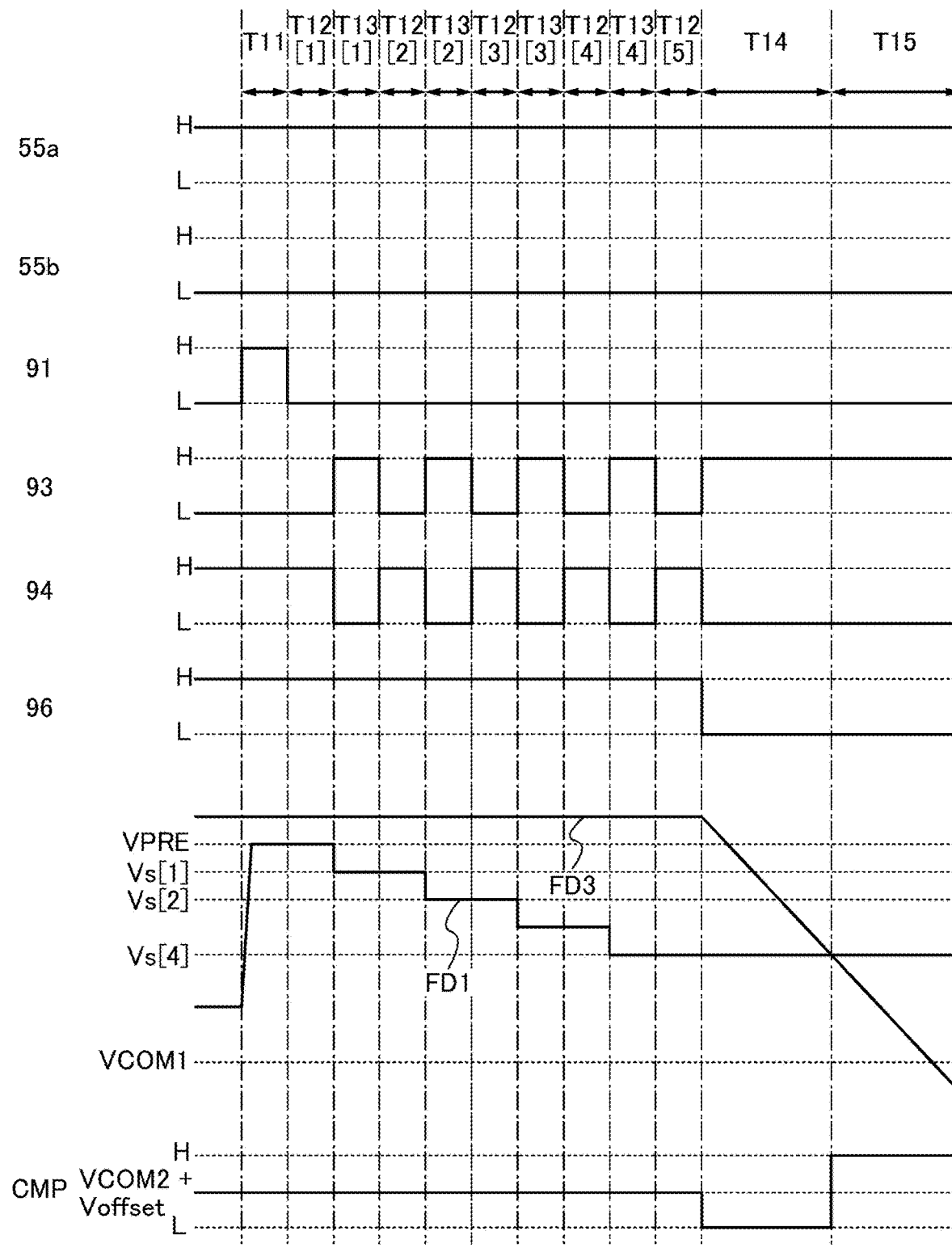
FIG. 15 is a timing chart showing an example of a driving method for a display device.

FIG. 15 is a timing chart showing an example of a method for calculating the capacitance value $C_{FD1}$ of the node FD1 in the case where the A/D converter circuit 42 has the configuration illustrated in FIG. 14A or FIG. 14B and the transistor 51*a* is in an on state.

In the case where the capacitance value $C_{FD1}$ of the node FD1 when the transistor 51*a* is in an on state is calculated by the method shown in FIG. 15, a period in which the A/D converter circuit 42 is driven can be divided into a period T11 to a period T15. Here, in the period T11 to the period T15, the potential of the wiring 55*a* is set to a high potential to turn on the transistor 51*a*, whereas the potential of the wiring 55*b* is set to a low potential to turn off the transistor 51*b*.

Figure 16:
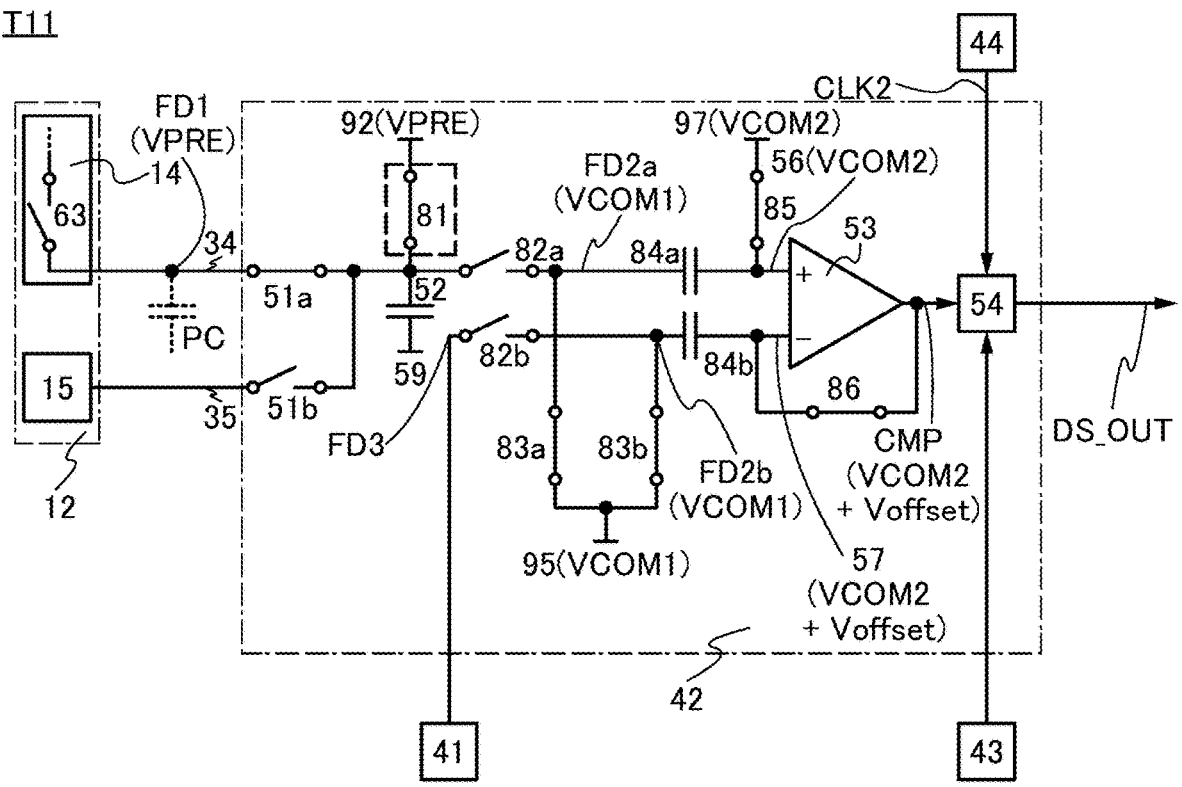
FIG. 16 is a circuit diagram illustrating an example of a driving method for a display device.
Figure 17A:
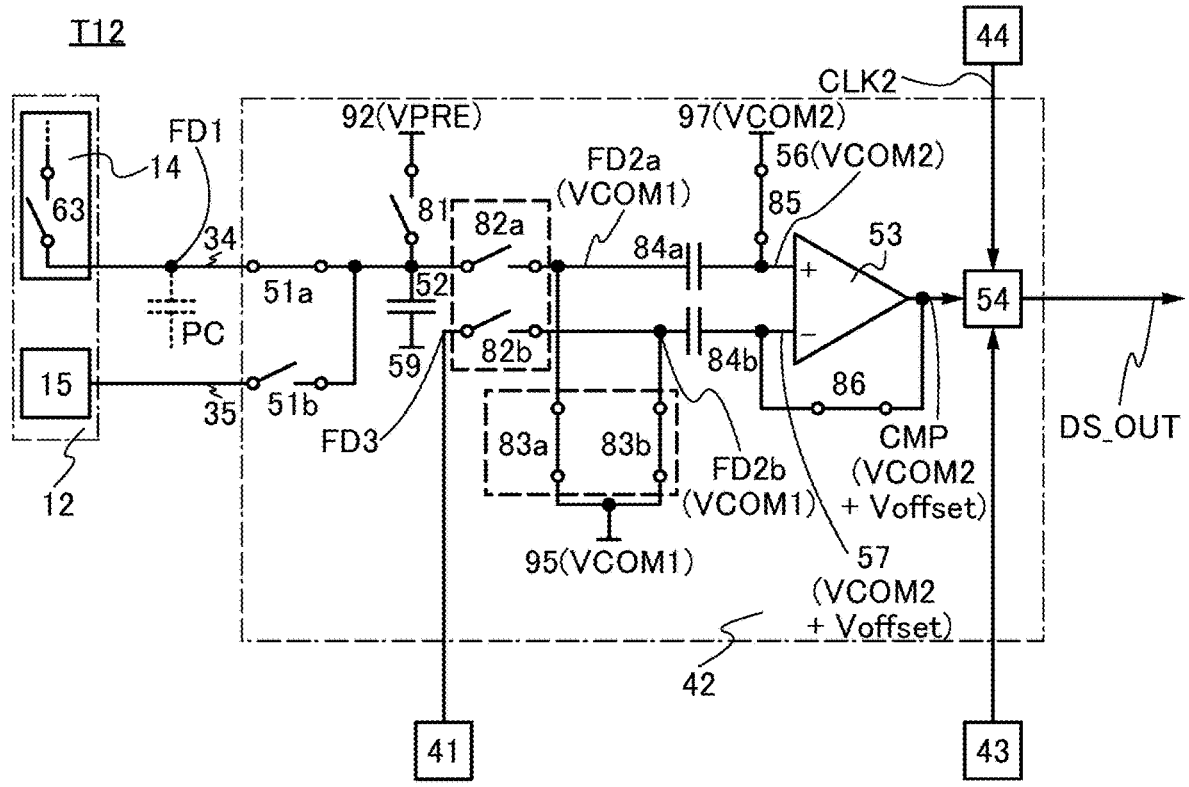
FIG. 17A and FIG. 17B are circuit diagrams illustrating an example of a driving method for a display device.
Figure 17B:
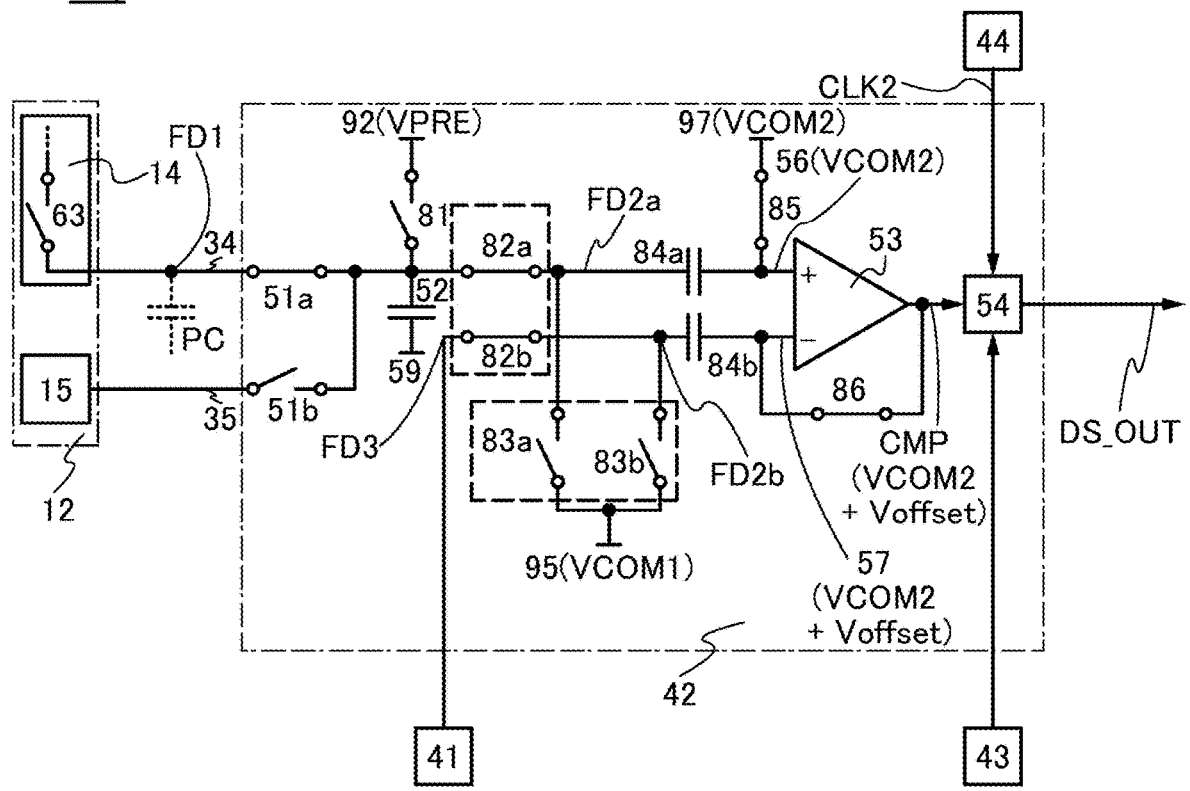
Figure 18A:
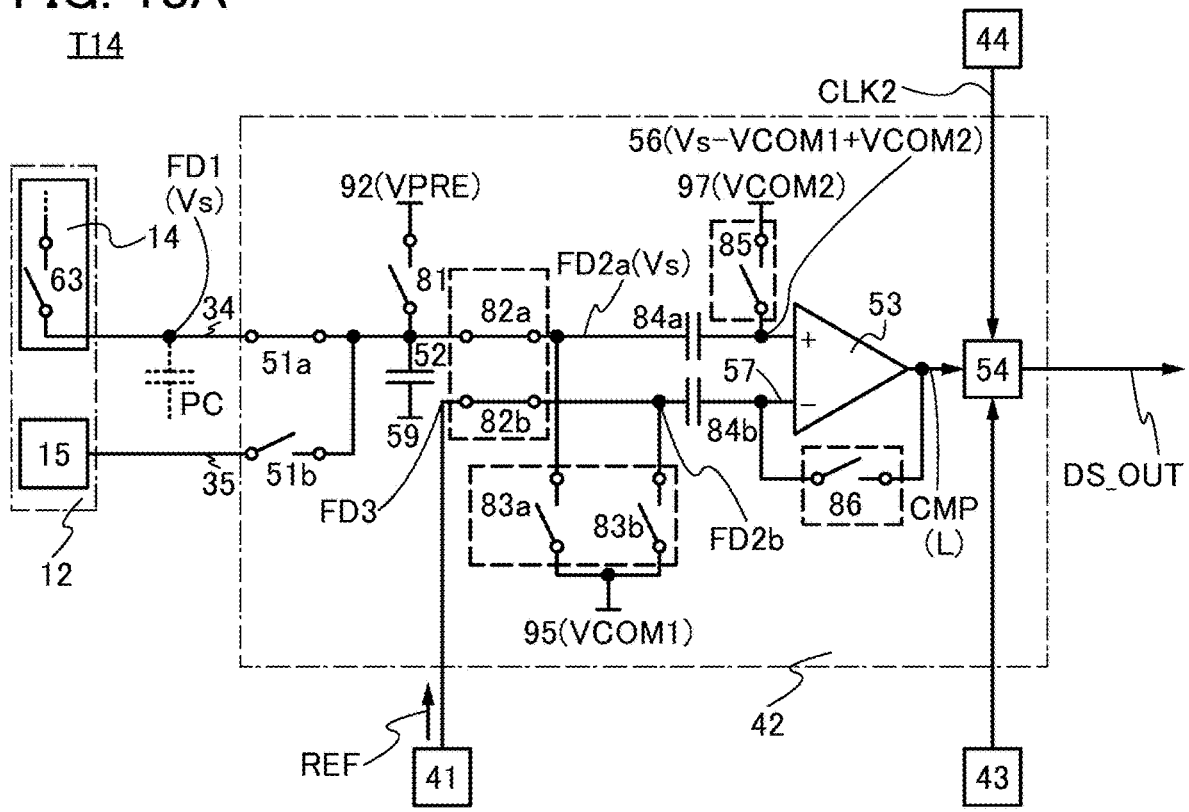
FIG. 18A and FIG. 18B are circuit diagrams illustrating an example of a driving method for a display device.
Figure 18B:
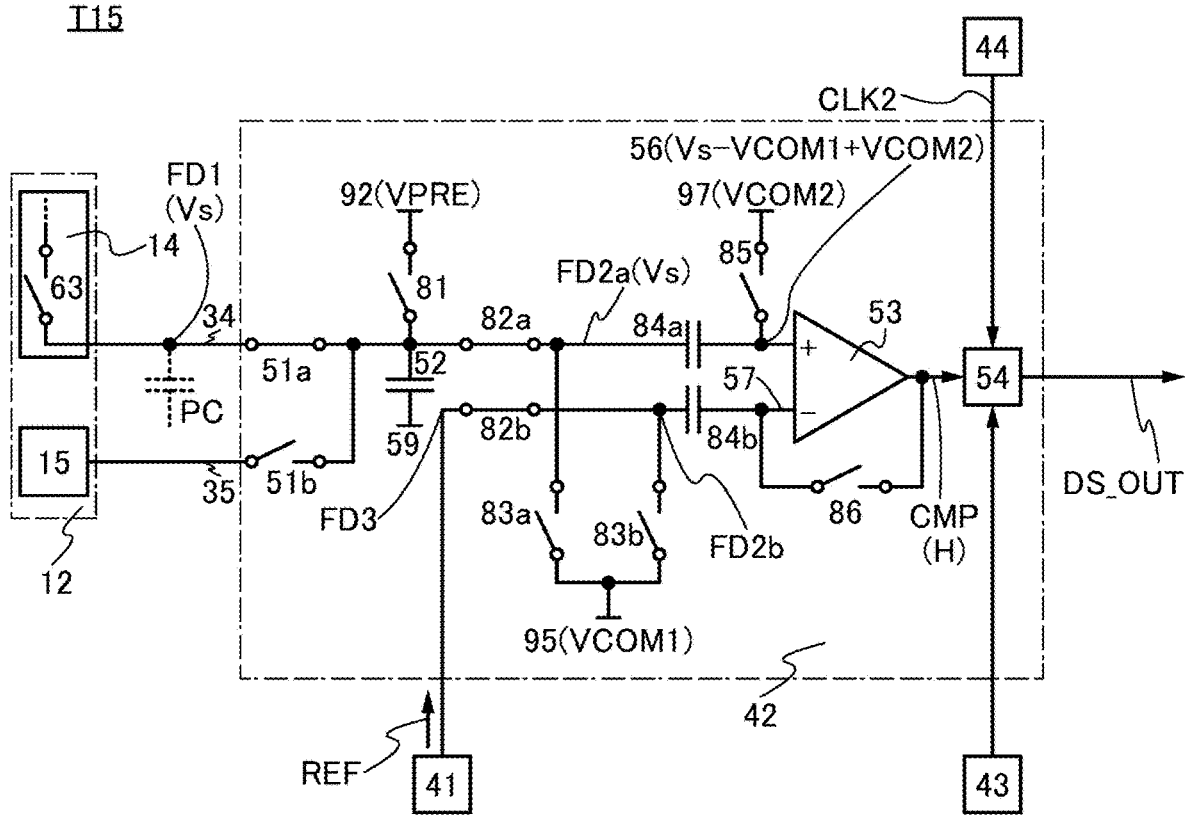

FIG. 16 to FIG. 18 are circuit diagrams illustrating examples of a driving method for the A/D converter circuit 42 and the like for periods shown in FIG. 15. Specifically, FIG. 16, FIG. 17A, FIG. 17B, FIG. 18A, and FIG. 18B are circuit diagrams illustrating examples of the driving method for the A/D converter circuit 42 and the like for the period T11, the period T12, the period T13, the period T14, and the period T15, respectively. In FIG. 16 to FIG. 18, the transistors included in the A/D converter circuit 42 are illustrated as switches so that the on/off states of the transistors are indicated. Similar representations may be shown in other circuit diagrams illustrating an example of the driving method for the A/D converter circuit 42 and the like.

As illustrated in FIG. 16 to FIG. 18, in the period T11 to the period T15, the transistor 63 provided in the pixel circuit 14 and electrically connected to the wiring 34 is in an off state. The potentials of the wiring 92, the wiring 95, and the wiring 97 having a function of a power supply line are set to a potential VPRE, a potential VCOM1, and a potential VCOM2, respectively. Here, the potential VPRE is higher than the potential VCOM1. As described above, the potential of the wiring 59 can be a low potential.

As illustrated in FIG. 15 and FIG. 16, in the period T11, the potential of the wiring 91 is set to a high potential to turn on the transistor 81. The potential of the wiring 93 is set to a low potential to turn off the transistor 82*a* and the transistor 82*b*. In addition, the potential of the wiring 94 is set to a high potential to turn on the transistor 83*a* and the transistor 83*b*. Accordingly, the potential of the node FD1 becomes the potential VPRE, and the potentials of the node FD2*a* and the node FD2*b* become the potential VCOM1. The potential of the node FD1 is precharged to the potential VPRE; thus, the period T11 can be referred to as a precharge period.

As illustrated in FIG. 15 and FIG. 16, in the period T11, the potential of the wiring 96 is set to a high potential to turn on the transistor 85 and the transistor 86. When the transistor 85 is turned on, the potential of the wiring 56 becomes the potential VCOM2. When the transistor 86 is turned on, electrical continuity is established between the output terminal of the comparator circuit 53 and the second input terminal of the comparator circuit 53. That is, feedback, for example, negative feedback is caused to the comparator circuit 53. Consequently, the potential of the comparison signal CMP output from the output terminal of the comparator circuit 53 becomes a potential obtained by adding an offset potential Voffset to the potential VCOM2. Thus, the potential of the wiring 57 electrically connected to the second input terminal of the comparator circuit 53 also becomes the potential obtained by adding the offset potential Voffset to the potential VCOM2. Through the above process, electric charge corresponding to the offset potential Voffset is accumulated in the capacitor 84b. Specifically, electric charge corresponding to a difference between the potential VCOM1 of the node FD2b and the potential of the wiring 57 "VCOM2+Voffset" is accumulated in the capacitor 84b. Thus, offset correction of the comparator circuit 53 can be performed.

As illustrated in FIG. 15 and FIG. 17A, in a period T12[1], the potential of the wiring 91 is set to a low potential to turn off the transistor 81. Thus, precharge of the node FD1 is completed.

As illustrated in FIG. 15 and FIG. 17B, in a period T13[1], the potential of the wiring 93 is set to a high potential to turn on the transistor 82a and the transistor 82b. In addition, the potential of the wiring 94 is set to a low potential to turn off the transistor 83a and the transistor 83b. Thus, electrical continuity between the node FD1 and the node FD2a is established, whereas electrical continuity between the node FD2a and the wiring 95 is broken. Accordingly, the node FD1 and the node FD2a are electrically connected to each other, and both the node FD1 and the node FD2a are in an electrically floating state. Thus, electric charge distribution is caused between the capacitance of the node FD1 (e.g., the parasitic capacitance PC and the capacitor 52) and the capacitance of the node FD2a (e.g., the capacitor 84a) when the transistor 51a is in an on state, whereby the node FD1 and the node FD2a have the potential Vs[1] expressed by the following formula. Here, the capacitance value $C_{FD2a}$ denotes the capacitance value of the node FD2a.

[Formula 2]

$$Vs[1] = \frac{C_{FD1}}{C_{FD1} + C_{FD2a}} VPRE + \frac{C_{FD2a}}{C_{FD1} + C_{FD2a}} VCOM1 \qquad (2)$$

As described above, the potential VPRE, which is the potential of the node FD1 in the period T12[1], is higher than the potential VCOM1, which is the potential of the node FD2a in the period T12[1]. Thus, the potential of the node FD1 decreases in the period T13[1].

As illustrated in FIG. 15 and FIG. 17A, in a period T12[2], the potential of the wiring 93 is set to a low potential to turn off the transistor 82a and the transistor 82b. Accordingly, electrical continuity between the node FD1 and the node FD2a is broken. In addition, the potential of the wiring 94 is set to a high potential to turn on the transistor 83a and the transistor 83b. Accordingly, the potentials of the node FD2a and the node FD2b become the potential VCOM1. Since the electrical continuity between the node FD1 and the node FD2a is broken, the potential Vs[1] of the node FD1 in the period T13[1] is held in the node FD1 in the period T12[2].

As illustrated in FIG. 15 and FIG. 17B, in a period T13[2], the potential of the wiring 93 is set to a high potential and the potential of the wiring 94 is set to a low potential. Accordingly, as in the period T13[1], electric charge distribution is caused between the capacitance of the node FD1 and the capacitance of the node FD2a, whereby the node FD1 and the node FD2a have the potential Vs[2] expressed by the following formula.

[Formula 3]

$$Vs[2] = \frac{C_{FD1}}{C_{FD1} + C_{FD2a}} V[1] + \frac{C_{FD2a}}{C_{FD1} + C_{FD2a}} VCOM1 \qquad (3)$$

The potential Vs[1], which is the potential of the node FD1 in the period T12[2], is higher than the potential VCOM1, which is the potential of the node FD2a in the period T12[2]. Thus, the potential of the node FD1 decreases in the period T13[2]. As expressed by Formula 3, the formula that expresses the potential Vs[2] includes the potential Vs[1]. Therefore, it can be said that the formula that expresses the potential Vs is a recurrence formula.

The period T12 and the period T13 are repeated more than once in the above manner, whereby the potential of the node FD1 can be significantly decreased. FIG. 15 shows the case where the operation in the period T12 is performed five times and the operation in the period T13 is performed four times. The operation in the period T12 may be performed twice and the operation in the period T13 may be performed once. Alternatively, the operation in the period T12 may be performed three times and the operation in the period T13 may be performed twice. Alternatively, the operation in the period T12 may be performed four times and the operation in the period T13 may be performed three times. Alternatively, the operation in the period T12 may be performed six or more times and the operation in the period T13 may be performed five or more times.

The potential VPRE may be set lower than or equal to the potential VCOM1. In the case where the potential VPRE is set lower than the potential VCOM1, the potential of the node FD1 is increased by performing the operations in the period T12 and the period T13.

In the period T12, the potential of the node FD2a is reset to the potential VCOM1. Thus, the period T12 can be referred to as a reset period. In the period T13, electric charge distribution is caused between the capacitance of the node FD1 and the capacitance of the node FD2a. Thus, the period T13 can be referred to as an electric charge distribution period.

In the case shown in FIG. 15, the period T14 follows after the end of a period T12[5]. As illustrated in FIG. 15 and FIG. 18A, in the period T14, the potential of the wiring 93 is set to a high potential to turn on the transistor 82a and the transistor 82b. The potential of the wiring 94 is set to a low potential to turn off the transistor 83a and the transistor 83b. In addition, the potential of the wiring 96 is set to a low potential to turn off the transistor 85 and the transistor 86.

The potential of the node FD2a in the period T12[5] is the potential VCOM1. In the period T14, the transistor 82a is turned on and the transistor 83a is turned off, so that the potential of the node FD2a electrically connected to the one electrode of the capacitor 84a becomes a potential Vs[4]. In other words, the potential of the node FD2a increases by the potential "Vs[4]—VCOM1" from the period T12[5] to the period T14. In addition, the transistor 85 is turned off, so that the wiring 56 electrically connected to the other electrode of the capacitor 84a is brought into an electrically floating state. Thus, when the capacitive coupling coefficient of the wiring 56 is 1, the potential of the wiring 56 increases by the potential "Vs[4]—VCOM1" from the period T12[5] to the period T14.

The potential of the wiring 56 in the period T12[5] is the potential VCOM2. According to the above, the potential of the wiring 56 in the period T14 becomes a potential "Vs [4]−VCOM1+VCOM2". Thus, the potential of the first input terminal of the comparator circuit 53 becomes a potential corresponding to the potential Vs[4].

The transistor 82b is turned on and the transistor 83b is turned off, so that the reference signal REF is supplied to the node FD2b electrically connected to the one electrode of the capacitor 84b. In addition, the transistor 86 is turned off, so that the wiring 57 electrically connected to the other electrode of the capacitor 84b is brought into an electrically floating state. Accordingly, the potential of the wiring 57 becomes a potential corresponding to the reference signal REF.

When the transistor 86 is turned off, feedback is not caused to the comparator circuit 53. Thus, in the period T14, the potential of the comparison signal CMP output from the comparator circuit 53 becomes a high potential when the potential of the non-inverting input terminal is higher than the potential of the inverting input terminal and becomes a low potential when the potential of the non-inverting input terminal is lower than the potential of the inverting input terminal. In FIG. 15, the potential of the reference signal REF, i.e., the potential of the node FD3 in the period T14 is higher than the potential of the node FD2a. Thus, the potential of the wiring 57 becomes higher than the potential of the wiring 56. Thus, the potential of the comparison signal CMP becomes a low potential.

In the period T14, an operation similar to that in the period T shown in FIG. 13 is performed. That is, for example, the potential of the reference signal REF is continuously decreased, and the counter circuit 54 counts the number or rises or falls of the clock signal CLK2.

At the point when the potential of the comparison signal CMP becomes a high potential, the period T14 is terminated and followed by the period T15.

In the period T15, an operation similar to that after the end of the period T shown in FIG. 13 is performed. In other words, in the period T15, the data signal DS_OUT having a digital value corresponding to the number of rises or the number of falls of the clock signal CLK2 from the start to the end of the period T14 keeps being output.

In the above manner, the A/D converter circuit 42 can output the data signal DS_OUT corresponding to the potential Vs[4], for example. As described above, the potential Vs can be expressed by a recurrence formula. As expressed by Formula 2, the potential Vs[1] can be calculated using the potential VPRE, the potential VCOM1, the capacitance value $C_{FD1}$, and the capacitance value $C_{FD2a}$. Thus, the capacitance value $C_{FD1}$ of the node FD1 when the transistor 51a is in an on state can be calculated using the potential Vs[4], the potential VPRE, the potential VCOM1, and the capacitance value $C_{FD2a}$.

In the case where the operation in the period T12 is performed k+1 times (k is an integer of 1 or more) and the operation in the period T13 is performed k times, the A/D converter circuit 42 outputs the data signal DS_OUT corresponding to a potential Vs[k] in the period T15. The potential Vs[k] is expressed by the following formula.

[Formula 4]

$$Vs[k] = \frac{C_{FD1}}{C_{FD1} + C_{FD2a}} V[k-1] + \frac{C_{FD2a}}{C_{FD1} + C_{FD2a}} VCOM1 \quad (4)$$

As expressed by Formula 4, the formula that expresses the potential Vs[k] includes a potential Vs[k−1]. Thus, it can be said that Formula 4 is a recurrence formula. When the recurrence formula expressed as Formula 4 is solved using Formula 2, which expresses the potential Vs[1], the potential Vs[k] is expressed by the following formula.

[Formula 5]

$$Vs[k] = \left(\frac{C_{FD1}}{C_{FD1} + C_{FD2a}}\right)^k (VPRE - VCOM1) + VCOM1 \quad (5)$$

Thus, the capacitance value $C_{FD1}$ is expressed by the following formula.

[Formula 6]

$$C_{FD1} = \frac{C_{FD2a} \sqrt[k]{Vs[k] - VCOM1}}{\sqrt[k]{VPRE - VCOM1} - \sqrt[k]{Vs[k] - VCOM1}} \quad (6)$$

Thus, the capacitance value $C_{FD1}$ of the node FD1 when the transistor 51a is in an on state can be calculated by Formula 6, using the potential Vs[k], the potential VPRE, the potential VCOM1, and the capacitance value $C_{FD2a}$.

In the case where k is set large, that is, the number of times the operation in the period T12 is performed and the number of times the operation in the period T13 is performed are increased, the potential of the node FD1 can be significantly changed from the potential VPRE, which is a precharge potential. Thus, the capacitance value $C_{FD1}$ can be calculated with high accuracy.

The parasitic capacitance PC included in the capacitance of the node FD1 includes capacitance generated outside the IC 20. Thus, measuring the capacitance value of the node FD1 when the transistor 51a is in an on state with the use of a measurement device, for example, takes more cost than measuring the capacitance value of the capacitor 84a or the like included in the IC 20 with the use of a measurement device. In contrast, the method illustrated in FIG. 15 to FIG. 18 allows calculation of the capacitance of the node FD1 without a measurement device. Thus, the display device 10 can be inexpensive.

In the case where the capacitance value of the node FD1 when the transistor 51a is in an on state is calculated by the method illustrated in FIG. 15 to FIG. 18, electric charge in the node FD1 is preferably held for a long time so that the capacitance of the node FD1 can be calculated with high accuracy. Thus, transistors with a low off-state current are preferably used as the transistor 51b, the transistor 81, the transistor 82a, the transistor 83a, the transistor 63, and the like. For example, OS transistors are preferably used.

OS transistors may also be used as other transistors included in the A/D converter circuit 42. Furthermore, OS transistors may be used as all the transistors included in the IC 20. In the case where all the transistors included in the IC 20 are OS transistors, they can be formed in the same process. OS transistors may be used as all the transistors included in the IC 20 and all the transistors included in the pixel 12. In the case where all the transistors included in the IC 20 and all the transistors included in the pixel 12 are OS transistors, they can be formed in the same process. Furthermore, when all the transistors included in the display device 10 are OS transistors, they can be formed in the same process. Thus, the number of manufacturing steps for the display device 10 can be reduced, making the display device 10 inexpensive.

Some or all of the transistors included in the display device 10 may be Si transistors or the like. For example, Si transistors may be used as the transistors included in the IC 20. Particularly, when transistors including crystalline silicon (typically, low-temperature polysilicon, single crystal silicon, or the like) are used as Si transistors, the on-state current of the transistors can be increased. Thus, the display device 10 can be driven at high speed.

Example of Calculating Method for Monitor Current

Figure 19:
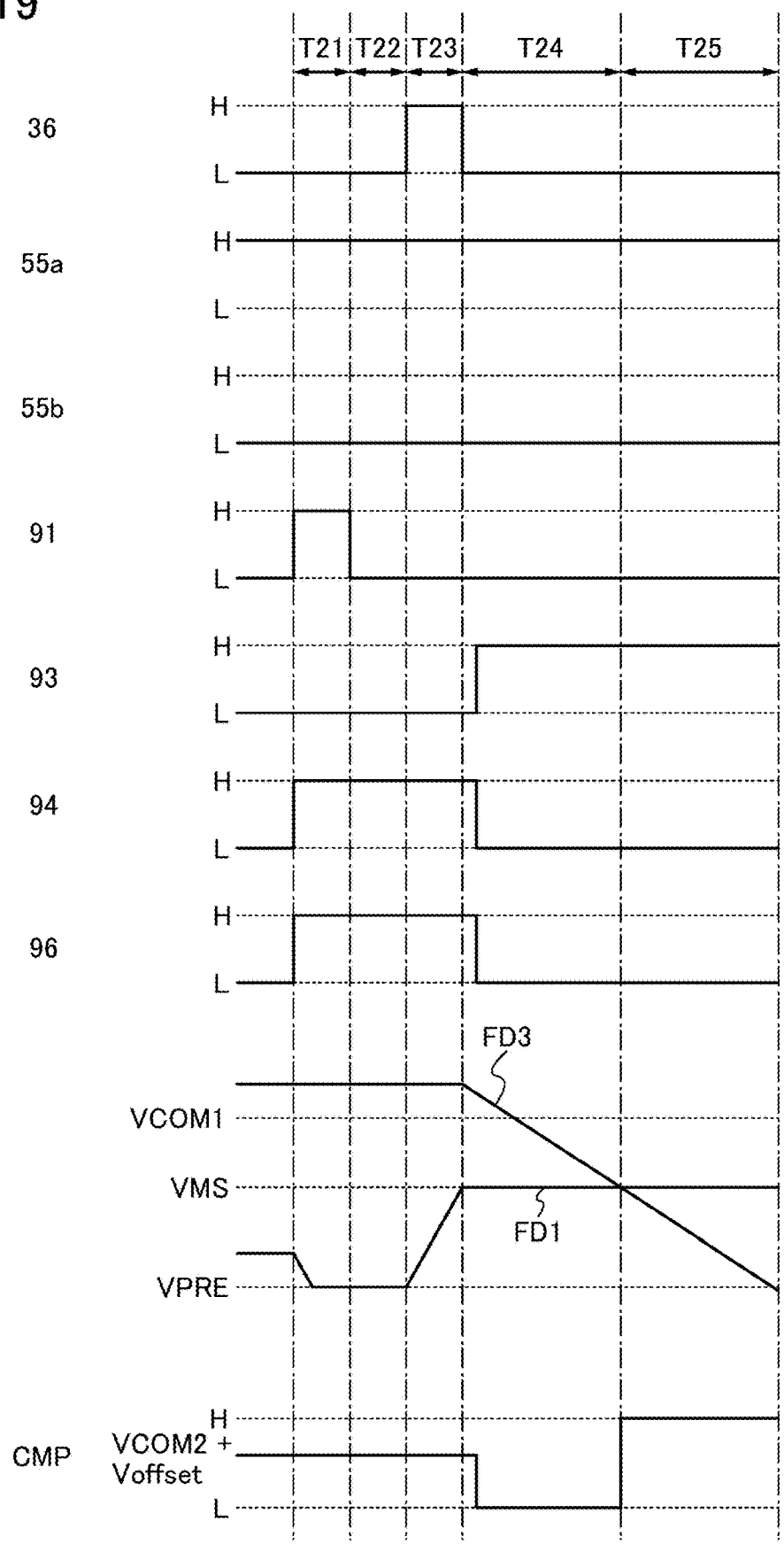
FIG. 19 is a timing chart showing an example of a driving method for a display device.

An example of a calculating method for a monitor current using the capacitance value of the node FD1 when the transistor 51a is in an on state that is calculated by the method illustrated in FIG. 15 to FIG. 18, for example will be described below. FIG. 19 is a timing chart showing an example of a method for A/D conversion on the analog monitor signal MS_A.

In the case where A/D conversion is performed on the analog monitor signal MS_A by the method shown in FIG. 19, a period in which the A/D converter circuit 42 is driven can be divided into a period T21 to a period T25. Here, in the period T21 to the period T25, the potential of the wiring 55a is set to a high potential to turn on the transistor 51a. The potential of the wiring 55b is set to a low potential to turn off the transistor 51b. In the period T21 to the period T25, the potentials of the wiring 92, the wiring 95, and the wiring 97 having a function of a power supply line are set to the potential VPRE, the potential VCOM1, and the potential VCOM2, respectively, as in the period T11 to the period T15. Assume that the potential VPRE is lower than the potential VCOM1, for example.

Figure 20A:
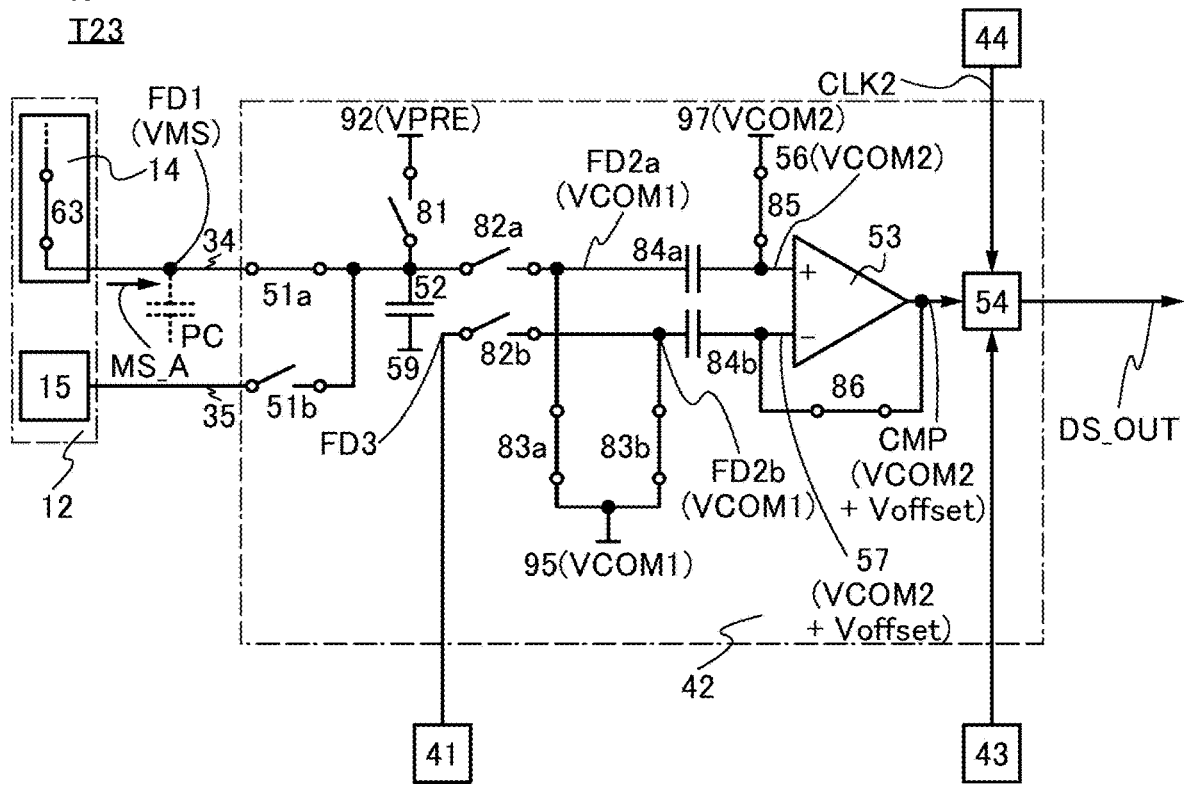
FIG. 20A and FIG. 20B are circuit diagrams illustrating an example of a driving method for a display device.
Figure 20B:
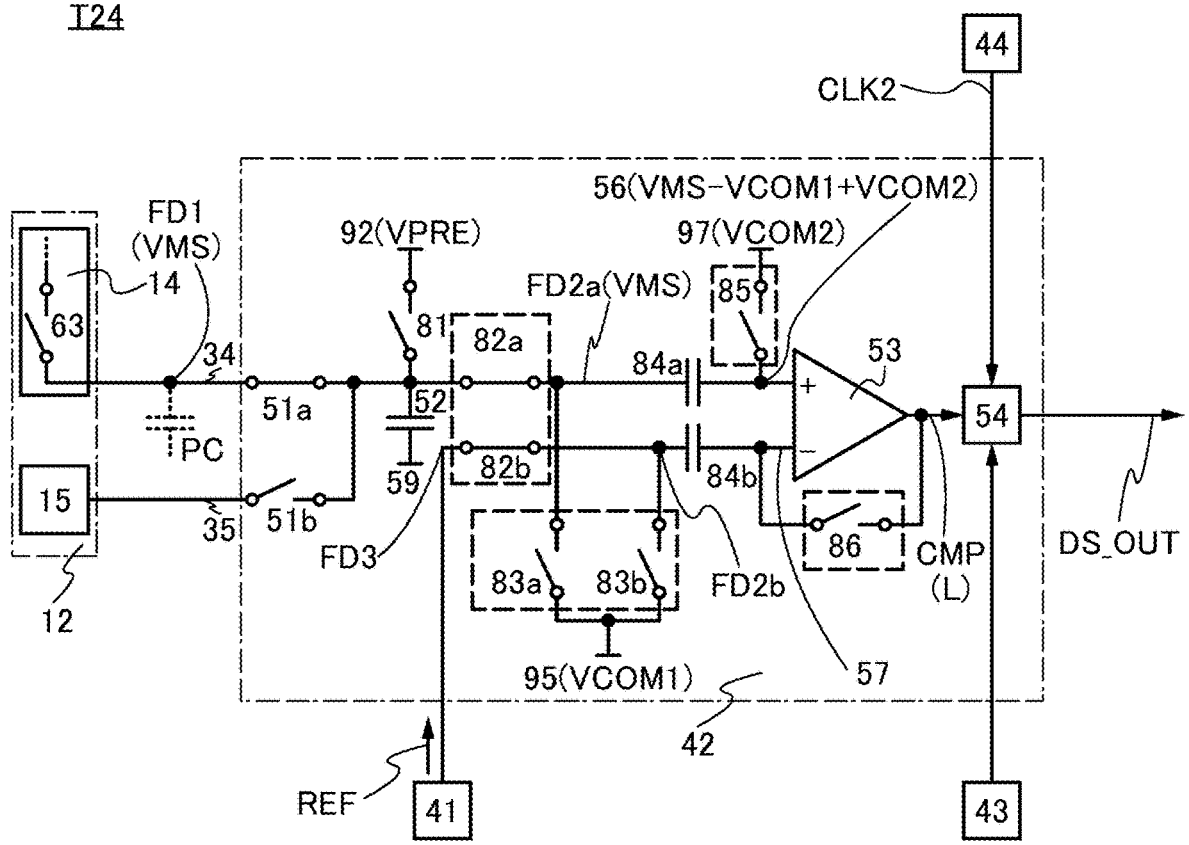

FIG. 20A is a circuit diagram illustrating an example of a driving method for the A/D converter circuit 42 and others for the period T23. FIG. 20B is a circuit diagram illustrating an example of a driving method for the A/D converter circuit 42 and others for the period T24.

As shown in FIG. 19, the potential of the wiring 36 is set to a low potential in the period T21, so that the transistor 63 is turned off. The potential of the wiring 91 is set to a high potential to turn on the transistor 81. The potential of the wiring 93 is set to a low potential to turn off the transistor 82a and the transistor 82b. In addition, the potential of the wiring 94 is set to a high potential to turn on the transistor 83a and the transistor 83b. Accordingly, the potential of the node FD1 becomes the potential VPRE and the potentials of the node FD2a and the node FD2b become the potential VCOM1. The potential of the node FD1 is precharged to the potential VPRE; thus, the period T21 can be referred to as a precharge period.

In addition, in the period T21, the potential of the wiring 96 is set to a high potential to turn on the transistor 85 and the transistor 86. Accordingly, the potential of the comparison signal CMP becomes a potential obtained by adding the offset potential Voffset to the potential VCOM2, so that offset correction of the comparator circuit 53 can be performed.

Thus, it can be said that the period T21 is a period in which an operation similar to that in the period T11 is performed.

As shown in FIG. 19, in the period T22, the potential of the wiring 91 is set to a low potential, so that the transistor 81 is turned off. Accordingly, precharge of the node FD1 is completed. It can be said that the period T22 is a period in which an operation similar to that in the period T12 is performed.

As shown in FIG. 19 and FIG. 20A, in the period T23, the potential of the wiring 36 is set to a high potential, so that the transistor 63 is turned on. Accordingly, the potential of the node FD1 is increased in response to the analog monitor signal MS_A.

As shown in FIG. 19 and FIG. 20B, in the period T24, first, the potential of the wiring 36 is set to a low potential, so that the transistor 63 is turned off. Next, the potential of the wiring 93 is set to a high potential to turn on the transistor 82a and the transistor 82b. The potential of the wiring 94 is set to a low potential, so that the transistor 83a and the transistor 83b are turned off. In addition, the potential of the wiring 96 is set to a low potential to turn off the transistor 85 and the transistor 86.

By turning off the transistor 63, the potential of the node FD1 is held. Assume that the held potential is a potential VMS. The transistor 82a is turned on and the transistor 83a and the transistor 85 are turned off while the potential of the node FD1 is held, whereby the potential of the wiring 56 becomes a potential "VMS−VCOM1+VCOM2". Thus, the potential of the first input terminal of the comparator circuit 53 becomes a potential corresponding to the potential VMS When the transistor 82b is turned on and the transistor 83b is turned off, the reference signal REF is supplied to the node FD2b, so that the potential of the wiring 57 becomes a potential corresponding to the reference signal REF.

When the transistor 86 is turned off, the potential of the comparison signal CMP output from the comparator circuit 53 becomes a high potential in the case where the potential of the non-inverting input terminal is higher than the potential of the inverting input terminal and becomes a low potential in the case where the potential of the non-inverting input terminal is lower than the potential of the inverting input terminal. In FIG. 19, the potential of the reference signal REF, that is, the potential of the node FD3, in the period T24 is higher than the potential of the node FD2a. Thus, the potential of the wiring 57 is higher than the potential of the wiring 56. Thus, the potential of the comparison signal CMP is a low potential.

In the period T24, an operation similar to that in the period T shown in FIG. 13 is performed. That is, for example, the potential of the reference signal REF is continuously decreased, and the counter circuit 54 counts the number of rises or the number of falls of the clock signal CLK2. At the point when the potential of the comparison signal CMP becomes a high potential, the period T24 is terminated and followed by the period T25.

Thus, it can be said that the period T24 is a period in which an operation similar to that in the period T14 is performed.

In the period T25, an operation similar to that after the end of the period T shown in FIG. 13 is performed. In other words, in the period T25, the data signal DS_OUT having a digital value corresponding to the number of rises or the number of falls of the clock signal CLK2 from the start to the end of the period T24 keeps being output. Thus, it can be said that the period T25 is a period in which an operation similar to that in the period T15 is performed.

By the operations in the period T21 to the period T25, the analog monitor signal MS_A can be converted into a digital signal. Specifically, the A/D converter circuit 42 can output the data signal DS_OUT having a digital value corresponding to the potential VMS of the analog monitor signal MS_A. Thus, the potential VMS can be calculated.

After the potential VMS is calculated, the monitor current I is calculated using Formula 1. Here, $\Delta V_{FD1}$ can be set "VMS—VPRE". In addition, $\Delta t$ can be set the length of the period T23.

The capacitance value of the node FD1 when the transistor 51a is in an on state is calculated by the method shown in FIG. 15 to FIG. 18 and then the value of the monitor current is calculated by the method shown in FIG. 19, FIG. 20A, and FIG. 20B, whereby the value of the monitor current can be calculated in consideration of the parasitic capacitance PC of the wiring 34 and the like. Thus, the value of the monitor current can be calculated with high accuracy, enabling high-accuracy correction of the threshold voltage of the transistor 62, which serves as the driving transistor of the pixel circuit 14, for example. Consequently, for example, display unevenness or the like can be reduced; thus, a high-quality image can be displayed on the display portion 11.

Example of A/D Conversion Method for Analog Imaging Signal

Figure 21:
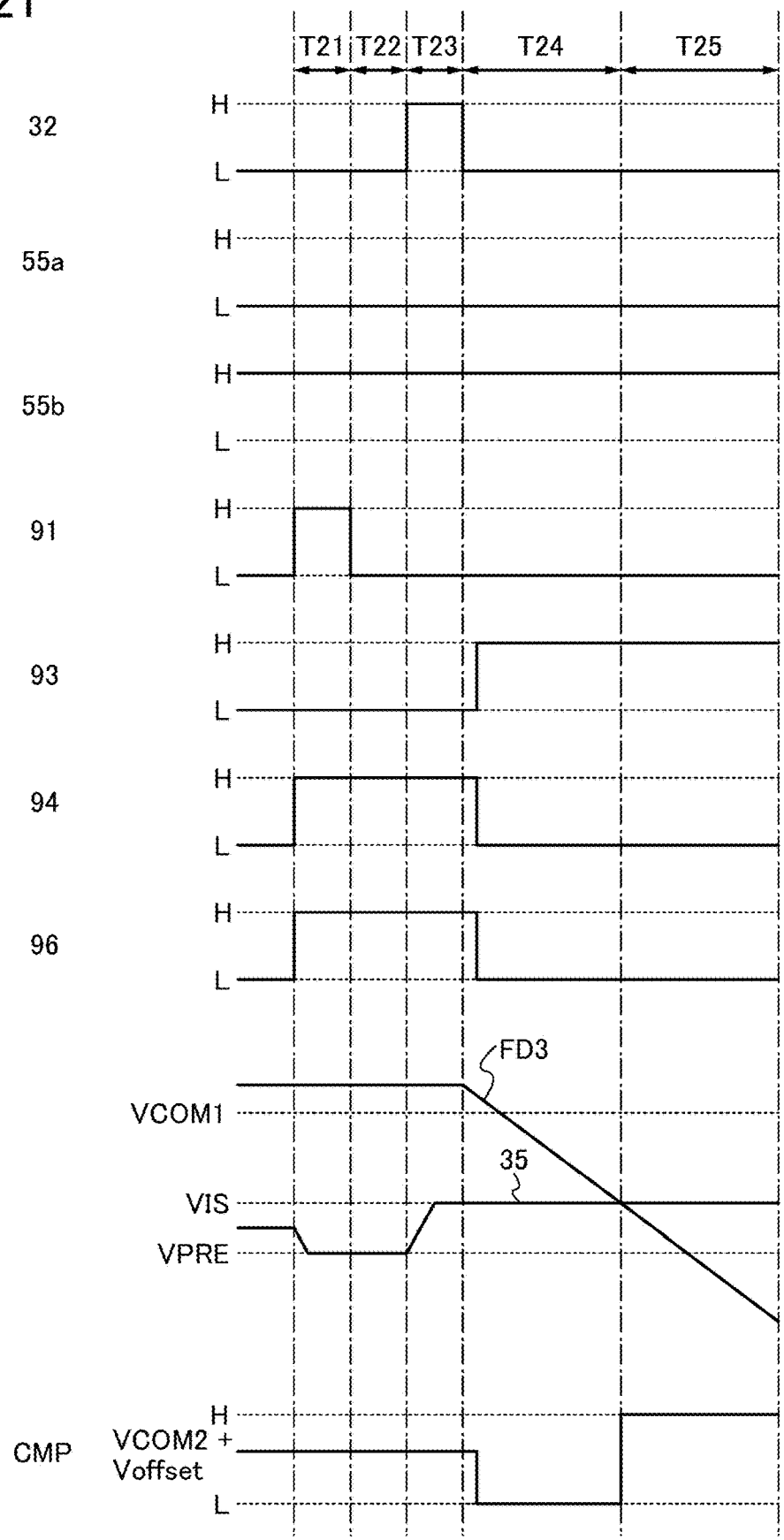
FIG. 21 is a timing chart showing an example of a driving method for a display device.

Next, an example of a method for A/D conversion on the analog imaging signal IS_A will be described. FIG. 21 is a timing chart showing an example of a method for A/D conversion on the analog imaging signal IS_A. In the case where A/D conversion is performed on the analog imaging signal IS_A by the method shown in FIG. 21, a period in which the A/D converter circuit 42 is driven can be divided into the period T21 to the period T25 as in the case shown in FIG. 19. Here, in the case where A/D conversion is performed on the analog imaging signal IS_A, the potential of the wiring 55a is set to a low potential in the period T21 to the period T25 so that the transistor 51a is turned off. On the other hand, the potential of the wiring 55b is set to a high potential to turn on the transistor 51b.

Figure 22A:
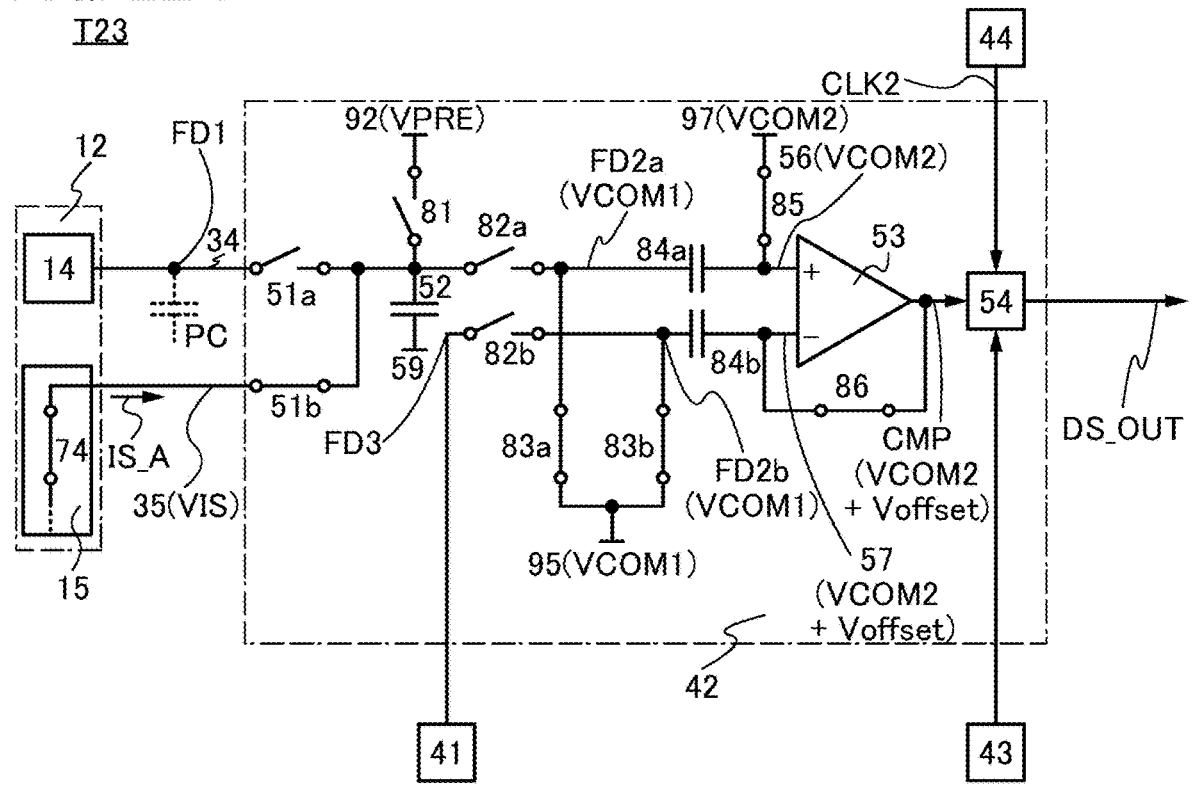
FIG. 22A and FIG. 22B are circuit diagrams illustrating an example of a driving method for a display device.
Figure 22B:
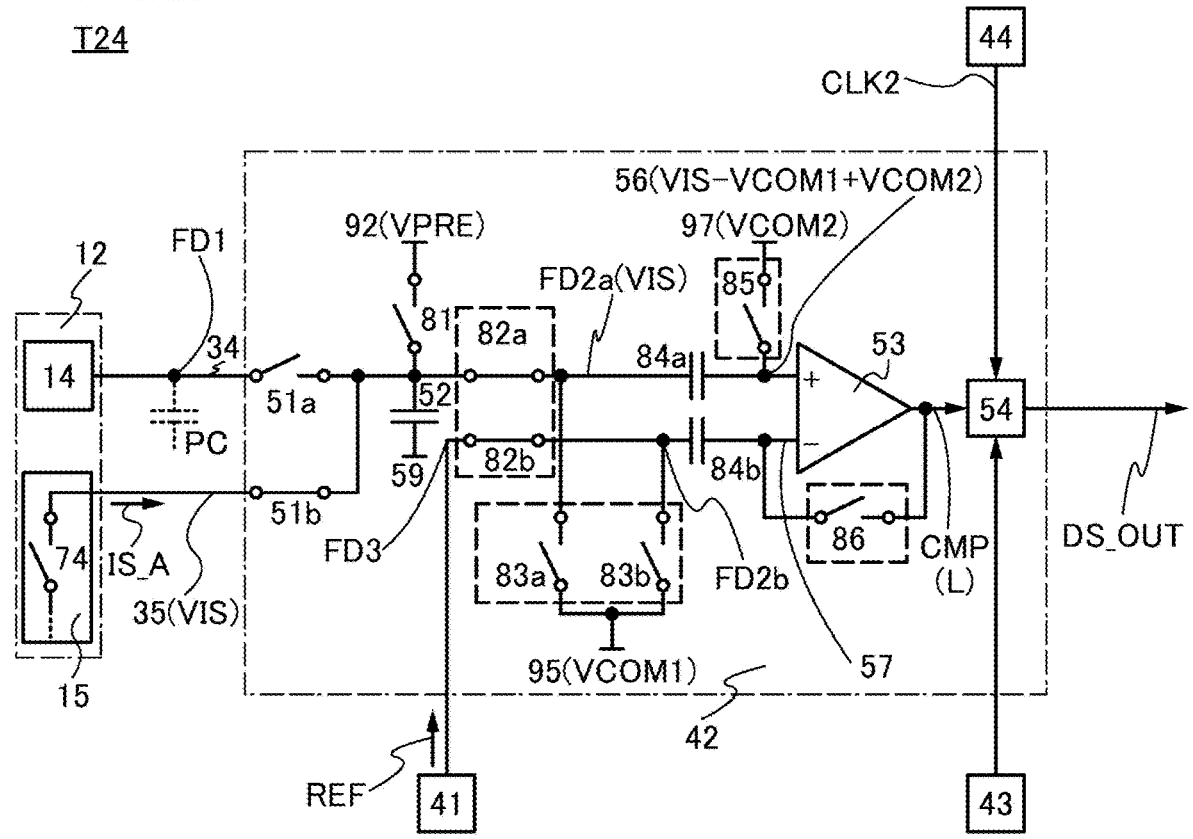

FIG. 22A is a circuit diagram illustrating an example of a driving method for the A/D converter circuit 42 and others for the period T23 of the case where A/D conversion is performed on the analog imaging signal IS_A. FIG. 22B is a circuit diagram illustrating an example of a driving method for the A/D converter circuit 42 and others for the period T24 of the case where A/D conversion is performed on the analog imaging signal IS_A.

The operations in the period T21 to the period T25 shown in FIG. 21 will be described below. The description of operations similar to those in the period T21 to the period T25 shown in FIG. 19 is omitted in some cases.

As shown in FIG. 21, the potential of the wiring 32 is set to a low potential in the period T21, so that the transistor 74, which is provided in the pixel circuit 15 and electrically connected to the wiring 35, is turned off. In the period T21, precharge of the node FD1, offset correction of the comparator circuit 53, and the like are performed. Then, in the period T22, precharge of the node FD1 is completed.

As shown in FIG. 21 and FIG. 22A, the potential of the wiring 32 is set to a high potential in the period T23, so that the transistor 74 is turned on. Thus, the potential of the wiring 35 becomes a potential VIS corresponding to the analog imaging signal IS_A. In the case where A/D conversion is performed on the analog imaging signal IS_A, a change in the potential of the wiring 35 over time does not need to be measured. Therefore, it is preferable that the operation in the period T23 be continued until the potential of the wiring 35 enters a steady state. This allows high-accuracy A/D conversion on the analog imaging signal IS_A.

As shown in FIG. 21 and FIG. 22B, in the period T24, first, the potential of the wiring 32 is set to a low potential, so that the transistor 74 is turned off. Next, the transistor 82a and the transistor 82b are turned on and the transistor 83a, the transistor 83b, the transistor 85, and the transistor 86 are turned off. The transistor 82a is turned on and the transistor 83a and the transistor 85 are turned off, whereby the potential of the wiring 56 becomes a potential "VIS−VCOM1+VCOM2". Thus, the potential of the first input terminal of the comparator circuit 53 becomes a potential corresponding to the potential VIS. The transistor 82b is turned on and the transistor 83b is turned off, whereby the reference signal REF is supplied to the node FD2b, and the potential of the wiring 57 becomes a potential corresponding to the reference signal REF.

When the transistor 86 is turned off, the potential of the comparison signal CMP output from the comparator circuit 53 becomes a high potential in the case where the potential of the non-inverting input terminal is higher than the potential of the inverting input terminal and becomes a low potential in the case where the potential of the non-inverting input terminal is lower than the potential of the inverting input terminal. In FIG. 21, the potential of the reference signal REF, that is, the potential of the node FD3, in the period T24 is higher than the potential of the node FD2a. Thus, the potential of the wiring 57 is higher than the potential of the wiring 56. Thus, the potential of the comparison signal CMP is a low potential.

In the period T24, an operation similar to that in the period T shown in FIG. 13 is performed. In the period T25, an operation similar to that after the end of the period T shown in FIG. 13 is performed. Thus, the analog imaging signal IS_A can be converted into a digital signal. Specifically, the A/D converter circuit 42 can output the data signal DS_OUT having a digital value corresponding to the potential of the analog imaging signal IS_A.

The above is an example of the driving method for the A/D converter circuit 42 and others having the configuration illustrated in FIG. 14A or FIG. 14B.

One embodiment of the present invention can be used even in the case where the pixel 12 does not include the pixel circuit 15. For example, the configuration in which the display portion 11 is provided so as to have a region overlapping with the IC 20 as illustrated in FIG. 2A or FIG. 2B can be used even in the case where the pixel 12 does not include the pixel circuit 15. The configurations illustrated in FIG. 12A, FIG. 12B, FIG. 14A, and FIG. 14B can be used even in the case where the pixel 12 does not include the pixel circuit 15. In the case where the configurations illustrated in FIG. 12A, FIG. 12B, FIG. 14A, and FIG. 14B are used for display devices without the pixel circuit 15, the need for providing the transistor 51a and the transistor 51b can be eliminated.

At least part of the structure examples, the drawings corresponding thereto, and the like exemplified in this embodiment can be implemented in combination with the other structure examples, the other drawings, or the like as appropriate.

At least part of this embodiment can be implemented in combination with the other embodiments described in this specification, as appropriate.

Embodiment 2

In this embodiment, cross-sectional structure examples and the like of display devices of embodiments of the present invention will be described.

Figure 23A:
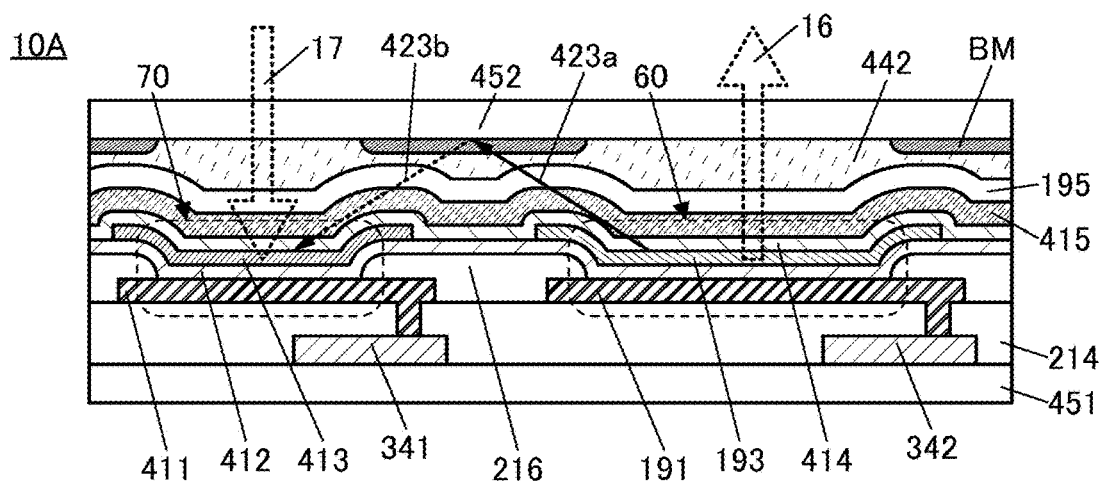
FIG. 23A to FIG. 23C are cross-sectional views illustrating structure examples of display devices.

FIG. 23A illustrates a cross-sectional view of a display device 10A.

The display device 10A includes a light-receiving device 70 and a light-emitting device 60.

The light-receiving device 70 includes a pixel electrode 411, a common layer 412, an active layer 413, a common layer 414, and a common electrode 415.

The light-emitting device 60 includes a pixel electrode 191, the common layer 412, a light-emitting layer 193, the common layer 414, and the common electrode 415.

The pixel electrode 411, the pixel electrode 191, the common layer 412, the active layer 413, the light-emitting layer 193, the common layer 414, and the common electrode 415 may each have a single-layer structure or a stacked-layer structure.

The pixel electrode 411 and the pixel electrode 191 are positioned over an insulating layer 214. The pixel electrode 411 and the pixel electrode 191 can be formed using the same material in the same process.

The common layer 412 is positioned over the pixel electrode 411 and the pixel electrode 191. The common layer 412 is a layer shared by the light-receiving device 70 and the light-emitting device 60.

The active layer 413 overlaps with the pixel electrode 411 with the common layer 412 therebetween. The light-emitting layer 193 overlaps with the pixel electrode 191 with the common layer 412 therebetween. The active layer 413 includes a first organic compound, and the light-emitting layer 193 includes a second organic compound that is different from the first organic compound.

The common layer 414 is positioned over the common layer 412, the active layer 413, and the light-emitting layer 193. The common layer 414 is a layer shared by the light-receiving device 70 and the light-emitting device 60.

The common electrode 415 includes a portion overlapping with the pixel electrode 411 with the common layer 412, the active layer 413, and the common layer 414 therebetween. The common electrode 415 further includes a portion overlapping with the pixel electrode 191 with the common layer 412, the light-emitting layer 193, and the common layer 414 therebetween. The common electrode 415 is a layer shared by the light-receiving device 70 and the light-emitting device 60.

In the display device of this embodiment, an organic compound is used for the active layer 413 of the light-receiving device 70. In the light-receiving device 70, the layers other than the active layer 413 can have structures in common with the layers in the light-emitting device 60 (EL device). Therefore, the light-receiving device 70 can be formed concurrently with the light-emitting device 60 only by adding a step of depositing the active layer 413 in the manufacturing process of the light-emitting device 60. The light-emitting device 60 and the light-receiving device 70 can be formed over one substrate. Accordingly, the light-receiving device 70 can be incorporated into the display device without a significant increase in the number of manufacturing steps.

The display device 10A illustrates an example in which the light-receiving device 70 and the light-emitting device 60 have a common structure except that the active layer 413 of the light-receiving device 70 and the light-emitting layer 193 of the light-emitting device 60 are separately formed.

Note that the structures of the light-receiving device 70 and the light-emitting device 60 are not limited thereto. The light-receiving device 70 and the light-emitting device 60 may include a separately formed layer other than the active layer 413 and the light-emitting layer 193 (see display devices 10K, 10L, and 10M described later). The light-receiving device 70 and the light-emitting device 60 preferably include at least one layer used in common (common layer). Thus, the light-receiving device 70 can be incorporated into the display device without a significant increase in the number of manufacturing steps.

The display device 10A includes the light-receiving device 70, the light-emitting device 60, a transistor 341, a transistor 342, and the like between a pair of substrates (a substrate 451 and a substrate 452).

In the light-receiving device 70, the common layer 412, the active layer 413, and the common layer 414, which are positioned between the pixel electrode 411 and the common electrode 415, can each also be referred to as an organic layer (a layer including an organic compound). The pixel electrode 411 preferably has a function of reflecting visible light. An end portion of the pixel electrode 411 is covered with a partition 216. The common electrode 415 has a function of transmitting visible light.

The light-receiving device 70 has a function of sensing light. Specifically, the light-receiving device 70 is a photoelectric conversion device that receives light 17 incident from the outside of the display device 10A and converts it into an electric signal. The light 17 can also be expressed as light that is emitted from the light-emitting device 60 and then reflected by an object. The light 17 may enter the light-receiving device 70 through a lens described later.

A light-blocking layer BM is provided on a surface of the substrate 452 that faces the substrate 451. The light-blocking layer BM has an opening in a position overlapping with the light-receiving device 70 and in a position overlapping with the light-emitting device 60. Providing the light-blocking layer BM can control the range where the light-receiving device 70 senses light.

For the light-blocking layer BM, a material that blocks light emitted from the light-emitting device can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

The light-emitting device 60 emits light and the light reflected by a sensing target is sensed by the light-receiving device 70, whereby the display device 10A can sense the sensing target. However, in some cases, light emitted from the light-emitting device 60 is reflected inside the display device 10A and enters the light-receiving device 70 without through a sensing target. The light-blocking layer BM can reduce the influence of such stray light. For example, in the case where the light-blocking layer BM is not provided, light 423a emitted from the light-emitting device 60 is reflected by the substrate 452 and reflected light 423b enters the light-receiving device 70 in some cases. Providing the light-blocking layer BM can inhibit entry of the reflected light 423b into the light-receiving device 70. Consequently, noise can be reduced, and the sensitivity of a sensor using the light-receiving device 70 can be increased.

In the light-emitting device 60, the common layer 412, the light-emitting layer 193, and the common layer 414, which are positioned between the pixel electrode 191 and the common electrode 415, can each also be referred to as an EL layer. The pixel electrode 191 preferably has a function of reflecting visible light. An end portion of the pixel electrode 191 is covered with the partition 216. The pixel electrode 411 and the pixel electrode 191 are electrically insulated from each other by the partition 216. The common electrode 415 has a function of transmitting visible light.

The light-emitting device 60 has a function of emitting visible light. Specifically, the light-emitting device 60 is an electroluminescent element that emits light to the substrate 452 side by applying a voltage between the pixel electrode 191 and the common electrode 415 (see the light 16).

It is preferable that the light-emitting layer 193 be formed so as not to overlap with a light-receiving region of the light-receiving device 70. This inhibits absorption of the light 17 by the light-emitting layer 193, increasing the amount of light with which the light-receiving device 70 is irradiated.

The pixel electrode 411 is electrically connected to a source or a drain of the transistor 341 through an opening provided in the insulating layer 214. The end portion of the pixel electrode 411 is covered with the partition 216.

The pixel electrode 191 is electrically connected to a source or a drain of the transistor 342 through an opening provided in the insulating layer 214. The end portion of the pixel electrode 191 is covered with the partition 216. The transistor 342 has a function of controlling the driving of the light-emitting device 60.

The transistor 341 and the transistor 342 are on and in contact with the same layer (the substrate 451 in FIG. 23A).

At least part of a circuit electrically connected to the light-receiving device 70 and a circuit electrically connected to the light-emitting device 60 are preferably formed using the same material in the same process. In that case, the thickness of the display device can be reduced compared with the case where the two circuits are separately formed, resulting in simplification of the manufacturing steps.

The light-receiving device 70 and the light-emitting device 60 are preferably covered with a protective layer 195. In FIG. 23A, the protective layer 195 is provided on and in contact with the common electrode 415. Providing the protective layer 195 can inhibit entry of impurities such as water into the light-receiving device 70 and the light-emitting device 60, so that the reliability of the light-receiving device 70 and the light-emitting device 60 can be increased. The protective layer 195 and the substrate 452 are bonded to each other with an adhesive layer 442.

Figure 24A:
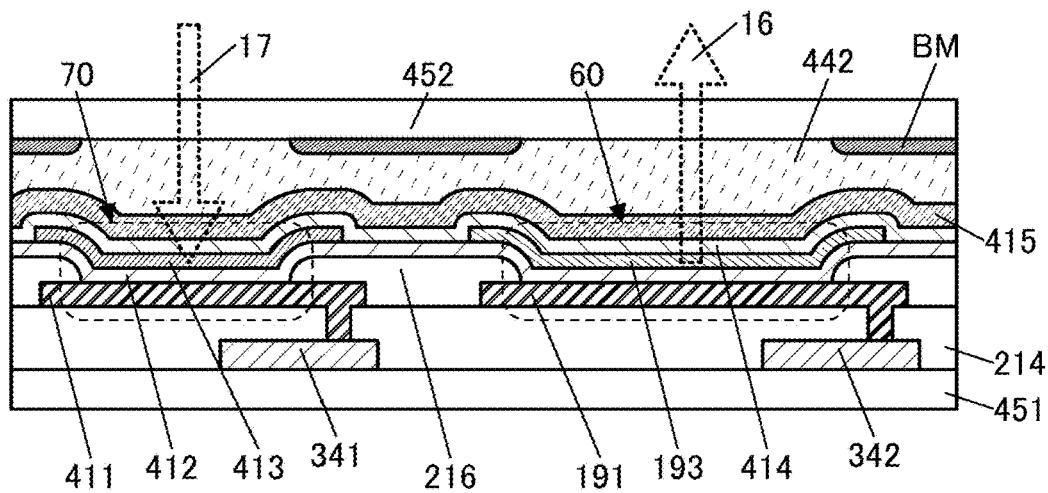
FIG. 24A to FIG. 24C are cross-sectional views illustrating structure examples of display devices.

Note that as illustrated in FIG. 24A, the protective layer over the light-receiving device 70 and the light-emitting device 60 may be omitted. In FIG. 24A, the common electrode 415 and the substrate 452 are bonded to each other with the adhesive layer 442.

[Display Device 10B]

Figure 23B:
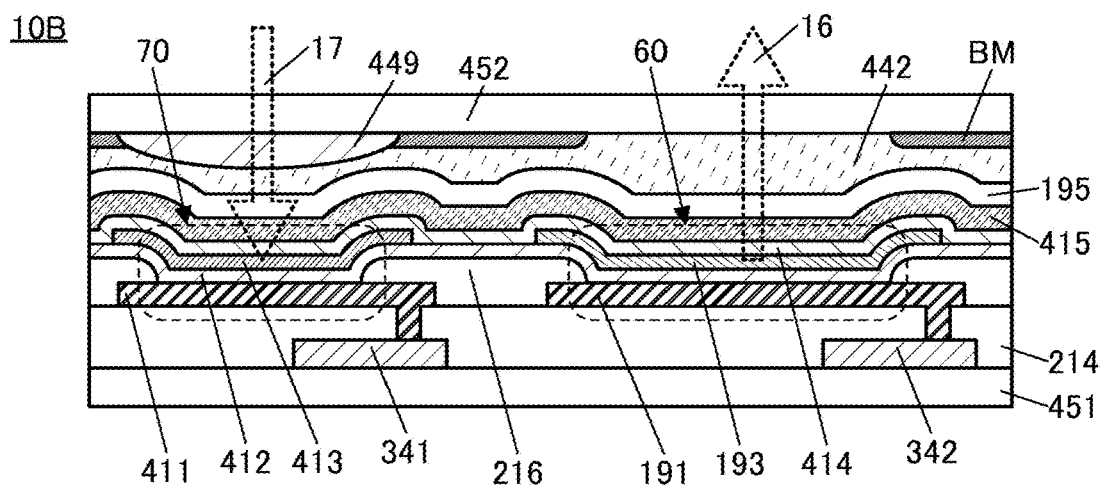

FIG. 23B is a cross-sectional view of a display device 10B. Note that in the description of the display device below, components similar to those of the above-mentioned display device are not described in some cases.

The display device 10B illustrated in FIG. 23B includes a lens 449 in addition to the components of the display device 10A.

The display device of this embodiment may include the lens 449. The lens 449 is provided in a position overlapping with the light-receiving device 70. In the display device 10B, the lens 449 is provided in contact with the substrate 452. The lens 449 included in the display device 10B has a convex surface on the substrate 451 side. Alternatively, the lens 449 may have a convex surface on the substrate 452 side.

In the case where the light-blocking layer BM and the lens 449 are formed on the same plane of the substrate 452, their formation order is not limited. FIG. 23B illustrates an example in which the lens 449 is formed first; alternatively, the light-blocking layer BM may be formed first. In FIG. 23B, an end portion of the lens 449 is covered with the light-blocking layer BM.

The display device 10B has a structure in which the light 17 enters the light-receiving device 70 through the lens 449. With the lens 449, the image-capturing range of the light-receiving device 70 can be narrowed as compared to the case where the lens 449 is not provided, thereby inhibiting overlap of the imaging ranges between the adjacent light-receiving devices 70. Thus, a clear image with little blurring can be captured. Given that the imaging range of the light-receiving device 70 does not change, the lens 449 allows the size of a pinhole (corresponding to the size of an opening in BM that overlaps with the light-receiving device 70 in FIG. 23B) to be increased, compared to the case where the lens 449 is not provided. Hence, providing the lens 449 can increase the amount of light entering the light-receiving device 70.

Figure 24B:
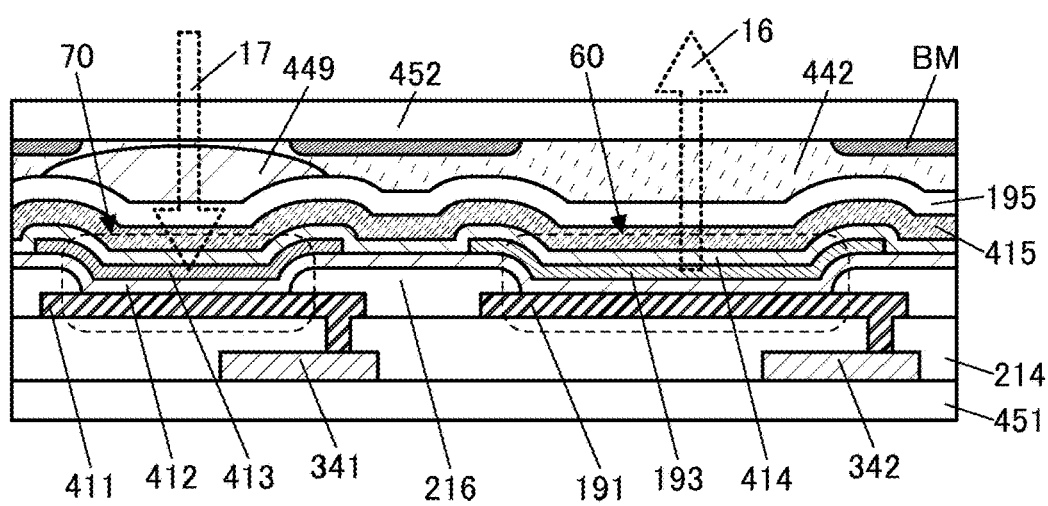
Figure 24C:
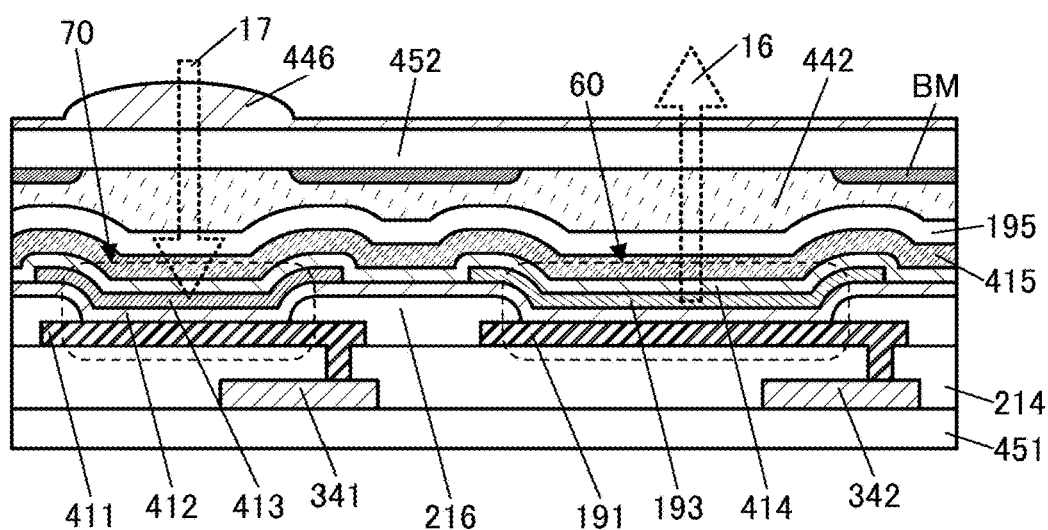

Each of display devices illustrated in FIG. 24B and FIG. 24C has a structure in which the light 17 enters the light-receiving device 70 through the lens 449, in a manner similar to that of the display device 10B illustrated in FIG. 23B.

In FIG. 24B, the lens 449 is provided in contact with the top surface of the protective layer 195. The lens 449 included in the display device illustrated in FIG. 24B has a convex surface facing the substrate 452.

In the display device illustrated in FIG. 24C, a lens array 446 is provided on the display surface side of the substrate 452. A lens included in the lens array 446 is provided in a position overlapping with the light-receiving device 70. The light-blocking layer BM is preferably provided on the surface of the substrate 452 on the substrate 451 side.

As a method for forming the lens used in the display device of this embodiment, a lens such as a microlens may be formed directly over the substrate or the light-receiving device, or a lens array formed separately, such as a microlens array, may be bonded to the substrate.

Figure 23C:
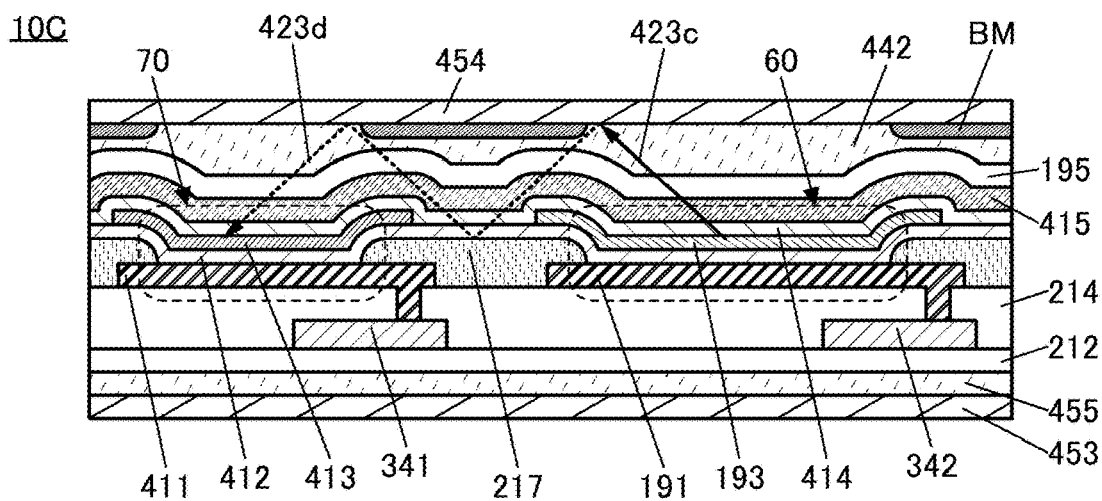

FIG. 23C shows a cross-sectional view of a display device 10C.

The display device 10C illustrated in FIG. 23C differs from the display device 10A in that the substrate 451, the substrate 452, and the partition 216 are not included and a substrate 453, a substrate 454, an adhesive layer 455, an insulating layer 212, and a partition 217 are included.

The substrate 453 and the insulating layer 212 are bonded to each other with the adhesive layer 455. The substrate 454 and the protective layer 195 are bonded to each other with the adhesive layer 442.

The display device 10C has a structure obtained in such a manner that the insulating layer 212, the transistor 341, the transistor 342, the light-receiving device 70, the light-emitting device 60, and the like are formed over a formation substrate and then transferred onto the substrate 453. The substrate 453 and the substrate 454 preferably have flexibility. In that case, the flexibility of the display device 10C can be increased. For example, a resin is preferably used for each of the substrate 453 and the substrate 454.

For each of the substrate 453 and the substrate 454, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 453 and the substrate 454.

As the substrate included in the display device of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic resin.

The partition 217 preferably absorbs light emitted by the light-emitting device. As the partition 217, a black matrix can be formed using a resin material containing a pigment or dye, for example. Moreover, the partition 217 can be formed of a colored insulating layer by using a brown resist material.

In some cases, light 423c emitted from the light-emitting device 60 is reflected by the substrate 452 and the partition 217 and reflected light 423d enters the light-receiving device 70. In other cases, the light 423c passes through the partition 217 and is reflected by a transistor, a wiring, or the like, and thus reflected light enters the light-receiving device 70. When the partition 217 absorbs the light 423c, entry of the reflected light 423d into the light-receiving device 70 can be inhibited. Consequently, noise can be reduced, and the sensitivity of a sensor using the light-receiving device 70 can be increased.

The partition 217 preferably absorbs at least light with the wavelength that is sensed by the light-receiving device 70. For example, in the case where the light-receiving device 70 senses green light emitted from the light-emitting device 60, the partition 217 preferably absorbs at least green light. For example, when a red color filter is provided, the partition 217 can absorbs the green light 423c, and entry of the reflected light 423d into the light-receiving device 70 can be inhibited.

Figure 25A:
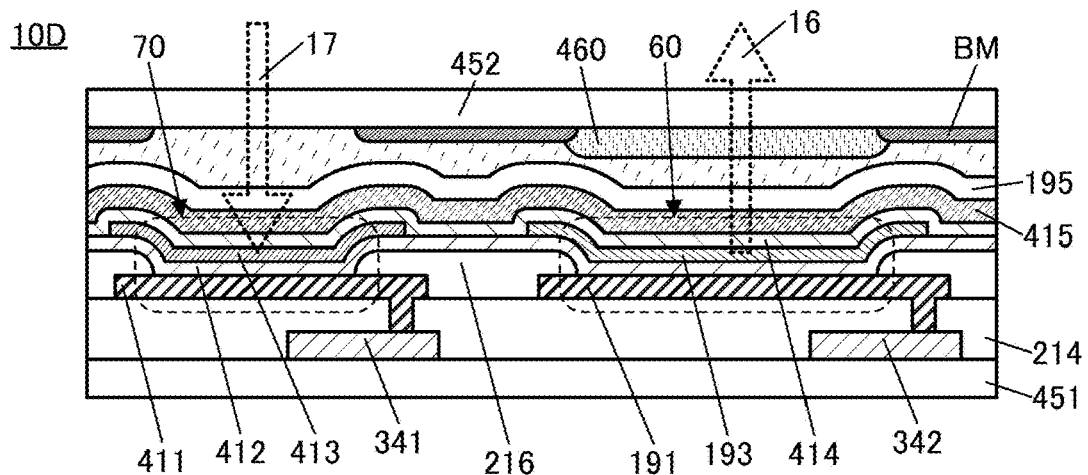
FIG. 25A to FIG. 25C are cross-sectional views illustrating structure examples of display devices.

FIG. 25A illustrates a cross-sectional view of a display device 10D.

The display device 10D illustrated in FIG. 25A is different from the display device 10A in that a color filter 460 is included. The color filter 460 is provided so as to include a region overlapping with the light-emitting device 60. The color filter 460 has a function of transmitting light of a particular color (wavelength) and absorbing light of the other colors (wavelengths). For example, the color filter 460 transmitting red light can be provided so as to include a region overlapping with the pixel circuit 14R described in Embodiment 1, which emits the red light 16R. The color filter 460 transmitting green light can be provided so as to include a region overlapping with the pixel circuit 14G, which emits the green light 16G. The color filter 460 transmitting blue light can be provided so as to include a region overlapping with the pixel circuit 14B, which emits the blue light 16B.

In the display device 10D, a light-emitting layer that emits white light can be used as the light-emitting layer 193, for example. Thus, the light-emitting layers 193 do not need to be separately patterned for the respective colors of light emitted from the pixel circuits 14, so that the pixels 12 can have higher resolution. In addition, the manufacturing cost of the display device can be reduced, making the display device 10D inexpensive.

Figure 25B:
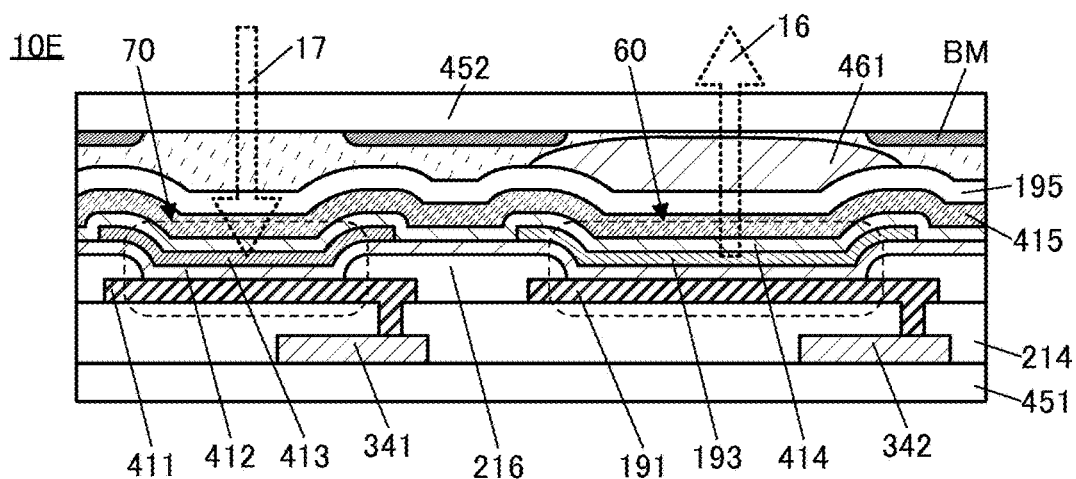

FIG. 25B illustrates a cross-sectional view of a display device 10E.

The display device 10E illustrated in FIG. 25B is different from the display device 10A in that a lens 461 is included. The lens 461 can be provided in contact with the top surface of the protective layer 195 so as to include a region overlapping with the light-emitting device 60. The lens 461 has a convex surface on the substrate 452 side.

Figure 25C:
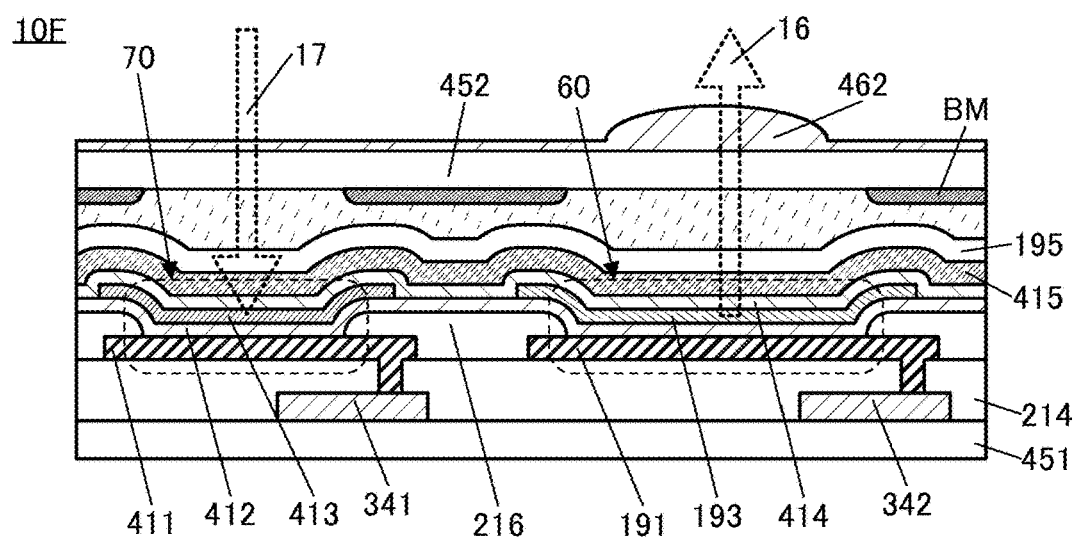

FIG. 25C is a cross-sectional view of a display device 10F.

The display device 10F illustrated in FIG. 25C is different from the display device 10A in that a lens array 462 is included. The lens array 462 can be provided on the display surface side of the substrate 452. A lens included in the lens array 462 is provided so as to include a region overlapping with the light-emitting device 60.

As in the display device 10E or the display device 10F, a lens is provided so as to include a region overlapping with the light-emitting device 60, whereby the extraction efficiency of the light 16 emitted from the light-emitting layer 193 can be increased. Thus, high-luminance images can be displayed on the display portion 11 provided with the light-emitting devices 60.

Figure 26A:
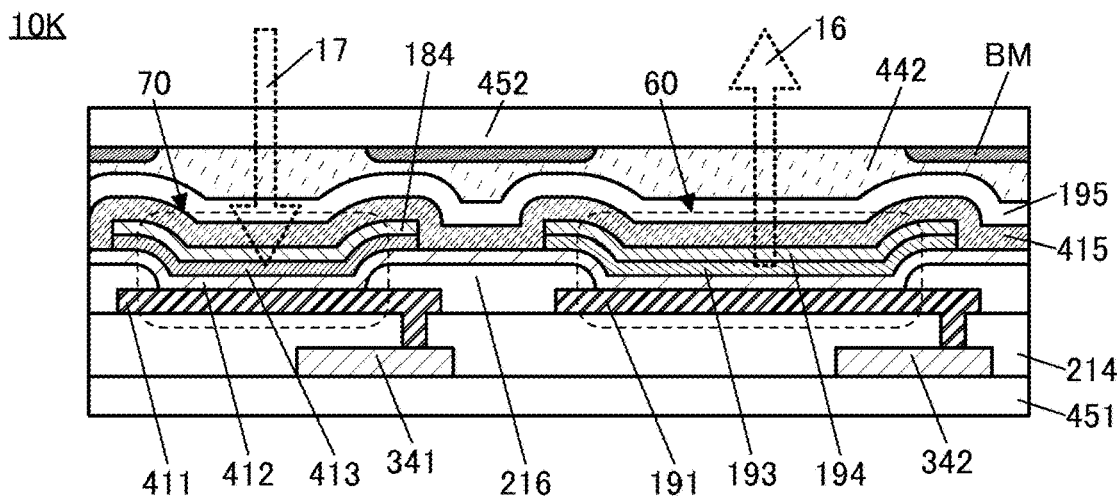
FIG. 26A to FIG. 26C are cross-sectional views illustrating structure examples of display devices.
Figure 26B:
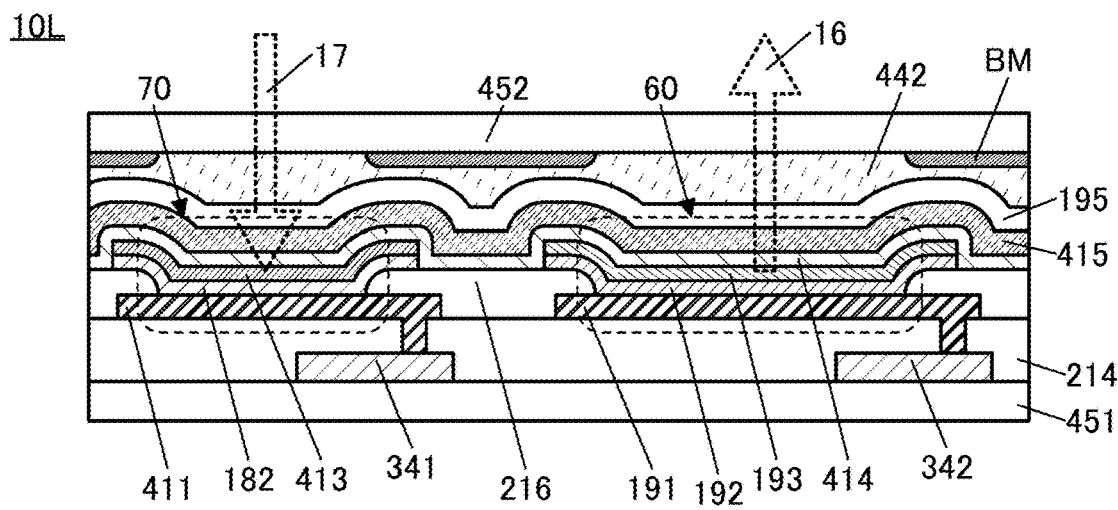
Figure 26C:
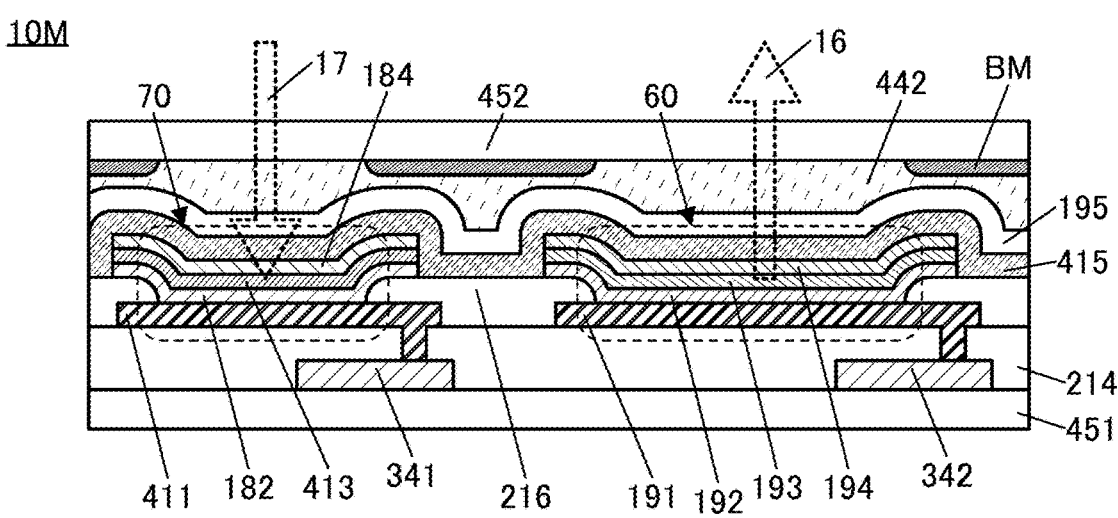

FIG. 26A shows a cross-sectional view of a display device 10K, FIG. 26B shows a cross-sectional view of a display device 10L, and FIG. 26C shows a cross-sectional view of a display device 10M.

The display device 10K differs from the display device 10A in that the common layer 414 is not included and a buffer layer 184 and a buffer layer 194 are included. The buffer layer 184 and the buffer layer 194 may each have a single-layer structure or a stacked-layer structure.

In the display device 10K, the light-receiving device 70 includes the pixel electrode 411, the common layer 412, the active layer 413, the buffer layer 184, and the common electrode 415. In the display device 10K, the light-emitting device 60 includes the pixel electrode 191, the common layer 412, the light-emitting layer 193, the buffer layer 194, and the common electrode 415.

The display device 10L differs from the display device 10A in that the common layer 412 is not included and a buffer layer 182 and a buffer layer 192 are included. The buffer layer 182 and the buffer layer 192 may each have a single-layer structure or a stacked-layer structure.

In the display device 10L, the light-receiving device 70 includes the pixel electrode 411, the buffer layer 182, the active layer 413, the common layer 414, and the common electrode 415. In the display device 10L, the light-emitting device 60 includes the pixel electrode 191, the buffer layer 192, the light-emitting layer 193, the common layer 414, and the common electrode 415.

The display device 10M differs from the display device 10A in that the common layer 412 and the common layer 414 are not included and the buffer layer 182, the buffer layer 184, the buffer layer 192, and the buffer layer 194 are included.

In the display device 10M, the light-receiving device 70 includes the pixel electrode 411, the buffer layer 182, the active layer 413, the buffer layer 184, and the common electrode 415. In the display device 10M, the light-emitting device 60 includes the pixel electrode 191, the buffer layer 192, the light-emitting layer 193, the buffer layer 194, and the common electrode 415.

In the formation of the light-receiving device 70 and the light-emitting device 60, not only the active layer 413 and the light-emitting layer 193 but also other layers can be formed separately.

In the display device 10K, an example is shown in which the buffer layer 184 between the common electrode 415 and the active layer 413 and the buffer layer 194 between the common electrode 415 and the light-emitting layer 193 are formed separately. As the buffer layer 194, one or both of an electron-injection layer and an electron-transport layer can be formed, for example.

In the display device 10L, an example is shown in which the buffer layer 182 between the pixel electrode 411 and the active layer 413 and the buffer layer 192 between the pixel electrode 191 and the light-emitting layer 193 are formed separately. As the buffer layer 192, one or both of a hole-injection layer and a hole-transport layer can be formed, for example.

In the display device 10M, an example is shown in which in each of the light-receiving device 70 and the light-emitting device 60, a common layer is not provided between the pair of electrodes (the pixel electrode 411 or the pixel electrode 191 and the common electrode 415). The light-receiving device 70 and the light-emitting device 60 included in the display device 10M can be manufactured in the following manner: the pixel electrode 411 and the pixel electrode 191 are formed over the insulating layer 214 using the same material in the same process; the buffer layer 182, the active layer 413, and the buffer layer 184 are formed over the pixel electrode 411; the buffer layer 192, the light-emitting layer 193, and the buffer layer 194 are formed over the pixel electrode 191; and then, the common electrode 415 is formed so as to cover the pixel electrode 411, the buffer layer 182, the active layer 413, the buffer layer 184, the pixel electrode 191, the buffer layer 192, the light-emitting layer 193, and the buffer layer 194. Note that the formation order of the stacked-layer structure of the buffer layer 182, the active layer 413, and the buffer layer 184 and the stacked-layer structure of the buffer layer 192, the light-emitting layer 193, and the buffer layer 194 is not particularly limited. For example, after the buffer layer 182, the active layer 413, and the buffer layer 184 are deposited, the buffer layer 192, the light-emitting layer 193, and the buffer layer 194 may be formed. In an opposite manner, the buffer layer 192, the light-emitting layer 193, and the buffer layer 194 may be formed before the buffer layer 182, the active layer 413, and the buffer layer 184 are deposited. Alternate deposition of the buffer layer 182, the buffer layer 192, the active layer 413, the light-emitting layer 193, and the like in this order is also possible.

Figure 27:
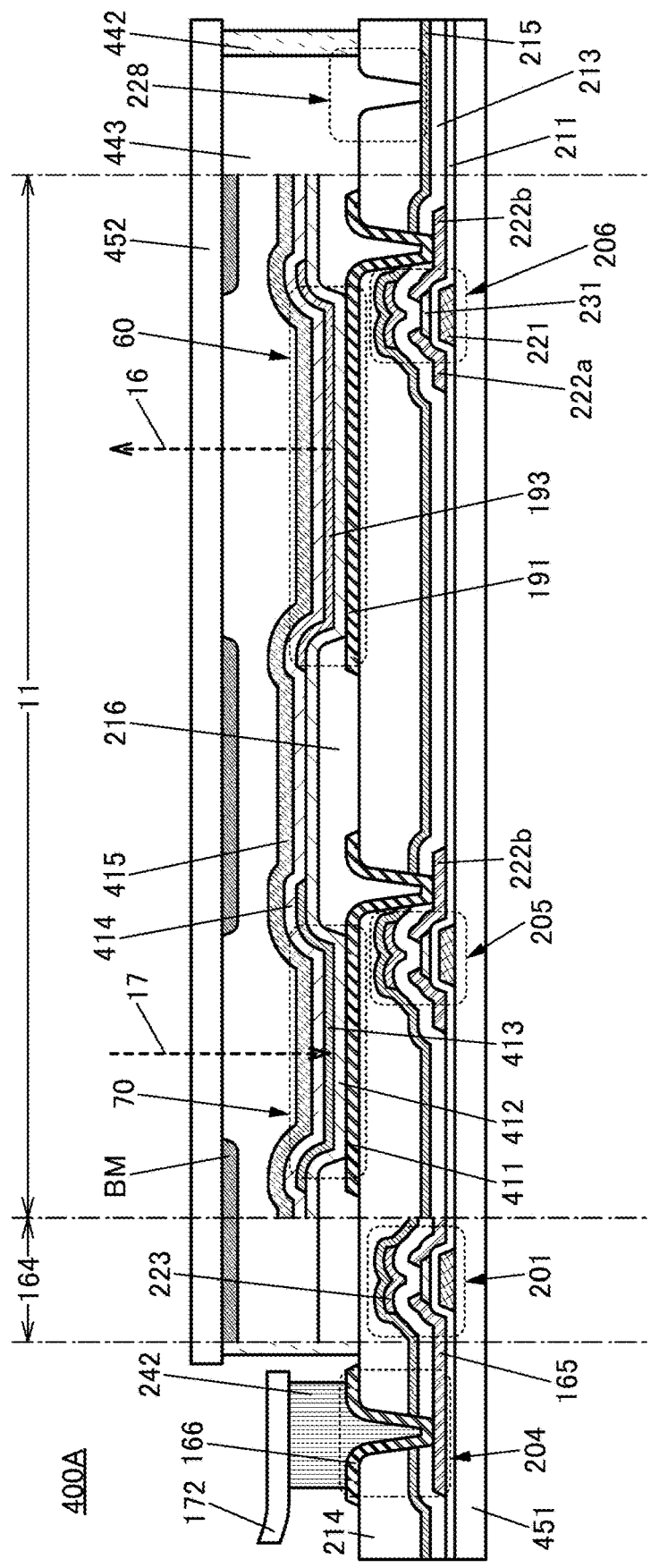
FIG. 27 is a cross-sectional view illustrating a structure example of a display device.

The display device 400A illustrated in FIG. 27 includes a transistor 201, a transistor 205, a transistor 206, the light-emitting device 60, the light-receiving device 70, and the like between the substrate 451 and the substrate 452.

The substrate 452 and the insulating layer 214 are attached to each other with the adhesive layer 442. A solid sealing structure, a hollow sealing structure, or the like can be employed to seal the light-emitting device 60 and the light-receiving device 70. In FIG. 27, a space 443 surrounded by the substrate 452, the adhesive layer 442, and the insulating layer 214 is filled with an inert gas (e.g., nitrogen or argon), that is, a hollow sealing structure is employed. The adhesive layer 442 may be provided so as to overlap with the light-emitting device 60. The space 443 surrounded with the substrate 452, the adhesive layer 442, and the insulating layer 214 may be filled with a resin different from that of the adhesive layer 442.

The light-emitting device 60 has a stacked-layer structure in which the pixel electrode 191, the common layer 412, the light-emitting layer 193, the common layer 414, and the common electrode 415 are stacked in this order from the insulating layer 214 side. The pixel electrode 191 is connected to a conductive layer 222b included in the transistor 206 through an opening provided in the insulating layer 214. The transistor 206 has a function of controlling driving of the light-emitting device 60. The end portion of the pixel electrode 191 is covered with the partition 216. The pixel electrode 191 includes a material that reflects visible light, and the common electrode 415 includes a material that transmits visible light.

The light-receiving device 70 has a stacked-layer structure in which the pixel electrode 411, the common layer 412, the active layer 413, the common layer 414, and the common electrode 415 are stacked in this order from the insulating layer 214 side. The pixel electrode 411 is electrically connected to the conductive layer 222b included in the transistor 205 through an opening provided in the insulating layer 214. The end portion of the pixel electrode 411 is covered with the partition 216. The pixel electrode 411 includes a material that reflects visible light, and the common electrode 415 includes a material that transmits visible light.

Light emitted from the light-emitting device 60 is emitted toward the substrate 452 side. Light enters the light-receiving device 70 through the substrate 452 and the space 443. For the substrate 452, a material having a high visible-light-transmitting property is preferably used.

The pixel electrode 411 and the pixel electrode 191 can be formed using the same material in the same process. The common layer 412, the common layer 414, and the common electrode 415 are used in both the light-receiving device 70 and the light-emitting device 60. The light-receiving device 70 and the light-emitting device 60 can have the same structure except the structures of the active layer 413 and the light-emitting layer 193. Thus, the light-receiving device 70 can be incorporated in the display device 400A without a significant increase in the number of manufacturing steps.

A light-blocking layer BM is provided on a surface of the substrate 452 that is on the substrate 451 side. The light-blocking layer BM has openings at a position overlapping with the light-receiving device 70 and at a position overlapping with the light-emitting device 60. Providing the light-blocking layer BM can control the range where the light-receiving device 70 senses light. Furthermore, with the light-blocking layer BM, direct incidence of light from the light-emitting device 60 on the light-receiving device 70 without through a target can be inhibited. Hence, a sensor with less noise and high sensitivity can be obtained.

The transistor 201, the transistor 205, and the transistor 206 are all formed over the substrate 451. These transistors can be formed using the same materials in the same process.

An insulating layer 211, an insulating layer 213, an insulating layer 215, and the insulating layer 214 are provided in this order over the substrate 451. Part of the insulating layer 211 functions as gate insulating layers of the transistors. Part of the insulating layer 213 functions as gate insulating layers of the transistors. The insulating layer 215 is provided so as to cover the transistors. The insulating layer 214 is provided so as to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, an aluminum nitride film, or the like which is an inorganic insulating film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 400A. This can inhibit entry of impurities from the end portion of the display device 400A through the organic insulating film. Alternatively, the organic insulating film may be formed such that an end portion of the organic insulating film is positioned inward from the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 27, an opening is formed in the insulating layer 214. Thus, the entry of impurities into the display portion 11 from the outside through the insulating layer 214 can be inhibited even when an organic insulating film is used for the insulating layer 214. Thus, the reliability of the display device 400A can be increased.

Each of the transistor 201, the transistor 205, and the transistor 206 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or bottom-gate transistor structure may be used. Alternatively, gates may be provided above and below a semiconductor layer in which a channel is formed.

The structure in which the semiconductor layer where a channel is formed is provided between two gates is used for the transistor 201, the transistor 205, and the transistor 206. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity other than single crystal is preferably used, in which case deterioration of the transistor characteristics can be suppressed.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one kind or two or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one kind or two or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target including a polycrystalline oxide is preferably used as the sputtering target, in which case the semiconductor layer having crystallinity is easily formed. Note that the atomic ratio in the semiconductor layer to be formed may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be formed is sometimes in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in a circuit 164 and the transistor included in the display portion 11 may have the same structure or different structures. A plurality of transistors included in the circuit 164 may have the same structure or two or more kinds of structures. Similarly, a plurality of transistors included in the display portion 11 may have the same structure or two or more kinds of structures. The circuit 164 can be the gate driver circuit 13 or the row driver circuit 19 described in Embodiment 1, for example.

A connection portion 204 is provided in a region of the substrate 451 that does not overlap with the substrate 452. In the connection portion 204, the wiring 165 is electrically connected to the FPC 172 via a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer side of the substrate 452. Examples of the optical members include a polarizing plate, a retardation plate, a light diffusion layer (e.g., diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outer side of the substrate 452.

For each of the substrate 451 and the substrate 452, glass, quartz, ceramic, sapphire, resin, or the like can be used. When a flexible material is used for the substrate 451 and the substrate 452, the flexibility of the display device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting device 60 has a top-emission structure, a bottom-emission structure, a dual-emission structure, or the like. A conductive film that transmits visible light is used as the electrode through which light is extracted. A conductive film that reflects visible light is preferably used as the electrode through which no light is extracted.

The light-emitting device 60 includes at least the light-emitting layer 193. The light-emitting device 60 may further include, as a layer other than the light-emitting layer 193, a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like. For example, the common layer 412 preferably includes one or both of a hole-injection layer and a hole-transport layer. For example, the common layer 414 preferably includes one or both of an electron-transport layer and an electron-injection layer.

For the common layer 412, the light-emitting layer 193, and the common layer 414, either a low molecular compound or a high molecular compound may be used, and the common layer 412, the light-emitting layer 193, and the common layer 414 may also contain an inorganic compound. The layers that constitute the common layer 412, the light-emitting layer 193, and the common layer 414 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The active layer 413 of the light-receiving device 70 includes a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 of the light-emitting device 60 and the active layer 413 of the light-receiving device 70 can be formed by the same method (e.g., a vacuum evaporation method) and thus the same manufacturing apparatus can be used.

Examples of an n-type semiconductor material included in the active layer 413 are electron-accepting organic semiconductor materials such as fullerene (e.g., $C_{60}$ and $C_{70}$) and derivatives thereof. As a p-type semiconductor material contained in the active layer 413, an electron-donating organic semiconductor material such as copper(II) phthalocyanine (CuPc) or tetraphenyldibenzoperiflanthene (DBP) can be enumerated.

For example, the active layer 413 is preferably formed through co-evaporation of an n-type semiconductor and a p-type semiconductor.

As materials that can be used for conductive layers such as a variety of wirings and electrodes that constitute the display device, in addition to a gate, a source, and a drain of a transistor, a metal such as aluminum, titanium, chromium, nickel, copper, yttrium, zirconium, molybdenum, silver, tantalum, or tungsten, an alloy containing the metal as its main component, and the like can be enumerated. A single-layer structure or a stacked-layer structure including a film containing such a material can be used.

As a light-transmitting conductive material, a conductive oxide such as indium oxide, indium tin oxide, indium zinc oxide, zinc oxide, or zinc oxide containing gallium, or graphene can be used. A metal material such as gold, silver, platinum, magnesium, nickel, tungsten, chromium, molybdenum, iron, cobalt, copper, palladium, or titanium, or an alloy material containing the metal material can also be used. A nitride of the metal material (e.g., titanium nitride) or the like may also be used. Note that in the case of using the metal material or the alloy material (or the nitride thereof), the thickness is preferably set small enough to be able to transmit light. A stacked film of the above materials can be used as a conductive layer. For example, a stacked film or the like of indium tin oxide and an alloy of silver and magnesium is preferably used because it can increase the conductivity. These can also be used for conductive layers such as a variety of wirings and electrodes that constitute a display device, and conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be enumerated.

FIG. 28A shows a cross-sectional view of a display device 400B.

The display device 400B is different from the display device 400A mainly in that the lens 449 and the protective layer 195 are included.

Providing the protective layer 195 covering the light-receiving device 70 and the light-emitting device 60 can inhibit entry of impurities such as water into the light-receiving device 70 and the light-emitting device 60, so that the reliability of the light-receiving device 70 and the light-emitting device 60 can be increased.

In the region 228 in the vicinity of an end portion of the display device 400B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. This can inhibit entry of impurities from the outside into the display portion 11 through the organic insulating film. Thus, the reliability of the display device 400B can be increased.

FIG. 28B illustrates an example in which the protective layer 195 has a three-layer structure. In FIG. 28B, the protective layer 195 includes an inorganic insulating layer 195a over the common electrode 415, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving device 70 and the light-emitting device 60 can be surrounded by the insulating layer 215 and the protective layer 195, whereby the reliability of the light-receiving device 70 and the light-emitting device 60 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The lens 449 is provided on the surface of the substrate 452 that faces the substrate 451. The lens 449 has a convex surface on the substrate 451 side. It is preferable that the light-receiving region of the light-receiving device 70 overlap with the lens 449 and not overlap with the light-emitting layer 193. This can increase the sensitivity and accuracy of a sensor using the light-receiving device 70.

The lens 449 preferably has a refractive index greater than or equal to 1.3 and less than or equal to 2.5. The lens 449 can be formed using an inorganic material or an organic material. For example, a material containing a resin can be used for the lens 449. A material containing an oxide or a sulfide can be used for the lens 449.

Specifically, a resin containing chlorine, bromine, or iodine, a resin containing a heavy metal atom, a resin having an aromatic ring, a resin containing sulfur, or the like can be used for the lens 449. Alternatively, a material containing a resin and nanoparticles of a material having a higher refractive index than the resin can be used for the lens 449. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens 449. Alternatively, zinc sulfide or the like can be used for the lens 449.

In the display device 400B, the protective layer 195 and the substrate 452 are bonded to each other with the adhesive layer 442. The adhesive layer 442 is provided so as to overlap with the light-receiving device 70 and the light-emitting device 60; that is, the display device 400B employs a solid sealing structure.

FIG. 29A shows a cross-sectional view of a display device 400C.

The display device 400C differs from the display device 400B in transistor structures.

The display device 400C includes a transistor 208, a transistor 209, and a transistor 210 over the substrate 451.

Each of the transistor 208, the transistor 209, and the transistor 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 225 and the insulating layer 215. One of the conductive layer 222a and the conductive layer 222b serves as a source, and the other serves as a drain.

The pixel electrode 191 of the light-emitting device 60 is electrically connected to the one of the pair of low-resistance regions 231n of the transistor 208 through the conductive layer 222b.

The pixel electrode 411 of the light-receiving device 70 is electrically connected to the other of the pair of low-resistance regions 231n of the transistor 209 through the conductive layer 222b.

FIG. 29A illustrates an example in which the insulating layer 225 covers the top surface and a side surface of the semiconductor layer. Meanwhile, in FIG. 29B, the insulating layer 225 overlaps with the channel formation region 231i of the semiconductor layer 231 and does not overlap with the low-resistance regions 231n. The structure illustrated in FIG. 29B can be obtained by processing the insulating layer 225 with the conductive layer 223 as a mask, for example. In FIG. 29B, the insulating layer 215 is provided so as to cover the insulating layer 225 and the conductive layer 223, and the conductive layer 222a and the conductive layer 222b are connected to the corresponding low-resistance regions 231n through the openings in the insulating layer 215. Furthermore, an insulating layer 218 covering the transistor may be provided.

Figure 30:
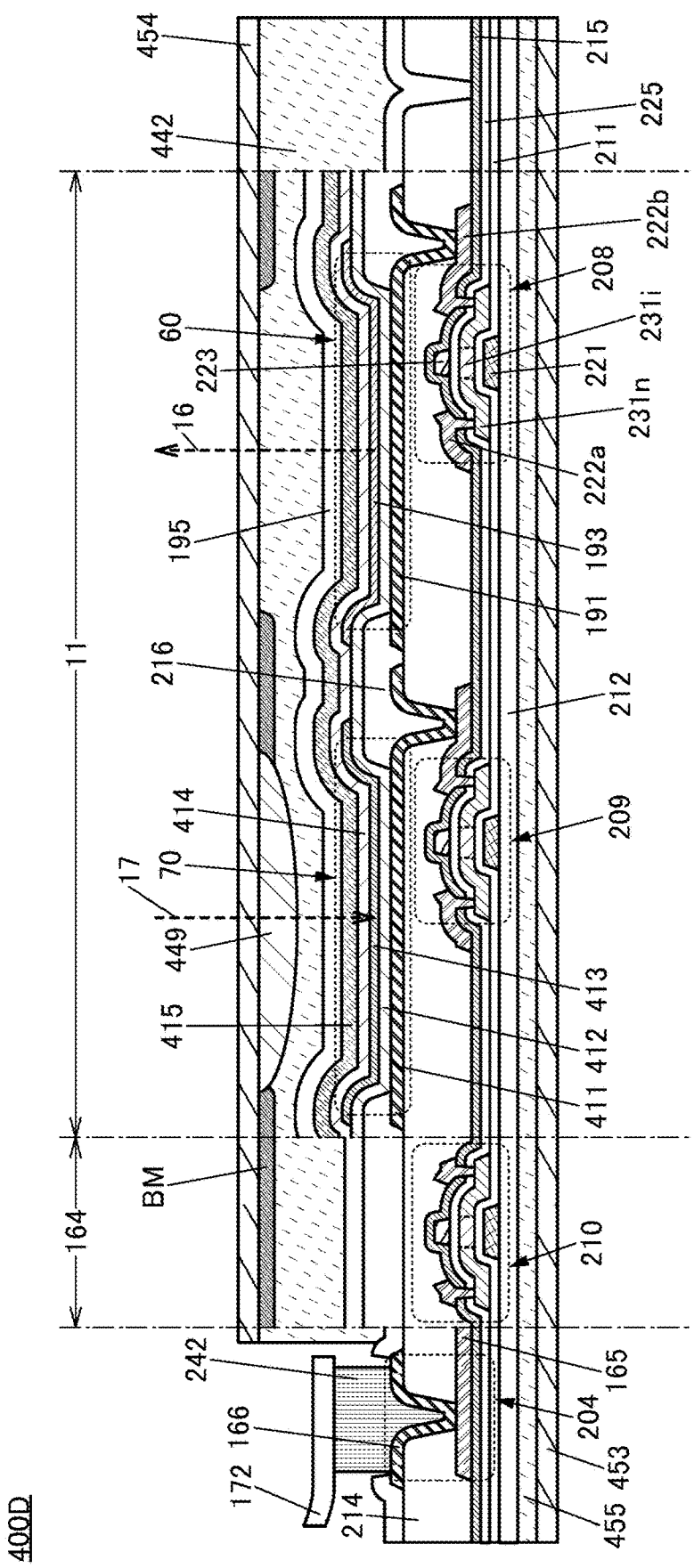
FIG. 30 is a cross-sectional view illustrating a structure example of a display device.

FIG. 30 shows a cross-sectional view of a display device 400D.

The display device 400D differs from the display device 400C mainly in that the substrate 451 and the substrate 452 are not included, the substrate 453, the substrate 454, the adhesive layer 455, and the insulating layer 212 are included, and the lens 449 is included.

The substrate 453 and the insulating layer 212 are bonded to each other with the adhesive layer 455. The substrate 454 and the protective layer 195 are bonded to each other with the adhesive layer 442.

The display device 400D has a structure obtained in such a manner that the insulating layer 212, the transistor 208, the transistor 209, the transistor 210, the light-receiving device 70, the light-emitting device 60, and the like are formed over a formation substrate and then transferred onto the substrate 453. The substrate 453 and the substrate 454 preferably have flexibility. This can increase the flexibility of the display device 400D.

The inorganic insulating film that can be used as the insulating layer 211, the insulating layer 213, and the insulating layer 215 can be used as the insulating layer 212.

The display device 400C shows an example in which the lens 449 is not provided, and the display device 400D shows an example in which the lens 449 is provided. The lens 449 can be provided as appropriate in accordance with usage of a sensor, or the like.

As described above, the display device of this embodiment includes a light-receiving device and a light-emitting device in a display portion, and the display portion has both a function of displaying an image and a function of sensing light. Thus, the size and weight of an electronic device can be reduced as compared to the case where a sensor is provided outside a display portion or outside a display device. Moreover, an electronic device having more functions can be obtained by a combination of the display device of this embodiment and a sensor provided outside the display portion or outside the display device.

In the light-receiving device, at least one of the layers other than the active layer can have a structure in common with a layer in the light-emitting device (EL device). Also in the light-receiving device, all of the layers other than the active layer can have structures in common with the layers in the light-emitting device (EL device). For example, the light-emitting device and the light-receiving device can be formed over one substrate only by adding a step of forming the active layer in the manufacturing process of the light-emitting device. In the light-receiving device and the light-emitting device, their pixel electrodes can be formed using the same material in the same process, and their common electrodes can be formed using the same material in the same process. When a circuit electrically connected to the light-receiving device and a circuit electrically connected to the light-emitting device are formed using the same materials in the same process, the manufacturing process of the display device can be simplified. In such a manner, a display device that incorporates a light-receiving device and is highly convenient can be manufactured without complicated steps.

The display device of this embodiment includes a coloring layer between the light-receiving device and the light-emitting device. A partition that electrically isolates the light-receiving device and the light-emitting device may also function as the coloring layer. The coloring layer can absorb stray light in the display device, which can increase the sensitivity of a sensor using the light-receiving device.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification, as appropriate.

Embodiment 3

In this embodiment, structure examples of semiconductor devices that can be used for the IC 20 described in Embodiment 1 will be described. As an example, a structure in which transistors having different electrical characteristics are stacked will be described. With the structure, the degree of freedom in design of the semiconductor device can be increased. Stacking transistors having different electrical characteristics can increase the degree of integration of the semiconductor device.

Figure 31:
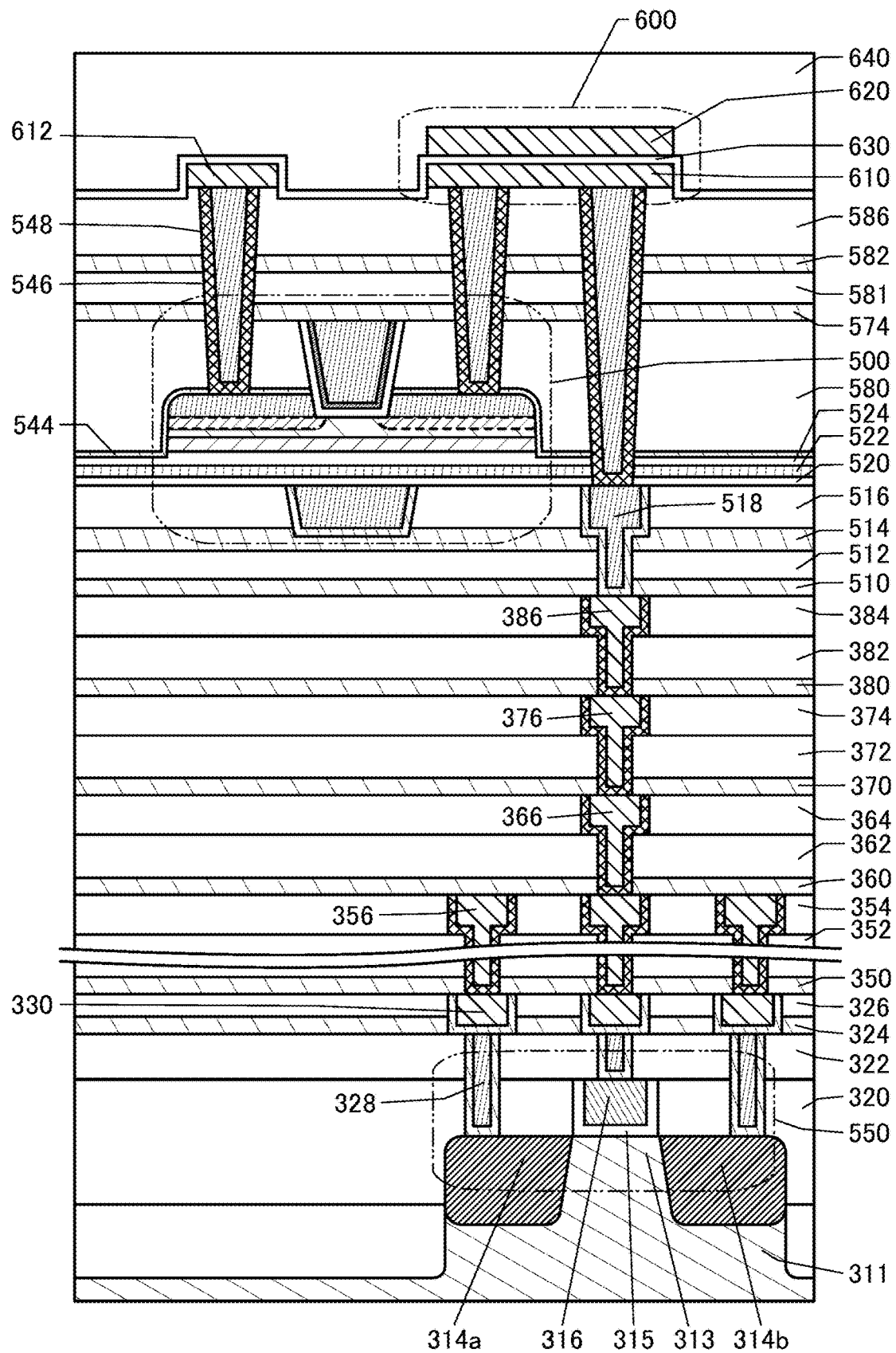
FIG. 31 is a cross-sectional view illustrating a structure example of a semiconductor device.
Figure 33A:
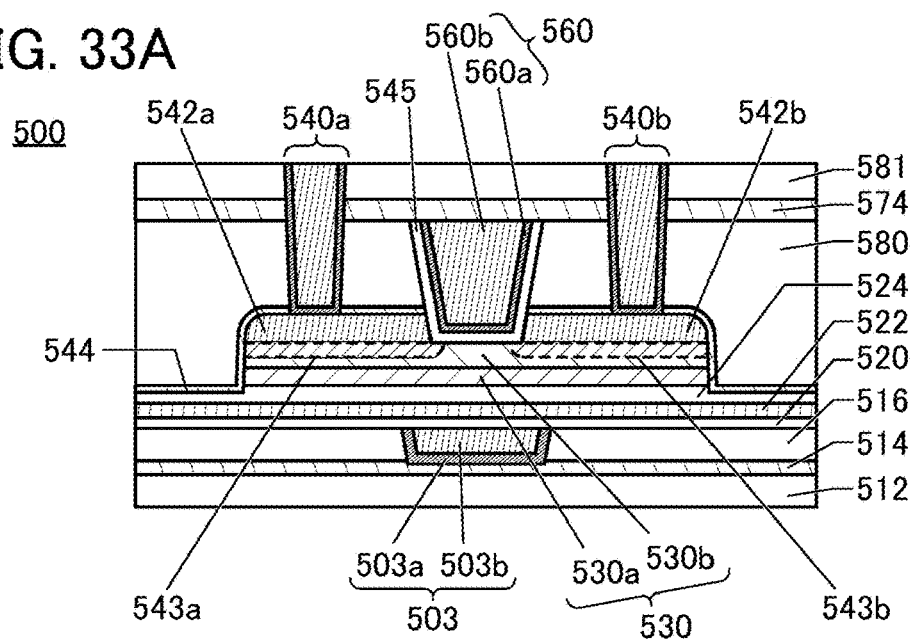
FIG. 33A to FIG. 33C are cross-sectional views illustrating transistor structure examples.
Figure 33B:
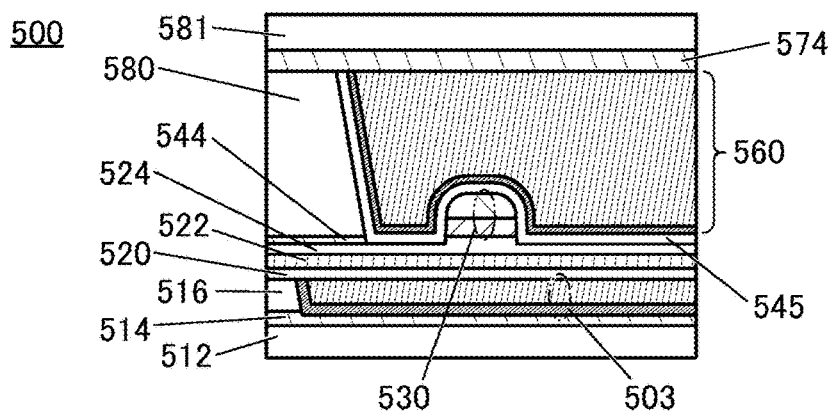
Figure 33C:
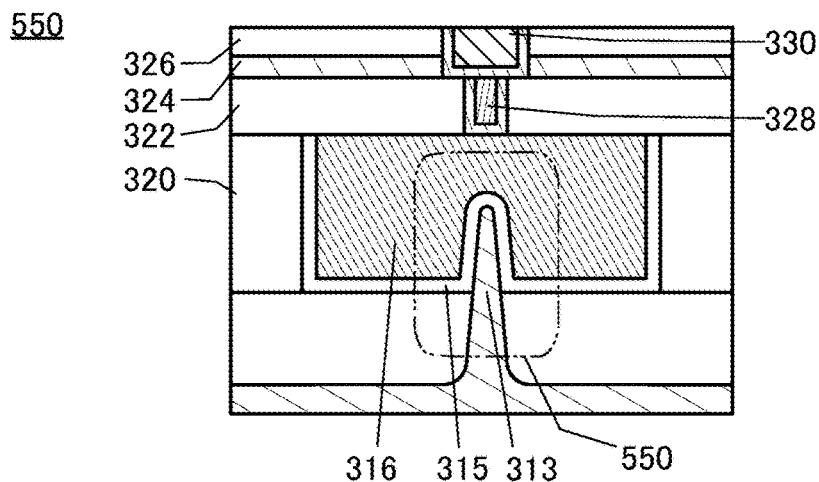

FIG. 31 shows part of a cross-sectional structure of a semiconductor device. A semiconductor device shown in FIG. 31 includes a transistor 550, a transistor 500, and a capacitor 600. FIG. 33A is a cross-sectional view of the transistor 500 in the channel length direction, FIG. 33B is a cross-sectional view of the transistor 500 in the channel width direction, and FIG. 33C is a cross-sectional view of the transistor 550 in the channel width direction.

The transistor 500 is an OS transistor. The transistor 500 has an extremely low off-state current. Accordingly, a data voltage or electric charge written to a storage node through the transistor 500 can be retained for a long time. In other words, power consumption of the semiconductor device can be reduced because a storage node has a low frequency of refresh operation or requires no refresh operation.

In FIG. 31, the transistor 500 is provided above the transistor 550, and the capacitor 600 is provided above the transistor 550 and the transistor 500.

The transistor 550 is provided over a substrate 311 and includes a conductor 316, an insulator 315, a semiconductor region 313 that is part of the substrate 311, and a low-resistance region 314a and a low-resistance region 314b functioning as a source region and a drain region.

As shown in FIG. 33C, in the transistor 550, the top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (Silicon on Insulator) substrate, for example.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature heating; or an SOI substrate formed using a Smart-Cut method in which a semiconductor substrate is cleaved by utilizing growth of a minute void, which is formed by implantation of a hydrogen ion, due to thermal treatment, an ELTRAN method (a registered trademark: Epitaxial Layer Transfer), or the like. A transistor formed using a single crystal substrate contains a single crystal semiconductor in a channel formation region.

Figure 32:
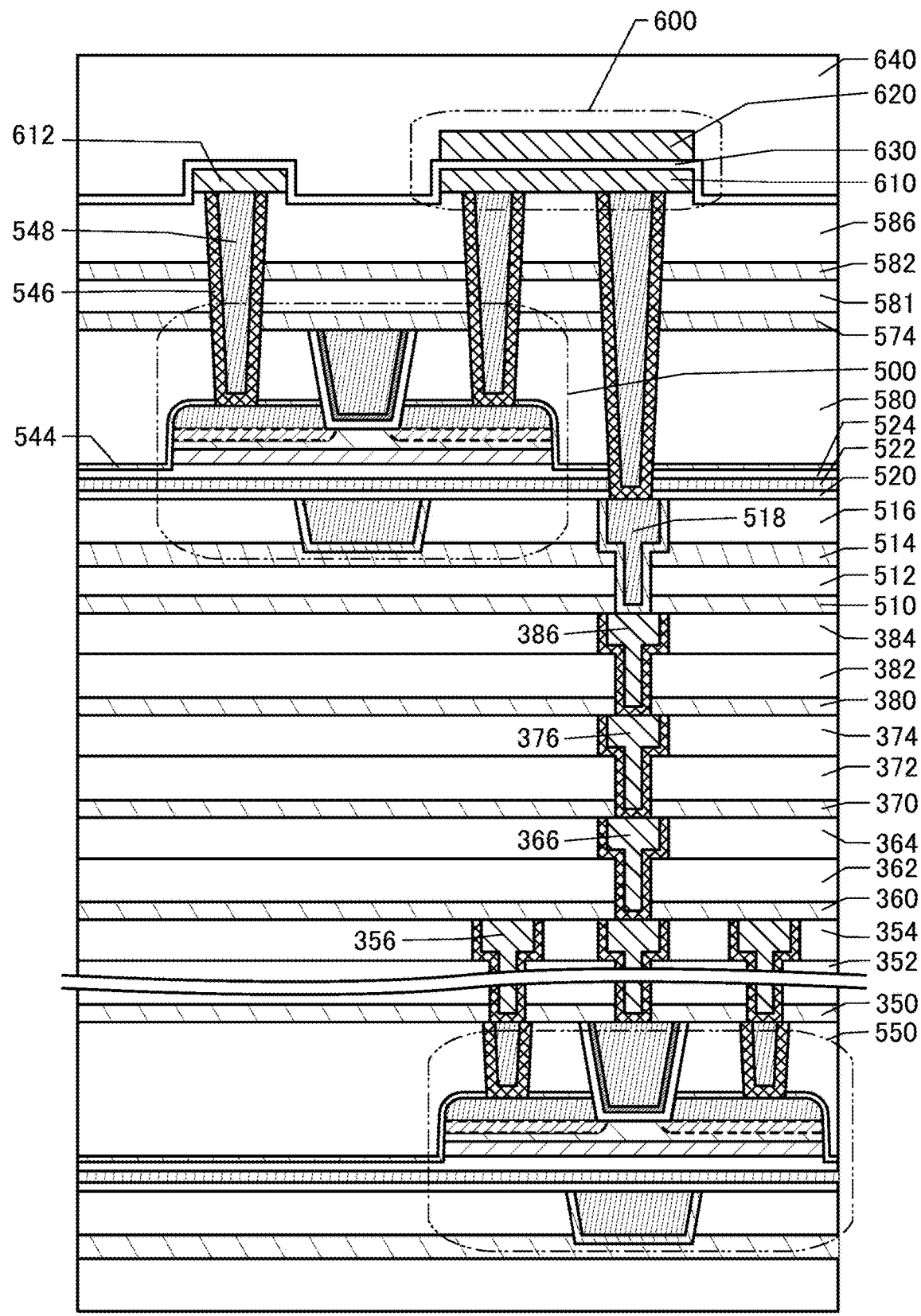
FIG. 32 is a cross-sectional view illustrating a structure example of a semiconductor device.

Note that the transistor 550 shown in FIG. 31 is an example and the structure is not limited thereto; an appropriate transistor can be used in accordance with a circuit configuration or a driving method. In the case where a semiconductor device is a single-polarity circuit where all the transistors are the OS transistors and have the same conductivity (which means that all the transistors are the same-polarity transistors such as n-channel transistors), for example, the transistor 550 has a structure similar to that of the transistor 500 as shown in FIG. 32. Note that the details of the transistor 500 will be described later.

An insulator 320, an insulator 322, an insulator 324, and an insulator 326 are stacked sequentially so as to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, the top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 31, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity of a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 31, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 31, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 31, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property against hydrogen or impurities from the substrate 311, a region where the transistor 550 is provided, or the like to the region where the transistor 500 is provided. Therefore, a material similar to that for the insulator 324 can be used.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen or moisture which are factors of change in electrical characteristics of the transistor. Accordingly, aluminum oxide can prevent mixing of impurities such as hydrogen or moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As shown in FIG. 33A and FIG. 33B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed so as to overlap with a region between the conductor 542a and the conductor 542b; an insulator 545 positioned on a bottom surface and a side surface of an opening; and a conductor 560 positioned on a formation surface of the insulator 545.

In addition, as shown in FIG. 33A and FIG. 33B, an insulator 544 is preferably positioned between the insulator 580 and the oxide 530a, the oxide 530b, the conductor 542a, and the conductor 542b. Furthermore, as illustrated in FIG. 33A and FIG. 33B, the conductor 560 preferably includes a conductor 560a provided on an inner side of the insulator 545 and a conductor 560b provided so as to be embedded on the inner side of the conductor 560a. Moreover, as shown in FIG. 33A and FIG. 33B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is shown, the present invention is not limited thereto. For example, it is possible to employ a structure in which a single layer of the oxide 530b or a stacked-layer structure of three or more layers is provided.

Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistors 500 shown in FIG. 31, FIG. 32, and FIG. 33A are merely examples, and the structures are not limited thereto; an appropriate transistor can be used in accordance with a circuit configuration or a driving method, for example.

Here, the conductor 560 functions as a gate electrode of the transistor, and the conductor 542a and the conductor 542b function as a source electrode and a drain electrode. As described above, the conductor 560 is formed so as to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved; thus, the transistor 500 can have improved frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, the threshold voltage of the transistor 500 can be further increased and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned so as to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (s-channel) structure. The s-channel structure disclosed in this specification and the like is different from a Fin-type structure and a planar structure. With the s-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the film by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies (Vo) in the oxide 530 can be reduced and the reliability of the transistor 500 can be improved. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture or hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose VoH is sufficiently reduced. When an oxide semiconductor with sufficiently reduced impurities such as VoH is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator near the oxide 530 in some cases. Some hydrogen may be gettered into the conductor 542a or the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio (O$_2$/(O$_2$+Ar)) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. In that case, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of VoH.

In addition, in the case where the insulator 524 includes an excess-oxygen region, it is preferable that the insulator 522 have a function of inhibiting diffusion of oxygen (e.g., an oxygen atom, an oxygen molecule, or the like) (oxygen be unlikely to pass through the insulator 522).

When the insulator 522 has a function of inhibiting diffusion of oxygen or impurities, oxygen contained in the oxide 530 is not diffused to the insulator 520 side, which is preferable. Furthermore, a reaction of the conductor 503 with oxygen contained in the insulator 524 or the oxide 530 can be inhibited.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during the transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative permittivity.

Note that in the transistor 500 in FIG. 33A and FIG. 33B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one kind or two or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, tin, magnesium, and the like) is preferably used.

The metal oxide functioning as an oxide semiconductor may be formed by a sputtering method or an ALD (Atomic Layer Deposition) method. Note that the metal oxide functioning as an oxide semiconductor will be described in detail in another embodiment.

The metal oxide functioning as the channel formation region in the oxide 530 has a band gap that is preferably 2 eV or higher, further preferably 2.5 eV or higher. With use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably lower than the electron affinity of the oxide 530b.

Here, the energy level of the conduction band minimum gently changes at a junction portion between the oxide 530a and the oxide 530b. In other words, the energy level of the conduction band minimum at the junction portion between the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is used as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 33A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as shown in FIG. 33A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided so as to cover the conductor 542a and the conductor 542b and inhibits oxidation of the conductor 542a and the conductor 542b. At this time, the insulator 544 may be provided so as to cover a side surface of the oxide 530 and be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during the transistor operation can be reduced while the physical thickness is maintained. Furthermore, the stacked-layer structure can be thermally stable and have a high relative permittivity.

Although the conductor 560 that functions as the first gate electrode and has a two-layer structure is shown in FIG. 33A and FIG. 33B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in the conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed so as to overlap with the region between the conductor 542a and the conductor 542b. Accordingly, the conductor 560 is formed so as to be embedded in the opening of the insulator 580 and the region between the conductor 542a and the conductor 542b.

The gate length needs to be short for miniaturization of the semiconductor device, but it is necessary to prevent a reduction in the conductivity of the conductor 560. When the conductor 560 is made thick to achieve this, the conductor 560 might have a shape with a high aspect ratio. In this embodiment, the conductor 560 is provided so as to be embedded in the opening of the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided so as to face each other with the conductor 560 therebetween. The structures of the conductor 540a and the conductor 540b are similar to the structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen or moisture which are factors of change in electrical characteristics of the transistor. Accordingly, aluminum oxide can prevent mixing of impurities such as hydrogen or moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed so as to surround the transistor 500 and an insulator having a high barrier property against hydrogen or water may be formed so as to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed so as to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. For the insulator having a high barrier property against hydrogen or water, a material similar to that for the insulator 522 or the insulator 514 is used, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided so as to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With use of this structure, a semiconductor device using a transistor including an oxide semiconductor can be miniaturized or highly integrated.

The structure illustrated in FIG. 33A and FIG. 33B can be applied to transistors included in the pixel 12 described in Embodiment 1. As described above, the area occupied by transistors with the structure illustrated in FIG. 33A and FIG. 33B is small. Thus, the pixels 12 can have higher resolution, and the pixel density of the display device 10 can be increased. For example, in the case where the display device 10 has the configuration illustrated in FIG. 2A or FIG. 2B and the structure illustrated in FIG. 33A and FIG. 33B is used for all the transistors included in the pixel 12, the pixel density of the display device 10 can be 1000 ppi or more, 3000 ppi or more, or 5000 ppi or more.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as an acrylic resin. Other examples are polypropylene, polyester, polyvinyl fluoride, and polyvinyl chloride. Other examples are polyamide, polyimide, an aramid resin, an epoxy resin, an inorganic vapor deposition film, paper, and the like. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Modification Example 1 of Transistor

Figure 34A:
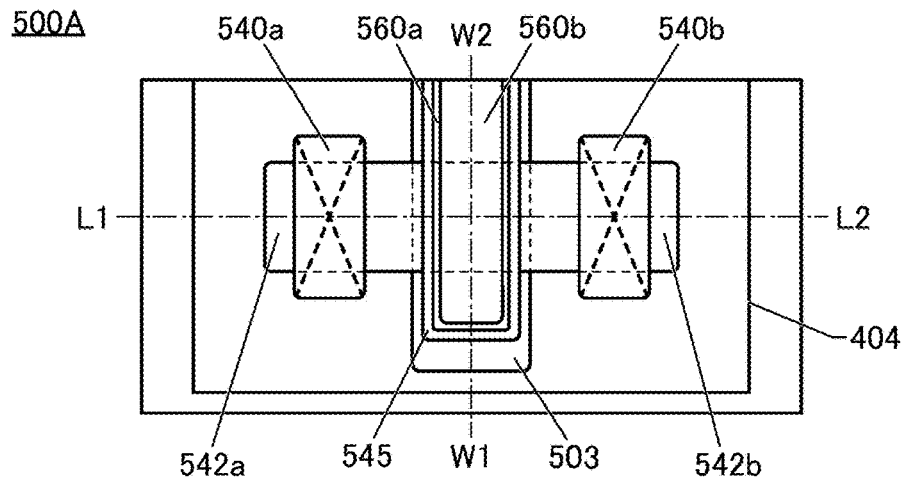
FIG. 34A is a top view illustrating a transistor structure example.
Figure 34B:
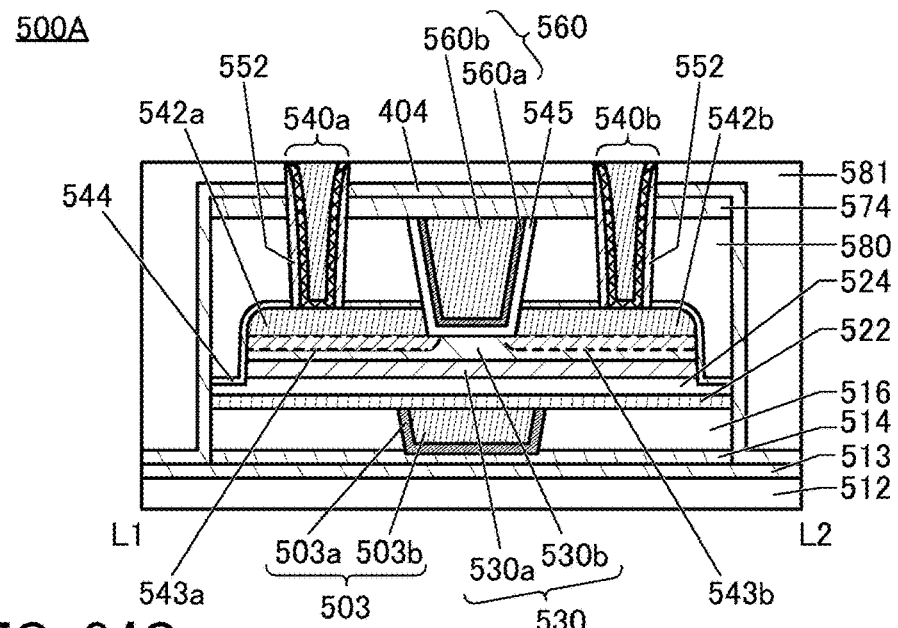
FIG. 34B and FIG. 34C are cross-sectional views illustrating a transistor structure example.
Figure 34C:
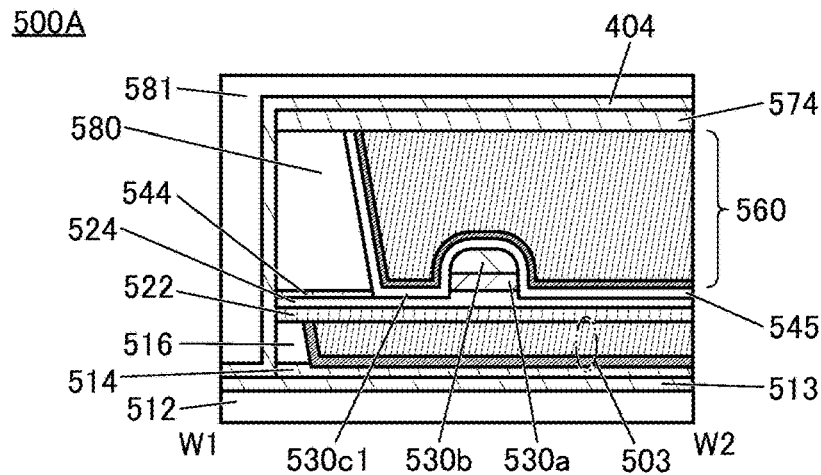

A transistor 500A shown in FIG. 34A, FIG. 34B, and FIG. 34C is a modification example of the transistor 500 having the structure shown in FIG. 33A and FIG. 33B. FIG. 34A is a top view of the transistor 500A, FIG. 34B is a cross-sectional view of the transistor 500A in the channel length direction, and FIG. 34C is a cross-sectional view of the transistor 500A in the channel width direction. Note that for clarity of the drawing, some components are not shown in the top view of FIG. 34A. The structure shown in FIG. 34A, FIG. 34B, and FIG. 34C can also be used for other transistors such as the transistor 550 included in the semiconductor device of one embodiment of the present invention.

The transistor 500A having the structure illustrated in FIG. 34A, FIG. 34B, and FIG. 34C is different from the transistor 500 having the structure illustrated in FIG. 33A and FIG. 33B in that an insulator 552, an insulator 513, and an insulator 404 are included. Furthermore, the transistor 500A is different from the transistor 500 having the structure shown in FIG. 33A and FIG. 33B in that the insulator 552 is provided in contact with a side surface of the conductor 540a and a side surface of the conductor 540b. Moreover, the transistor 500A is different from the transistor 500 having the structure shown in FIG. 33A and FIG. 33B in that the insulator 520 is not included.

In the transistor 500A having the structure shown in FIG. 34A, FIG. 34B, and FIG. 34C, the insulator 513 is provided over the insulator 512. The insulator 404 is provided over the insulator 574 and the insulator 513.

In the transistor 500A having the structure shown in FIG. 34A, FIG. 34B, and FIG. 34C, the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and the top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. The use of a material having a high hydrogen barrier property for the insulator 552 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Modification Example 2 of Transistor

Figure 35A:
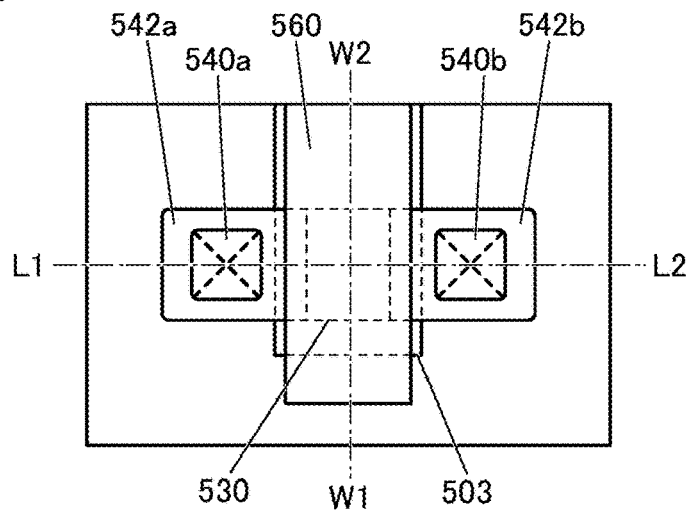
FIG. 35A is a top view illustrating a transistor structure example.
Figure 35B:
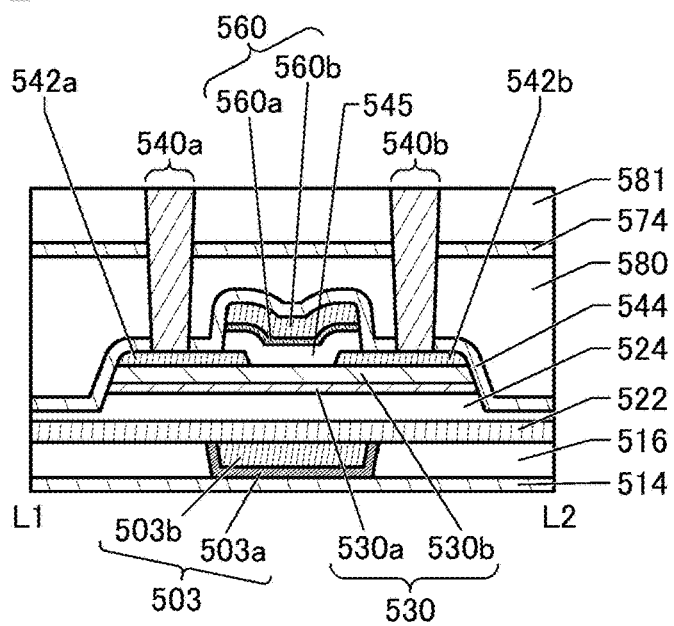
FIG. 35B and FIG. 35C are cross-sectional views illustrating a transistor structure example.
Figure 35C:
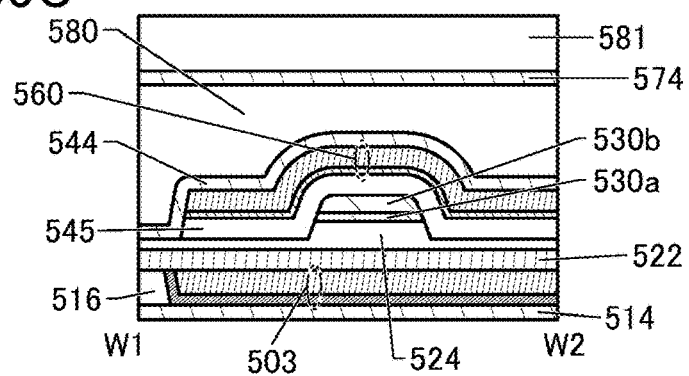

A structure example of a transistor 500B is described with reference to FIG. 35A, FIG. 35B, and FIG. 35C. FIG. 35A is a top view of the transistor 500B. FIG. 35B is a cross-sectional view of a portion indicated by dashed-dotted line L1-L2 in FIG. 35A. FIG. 35C is a cross-sectional view of a portion indicated by a dashed-dotted line W1-W2 in FIG. 35A. Note that for clarity of the drawing, some components are not shown in the top view of FIG. 35A.

The transistor 500B is a modification example of the transistor 500 and can be replaced with the transistor 500. Thus, differences of the transistor 500B from the transistor 500 will be mainly described to avoid repeated description.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be extended. That is, the conductor 560a inhibits oxidation of the conductor 560b, thereby preventing a decrease in conductivity.

The insulator 544 is preferably provided so as to cover the top surface and the side surface of the conductor 560 and a side surface of the insulator 545. For the insulator 544, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping with part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in combination as appropriate with the compositions, structures, methods, and the like described in the other embodiments, the example, and the like.

Embodiment 4

In this embodiment, an oxide semiconductor which is a kind of metal oxides will be described.

The metal oxide preferably contains at least indium or zinc. In particular, indium and zinc are preferably contained. In addition, aluminum, gallium, yttrium, tin, or the like is preferably contained. Furthermore, one kind or two or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, classifications of the crystal structures of an oxide semiconductor will be described with reference to FIG. 36A. FIG. 36A is a diagram showing classifications of crystal structures of an oxide semiconductor, typically IGZO (metal oxide containing In, Ga, and Zn).

As shown in FIG. 36A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 36A are in an intermediate state between "Amorphous" and "Crystal", and belong to a new boundary region (New crystalline phase). That is, these structures are completely different from "Amorphous", which is energetically unstable, and "Crystal".

A crystal structure of a film or a substrate can be analyzed with an X-ray diffraction (XRD) spectrum. Here, FIG. 36B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 36B and obtained by GIXD measurement is hereinafter simply referred to as an XRD spectrum. The vertical axis and the horizontal axis in FIG. 36B represent intensity and 2θ, respectively. The CAAC-IGZO film shown in FIG. 36B has a composition in the neighborhood of In:Ga:Zn=4:2:3 [atomic ratio]. The CAAC-IGZO film shown in FIG. 36B has a thickness of 500 nm.

As shown in FIG. 36B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 36B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 36C shows a diffraction pattern of the CAAC-IGZO film. FIG. 36C shows a diffraction pattern obtained with NBED in which an electron beam is incident in the direction parallel to the substrate. The CAAC-IGZO film in FIG. 36C has a composition in the neighborhood of In:Ga:Zn=4:2:3 [atomic ratio]. In the nanobeam electron diffraction method, electron diffraction is performed with a probe diameter of 1 nm.

As shown in FIG. 36C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 36A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one kind or two or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. The CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be fabricated.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described in this embodiment can be used in combination as appropriate with the compositions, structures, methods, and the like described in the other embodiments, the example, and the like.

Embodiment 5

In this embodiment, electronic devices of one embodiment of the present invention will be described with reference to FIG. 37, FIG. 38, and FIG. 39.

An electronic device in this embodiment includes the display device of one embodiment of the present invention. For example, the display device of one embodiment of the present invention can be used in a display portion of the electronic device. The display device of one embodiment of the present invention has a function of sensing light, and thus can perform biometric authentication on the display portion or sense a touch or a near touch on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 37A:
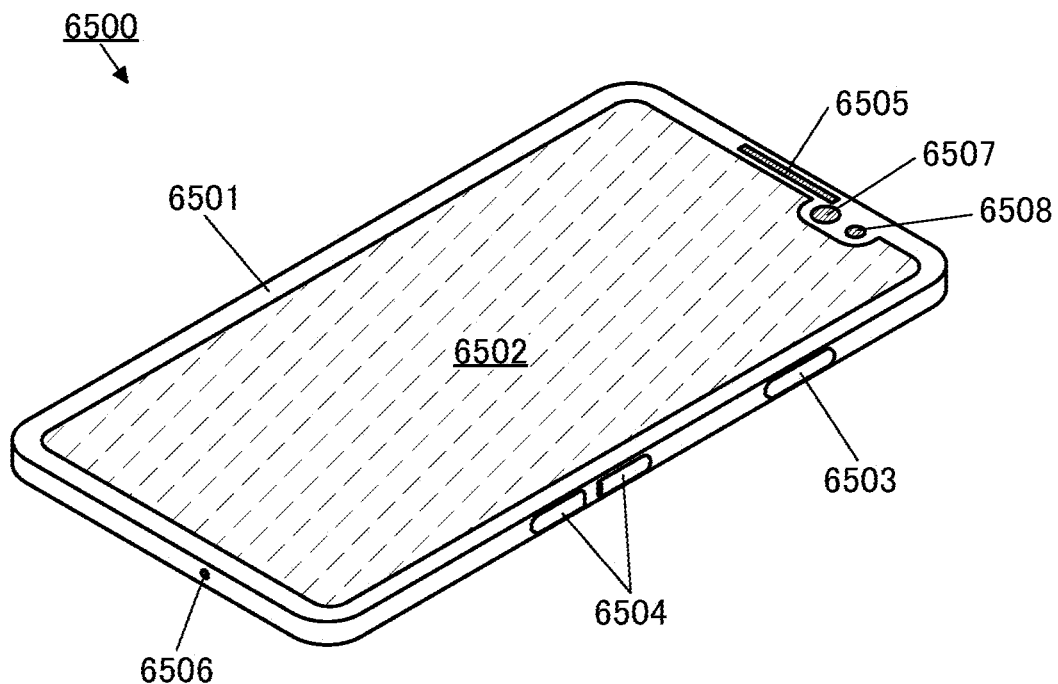
FIG. 37A is a perspective view illustrating an example of an electronic device.

An electronic device 6500 illustrated in FIG. 37A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502. Thus, the electronic device 6500 can be inexpensive.

Figure 37B:
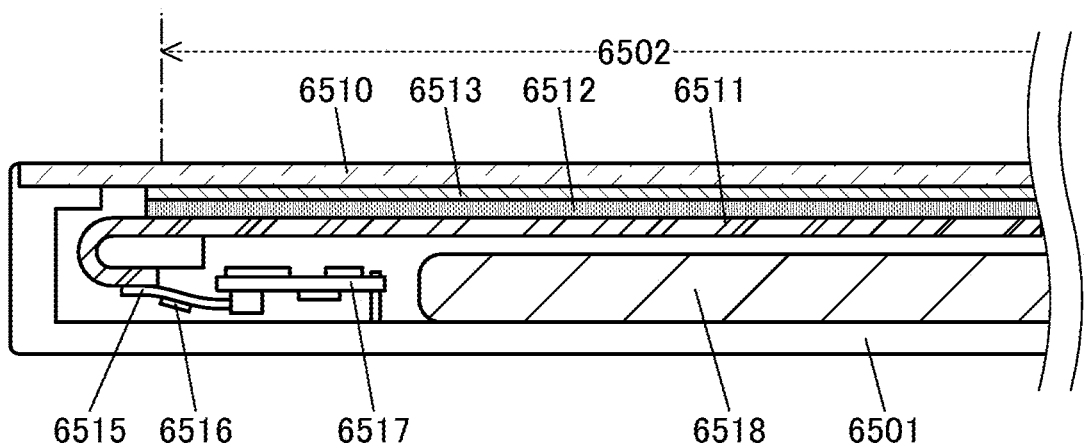
FIG. 37B is a cross-sectional view illustrating an example of an electronic device.

FIG. 37B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded with the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and FPC 6515 is connected to the part that is folded back. An IC 6516 is mounted on the FPC 6515. The FPC 6515 is connected to a terminal provided on the printed circuit board 6517.

A flexible display of one embodiment of the present invention can be used for the display panel 6511. Thus, an extremely lightweight electronic device can be obtained. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is provided on the rear side of a pixel portion.

Figure 38A:
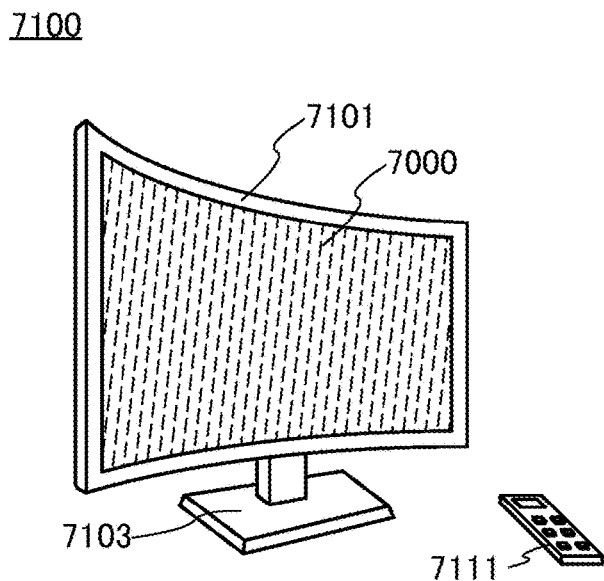
FIG. 38A to FIG. 38D are diagrams illustrating examples of electronic devices.

FIG. 38A illustrates an example of a television device. In a television device 7100, a display portion 7000 is incorporated in a housing 7101. Here, a structure in which the housing 7101 is supported with a stand 7103 is illustrated.

The display device of one embodiment of the present invention can be used in the display portion 7000. Thus, the television device 7100 can be inexpensive.

The operation of the television device 7100 illustrated in FIG. 38A can be performed with an operation switch provided in the housing 7101 or a remote controller 7111. Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 38B:
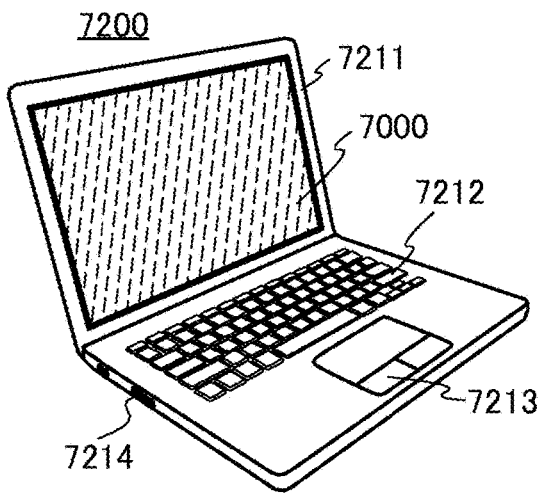

FIG. 38B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000. Thus, the laptop personal computer 7200 can be inexpensive.

Figure 38C:
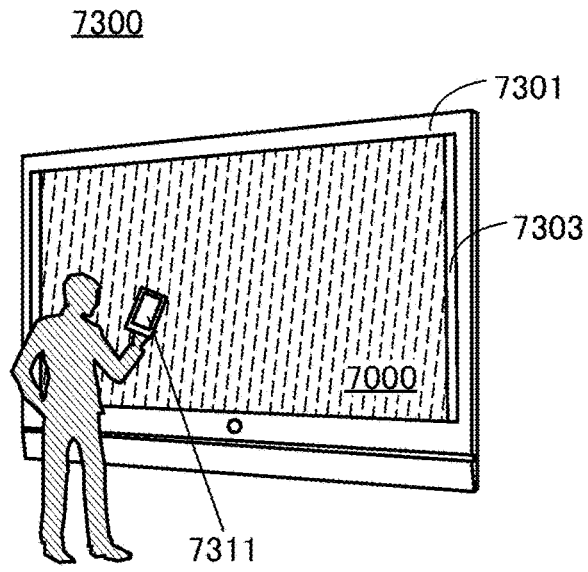
Figure 38D:
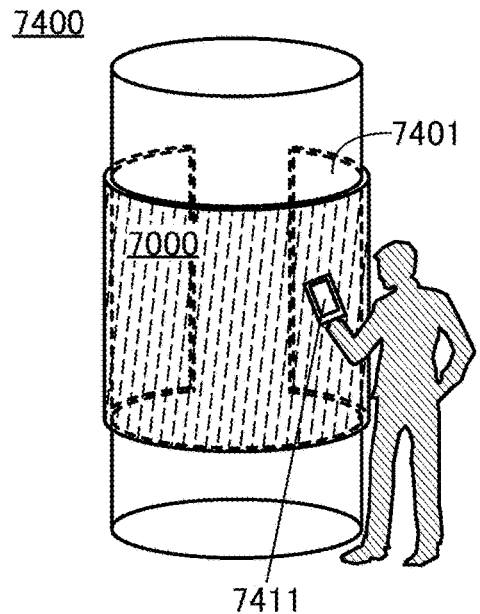

FIG. 38C and FIG. 38D illustrate examples of digital signage.

Digital signage 7300 illustrated in FIG. 38C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 38D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 38C and FIG. 38D. Thus, the digital signage 7300 and the digital signage 7400 can be inexpensive.

The larger the display portion 7000 is, the larger amount of data can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

Furthermore, as illustrated in FIG. 38C and FIG. 38D, it is preferable that the digital signage 7300 or the digital signage 7400 be capable of working with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

Furthermore, it is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

The electronic devices illustrated in FIG. 39A to FIG. 39F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 39A to FIG. 39F have a variety of functions. The electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium, for example. Note that the functions of the electronic devices are not limited thereto, and the electronic devices can have a variety of functions. The electronic devices may include a plurality of display portions. The electronic devices may each include a camera or the like and have a function of shooting a still image or a moving image and storing the shot image in a recording medium (an external recording medium or a recording medium incorporated in the camera), a function of displaying the shot image on the display portion, or the like.

The details of the electronic devices illustrated in FIG. 39A to FIG. 39F will be described below.

Figure 39A:
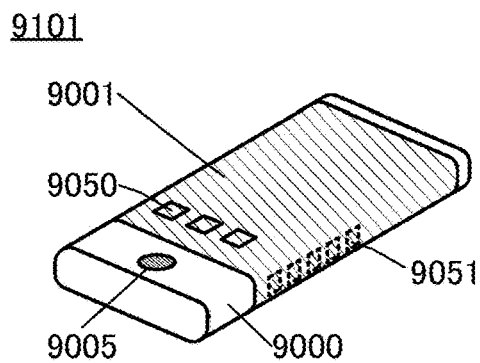
FIG. 39A to FIG. 39F are diagrams illustrating examples of electronic devices.

FIG. 39A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 39A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icons 9050 or the like may be displayed in the position where the information 9051 is displayed.

The display device of one embodiment of the present invention can be used for the display portion 9001 in FIG. 39A. Thus, the portable information terminal 9101 can be inexpensive.

Figure 39B:
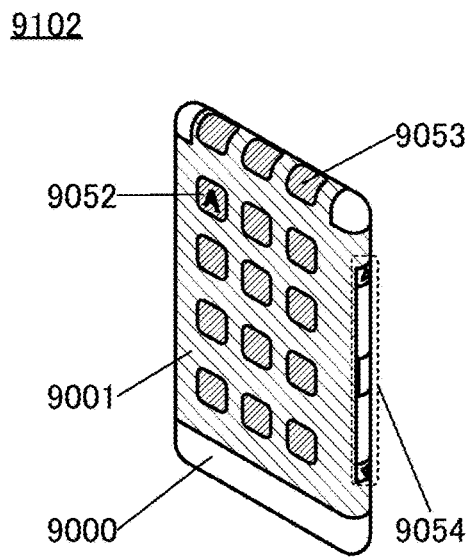

FIG. 39B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

The display device of one embodiment of the present invention can be used for the display portion 9001 in FIG. 39B. Thus, the portable information terminal 9102 can be inexpensive.

Figure 39C:
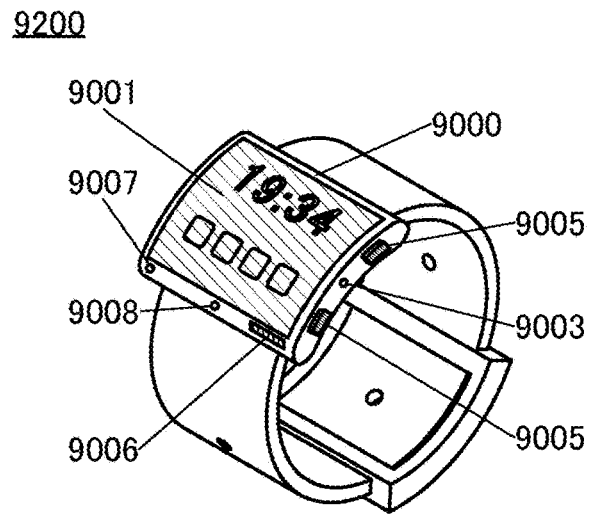

FIG. 39C is a perspective view illustrating a watch-type portable information terminal 9200. For example, the portable information terminal 9200 can be used as a smartwatch (registered trademark). The display surface of the display portion 9001 is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be recharged. Note that the recharging operation may be performed through wireless power feeding.

The display device of one embodiment of the present invention can be used for the display portion 9001 in FIG. 39C. Thus, the portable information terminal 9200 can be inexpensive.

Figure 39D:
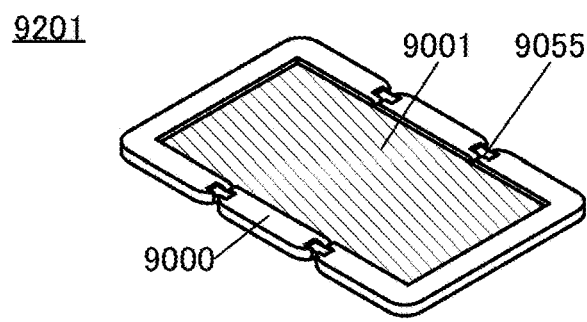
Figure 39E:
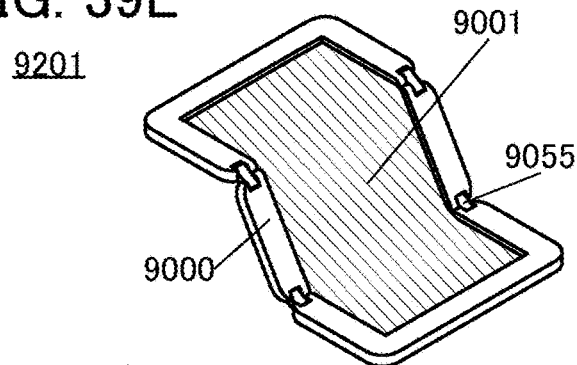
Figure 39F:
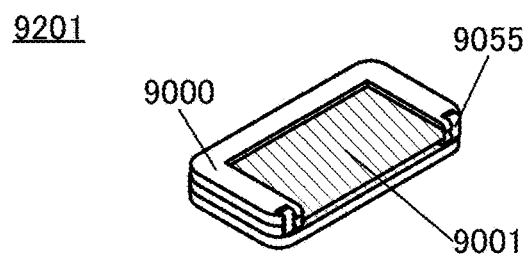

FIG. 39D, FIG. 39E, and FIG. 39F are perspective views showing a foldable portable information terminal 9201. FIG. 39D is a perspective view of an unfolded state of the portable information terminal 9201, FIG. 39F is a perspective view of a folded state thereof, and FIG. 39E is a perspective view of a state in the middle of change from one of FIG. 39D and FIG. 39F to the other. The portable information terminal 9201 is highly portable in the folded state and has high display browsability in the unfolded state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

The display device of one embodiment of the present invention can be used for the display portion 9001 in FIG. 39A to FIG. 39F. Thus, the portable information terminal 9201 can be inexpensive.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification, as appropriate.

REFERENCE NUMERALS

10: display device, 10A: display device, 10B: display device, 10C: display device, 10D: display device, 10E: display device, 10F: display device, 10K: display device, 10L: display device, 10M: display device, 11: display portion, 12: pixel, 13: gate driver circuit, 14: pixel circuit, 14B: pixel circuit, 14G: pixel circuit, 1418: pixel circuit, 14R: pixel circuit, 14W: pixel circuit, 15: pixel circuit, 16: light, 16B: light, 16G: light, 16R: light, 17: light, 18: substrate, 19: row driver circuit, 20: IC, 21: interface circuit, 22: control circuit, 23: data driver circuit, 24: circuit, 25: FPC, 26: memory circuit, 31: wiring, 31*a*: wiring, 31*b*: wiring, 32: wiring, 33: wiring, 34: wiring, 35: wiring, 36: wiring, 37: wiring, 38: wiring, 41: reference signal generation circuit, 42: A/D converter circuit, 43: shift register circuit, 44: clock signal generation circuit, 51*a*: transistor, 51*b*: transistor, 52: capacitor, 53: comparator circuit, 54: counter circuit, 55*a*: wiring, 55*b*: wiring, 56: wiring, 57: wiring, 59: wiring, 60: light-emitting device, 61: transistor, 61*a*: transistor, 61*b*: transistor, 62: transistor, 63: transistor, 64: capacitor, 65: wiring, 66: transistor, 67: capacitor, 68: wiring, 70: light-receiving device, 71: transistor, 72: transistor, 73: transistor, 74: transistor, 75: capacitor, 76: capacitor, 77: transistor, 78: transistor, 79: transistor, 80: CDS circuit, 81: transistor, 82*a*: transistor, 82*b*: transistor, 83*a*: transistor, 83*b*: transistor, 84*a*: capacitor, 84*b*: capacitor, 85: transistor, 86: transistor, 91: wiring, 92: wiring, 93: wiring, 94: wiring, 95: wiring, 96: wiring, 97: wiring, 101: timing signal generation circuit, 102: level shifter circuit, 111: shift register circuit, 112: latch circuit, 113: level shifter circuit, 114: D/A converter circuit, 115: amplifier circuit, 121: substrate, 122: finger, 123: eyes, 131: current source, 140: layer, 150: layer, 151: insulating film, 164: circuit, 165: wiring, 166: conductive layer, 172: FPC, 182: buffer layer, 184: buffer layer, 191: pixel electrode, 192: buffer layer, 193: light-emitting layer, 194: buffer layer, 195: protective layer, 195*a*: inorganic insulating layer, 195*b*: organic insulating layer, 195*c*: inorganic insulating layer, 201: transistor, 204: connection portion, 205: transistor, 206: transistor, 208: transistor, 209: transistor, 210: transistor, 211: insulating layer, 212: insulating layer, 213: insulating layer, 214: insulating layer, 215: insulating layer, 216: partition, 217: partition, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 242: connection layer, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 341: transistor, 342: transistor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 400A: display device, 400B: display device, 400C: display device, 400D: display device, 404: insulator, 411: pixel electrode, 412: common layer, 413: active layer, 414: common layer, 415: common electrode, 423*a*: light, 423*b*: reflected light, 423*c*: light, 423*d*: reflected light, 442: adhesive layer, 443: space, 446: lens array, 449: lens, 451: substrate, 452: substrate, 453: substrate, 454: substrate, 455: adhesive layer, 460: color filter, 461: lens, 462: lens array, 500: transistor, 500A: transistor, 500B: transistor, 503: conductor, 503*a*: conductor, 503*b*: conductor, 510: insulator, 512: insulator, 513: insulator, 514: insulator, 516: insulator, 518: conductor, 520: insulator, 522: insulator, 524: insulator, 530: oxide, 530*a*: oxide, 530*b*: oxide, 540*a*: conductor, 540*b*: conductor, 542*a*: conductor, 542*b*: conductor, 543*a*: region, 543*b*: region, 544: insulator, 545: insulator, 546: conductor, 548: conductor, 550: transistor, 552: insulator, 560: conductor, 560*a*: conductor, 560*b*: conductor, 574: insulator, 580: insulator, 581: insulator, 582: insulator, 586: insulator, 600: capacitor, 610: conductor, 612: conductor, 620: conductor, 630: insulator, 640: insulator, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:
a pixel and an IC chip,
wherein the pixel includes a first pixel circuit including a display element and a second pixel circuit including a light-receiving device,
wherein the IC chip includes a control circuit, a data driver circuit, and a read circuit,
wherein the first pixel circuit and the read circuit are electrically connected to each other through a first wiring,
wherein the second pixel circuit and the read circuit are electrically connected to each other through a second wiring,
wherein the control circuit is configured to supply a clock signal to the data driver circuit and the read circuit,
wherein the data driver circuit is configured to supply image data to the first pixel circuit, wherein the read circuit is configured to output a first signal corresponding to a potential of the first wiring,
wherein the read circuit is configured to output a second signal corresponding to a potential of the second wiring,
wherein the read circuit includes an A/D converter circuit,
wherein the A/D converter circuit includes a first transistor, a second transistor, a third transistor, a first capacitor, and a comparator circuit,
wherein one of a source and a drain of the first transistor is electrically connected to the first wiring,
wherein one of a source and a drain of the second transistor is electrically connected to the second wiring,
wherein the other of the source and the drain of the first transistor and the other of the source and the drain of the second transistor are electrically connected to one of a source and a drain of the third transistor,
wherein the other of the source and the drain of the third transistor is electrically connected to one electrode of the first capacitor, and
wherein the other electrode of the first capacitor is electrically connected to a first input terminal of the comparator circuit.

2. The display device according to claim 1,
wherein the first and second signals are digital signals output from the A/D converter circuit.

3. The display device according to claim 1,
wherein the read circuit includes a reference signal generation circuit,
wherein the A/D converter circuit includes a fourth transistor and a second capacitor,
wherein the reference signal generation circuit is electrically connected to one of a source and a drain of the fourth transistor,
wherein the other of the source and the drain of the fourth transistor is electrically connected to one electrode of the second capacitor, and
wherein the other electrode of the second capacitor is electrically connected to a second input terminal of the comparator circuit.

4. The display device according to claim 3,
wherein the A/D converter circuit includes a fifth transistor and a sixth transistor,
wherein one of a source and a drain of the fifth transistor is electrically connected to one electrode of the first capacitor,
wherein one of a source and a drain of the sixth transistor is electrically connected to one electrode of the second capacitor, and
wherein the other of the source and the drain of the fifth transistor and the other of the source and the drain of the sixth transistor are electrically connected to a power supply line.

5. The display device according to claim 1,
wherein the second transistor includes a metal oxide in a channel formation region.

6. A display device comprising:
a plurality of pixels arranged in a matrix, an IC chip, a gate driver circuit, and a row driver circuit,
wherein each of the plurality of pixels includes a first pixel circuit including a display element and a second pixel circuit including a light-receiving device,
wherein the IC chip includes a control circuit, a data driver circuit, and a read circuit,
wherein the control circuit is configured to supply a clock signal to the gate driver circuit, the row driver circuit, the data driver circuit and the read circuit,
wherein the gate driver circuit is configured to supply a first scan signal to the first pixel circuit to select the first pixel circuit to which image data is to be supplied,
wherein the row driver circuit is configured to supply a second scan signal to the second pixel circuit to select the second pixel circuit from which imaging data is to be read out,
wherein the data driver circuit is configured to supply the image data to the first pixel circuit selected by the gate driver circuit,
wherein the read circuit is configured to read out imaging data from the second pixel circuit selected by the row driver circuit,
wherein the gate driver circuit is configured to output the first scan signal in a period in which the row driver circuit does not output the second scan signal, and
wherein the row driver circuit is configured to output the second scan signal in a period in which the gate driver circuit does not output the first scan signal.

7. The display device according to claim 6,
wherein the first pixel circuit includes the display element and a driving transistor,
wherein the read circuit includes an A/D converter circuit,
wherein the A/D converter circuit includes a first transistor, a second transistor, and a comparator circuit,
wherein one electrode of the display element is electrically connected to one of a source and a drain of the driving transistor,
wherein one of a source and a drain of the first transistor is electrically connected to the first pixel circuit,
wherein one of a source and a drain of the second transistor is electrically connected to the second pixel circuit,
wherein the other of the source and the drain of the first transistor and the other of the source and the drain of the second transistor are electrically connected to a first input terminal of the comparator circuit,
wherein the A/D converter circuit is configured to output a signal corresponding to a current flowing between the one of the drain and the source of the driving transistor, and
wherein the A/D converter circuit is configured to output an imaging signal corresponding to the imaging data.

8. The display device according to claim 7,
wherein the read circuit includes a reference signal generation circuit, and
wherein the reference signal generation circuit is electrically connected to a second input terminal of the comparator circuit.

9. The display device according to claim 6,
wherein the first pixel circuit includes the display element and a driving transistor,
wherein the read circuit includes an A/D converter circuit,
wherein the A/D converter circuit includes a first transistor, a second transistor, a third transistor, a first capacitor, and a comparator circuit,
wherein one electrode of the display element is electrically connected to one of a source and a drain of the driving transistor,
wherein one of a source and a drain of the first transistor is electrically connected to the first pixel circuit,
wherein one of a source and a drain of the second transistor is electrically connected to the second pixel circuit,
wherein the other of the source and the drain of the first transistor and the other of the source and the drain of the second transistor are electrically connected to one of a source and a drain of the third transistor, wherein the other of the source and the drain of the third transistor is electrically connected to one electrode of the first capacitor, wherein the other electrode of the first capacitor is electrically connected to a first input terminal of the comparator circuit, wherein the A/D converter circuit is configured to output a signal corresponding to a current flowing between the drain and the source of the driving transistor, and wherein the A/D converter circuit is configured to output an imaging signal corresponding to the imaging data.

10. The display device according to claim 9, wherein the read circuit includes a reference signal generation circuit, wherein the A/D converter circuit includes a fourth transistor and a second capacitor, wherein the reference signal generation circuit is electrically connected to one of a source and a drain of the fourth transistor, wherein the other of the source and the drain of the fourth transistor is electrically connected to one electrode of the second capacitor, and wherein the other electrode of the second capacitor is electrically connected to a second input terminal of the comparator circuit.

11. The display device according to claim 10, wherein the A/D converter circuit includes a fifth transistor and a sixth transistor, wherein one of a source and a drain of the fifth transistor is electrically connected to one electrode of the first capacitor, wherein one of a source and a drain of the sixth transistor is electrically connected to one electrode of the second capacitor, and wherein the other of the source and the drain of the fifth transistor and the other of the source and the drain of the sixth transistor are electrically connected to a power supply line.

12. The display device according to claim 9, wherein the second transistor includes a metal oxide in a channel formation region.

* * * * *